(12) United States Patent
Sekikawa et al.

(10) Patent No.: US 9,553,121 B2
(45) Date of Patent: Jan. 24, 2017

(54) SEMICONDUCTOR DEVICE AND METHOD OF MANUFACTURING THE SAME

(71) Applicant: Renesas Electronics Corporation, Koutou-ku, Tokyo (JP)

(72) Inventors: Hiroaki Sekikawa, Tokyo (JP); Hidenori Sato, Tokyo (JP); Yotaro Goto, Tokyo (JP); Takuya Maruyama, Tokyo (JP); Masaaki Shinohara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/835,284

(22) Filed: Aug. 25, 2015

(65) Prior Publication Data

US 2016/0064323 A1    Mar. 3, 2016

(30) Foreign Application Priority Data

Aug. 28, 2014 (JP) .................................. 2014-174143

(51) Int. Cl.

| | |
|---|---|
| H01L 21/4763 | (2006.01) |
| H01L 27/146 | (2006.01) |
| H01L 21/768 | (2006.01) |
| H01L 21/3105 | (2006.01) |
| H01L 21/66 | (2006.01) |
| H01L 23/532 | (2006.01) |

(52) U.S. Cl.

CPC ... *H01L 27/14636* (2013.01); *H01L 21/31051* (2013.01); *H01L 21/7685* (2013.01); *H01L 21/76801* (2013.01); *H01L 21/76877* (2013.01); *H01L 22/30* (2013.01); *H01L 27/14603* (2013.01); *H01L 27/14687* (2013.01); *H01L 23/53238* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2005/0275110 A1 | 12/2005 | Maekawa et al. | |
| 2008/0286961 A1* | 11/2008 | Arai | H01L 21/31144 438/623 |
| 2010/0301444 A1 | 12/2010 | Koike | |

FOREIGN PATENT DOCUMENTS

| | | |
|---|---|---|
| JP | 2008-199059 A | 8/2008 |
| JP | 4551603 B2 | 9/2010 |

(Continued)

*Primary Examiner* — Reema Patel
(74) *Attorney, Agent, or Firm* — McDermott Will & Emery LLP

(57) ABSTRACT

A connection portion connects a copper-based first wiring layer with a copper-based second wiring layer arranged on the upper side of a first diffusion barrier film. The first diffusion barrier film includes a first opening region formed in a semiconductor circuit region that is a partial region in a two-dimensional view and a second opening region formed as an opening region different from the first opening region in a two-dimensional view. The opening regions are formed in a region different from an opening region formed to allow the connection portion to pass through the first diffusion barrier film. A mark wiring layer is arranged immediately above the second opening region as the same layer as the second wiring layer. A second diffusion barrier film is arranged in contact with the upper surface of the mark wiring layer.

14 Claims, 51 Drawing Sheets

(56) References Cited

FOREIGN PATENT DOCUMENTS

| | | | |
|---|---|---|---|
| JP | 4832807 | B2 | 12/2011 |
| JP | 5367459 | B2 | 12/2013 |

\* cited by examiner

SEMICONDUCTOR DEVICE AND METHOD OF MANUFACTURING THE SAME

This nonprovisional application is based on Japanese Patent Application No. 2014-174143 filed on Aug. 28, 2014 with the Japan Patent Office, the entire contents of which are hereby incorporated by reference.

BACKGROUND OF THE INVENTION

Field of the Invention

The present invention relates to a semiconductor device and a method of manufacturing the same, and more particularly to a semiconductor device having a photoelectric conversion device and a method of manufacturing the same.

Description of the Background Art

In LSIs (Large Scale Integrated circuits) miniaturized and faster in recent years, copper having an electrical resistance lower than conventionally-used aluminum has been used as a material for forming wiring layers. Similarly, solid state image sensors such as CMOS (Complementary Metal Oxide Semiconductor) image sensors and semiconductor imaging devices including the same have been miniaturized and operating faster. In this respect, for example, Japanese Patent No. 4551603 and Japanese Patent No. 5367459 below disclose a solid state image sensor and a semiconductor imaging device using copper wiring.

When copper wiring is formed, in general, an integrated structure including a groove and a hole is formed in the interlayer insulating film as shown in Japanese Patent No. 4832807 below. The inside of the groove and the hole is filled with copper wiring. This results in a structure in which wiring is integrated with a connection portion for connecting the wiring with the underlying wiring. This dual damascene method is used when copper wiring is formed.

Copper wiring is disadvantageous in that its component tends to diffuse into the interlayer insulating film. In order to suppress this, a diffusion barrier film is formed in contact with the upper surface of copper wiring. The diffusion barrier film, however, has an opening region in the connection portion formed by the dual damascene method. This opening region is formed in order to electrically connect the wiring that overlies the diffusion barrier film with the underlying wiring. The diffusion barrier film also has an opening region immediately above a pixel region where a light-receiving element in a solid state image sensor is arranged. This opening region is formed in order to enhance the light-receiving property of the light-receiving element. For example, Japanese Patent Laying-Open No. 2008-199059 discloses a configuration in which a diffusion barrier film is removed both in the connection portion and in the region immediately above the light-receiving element.

SUMMARY OF THE INVENTION

A pattern with a diffusion barrier film removed is formed, for example, in a partial region in a semiconductor circuit region in which a light-receiving element or the like is formed, or in a scribe line region used to divide a semiconductor wafer on the outside of a semiconductor circuit region into individual semiconductor chips. This monitor pattern, which is a pattern in which the diffusion barrier film is removed, is used for the purpose of checking whether the diffusion barrier film is removed as desired, for example, immediately above the light-receiving element, and the film thickness and size of the removed region.

In general, the monitor pattern is formed to have a size larger than the opening region of the diffusion barrier film in the pixel region. In this case, the interlayer insulating film formed to cover the monitor pattern has a larger region in which a step is formed so as to be depressed immediately above the monitor pattern. The step in the interlayer insulating film is not completely removed even by polishing the upper surface of the interlayer insulting film by CMP (Chemical Mechanical Polishing), possibly resulting in an unintended depression. When copper wiring is formed so as to fill in a groove formed in the interlayer insulating film, a copper thin film layer may be unintentionally formed even in the unintended depression immediately above the monitor pattern. The unintentionally formed copper thin film layer may fall off to act as a foreign substance of copper. In a structure of the monitor pattern in which a diffusion barrier film is not formed on the unintentionally formed copper thin film layer, copper diffuses into the interlayer insulating film or the semiconductor circuit region to act as a cause of operation failure. The unintentionally formed copper thin film layer should not be formed because it affects the characteristics of the semiconductor device.

None of Japanese Patent No. 4551603, Japanese Patent No. 5367459, Japanese Patent No. 4832807, and Japanese Patent Laying-Open No. 2008-199059 discloses the monitor pattern in the first place not they describe any means for solving the problem above.

Other problems and novel features will become apparent from the description in the specification and the accompanying drawings.

A semiconductor device according to an embodiment includes a semiconductor substrate, a first diffusion barrier film, a connection portion, and an interlayer insulating film. The connection portion connects a copper-based first wiring layer arranged on the semiconductor substrate side as viewed from the first diffusion barrier film on the main surface of the semiconductor substrate, with a copper-based second wiring layer arranged on an opposite side to the semiconductor substrate side of the first diffusion barrier film. The interlayer insulating film covers the first diffusion barrier film. The first diffusion barrier film includes a first opening region formed in a semiconductor circuit region that is a partial region in a two-dimensional view and a second opening region formed as an opening region different from the first opening region in a two-dimensional view. The first and second opening regions are formed in a region different from an opening region formed to allow the connection portion to pass through the first diffusion barrier film. The semiconductor device further includes a mark wiring layer arranged immediately above the second opening region as the same layer as the second wiring layer and a second diffusion barrier film arranged in contact with an upper surface of the mark wiring layer.

A semiconductor device according to another embodiment includes a semiconductor substrate, a first diffusion barrier film, a connection portion, and an interlayer insulating film. The connection portion connects a copper-based first wiring layer arranged on the semiconductor substrate side as viewed from the first diffusion barrier film on the main surface of the semiconductor substrate, with a copper-based second wiring layer arranged on an opposite side to the semiconductor substrate side of the first diffusion barrier film. The interlayer insulating film covers the first diffusion barrier film. The first diffusion barrier film includes a first opening region formed in a semiconductor circuit region that is a partial region in a two-dimensional view and a second opening region formed as an opening region different from the first opening region in a two-dimensional view. The first and second opening regions are formed in a region different from an opening region formed to allow the connection portion to pass through the first diffusion barrier film. A smallest value of dimensions in a two-dimensional view of the second opening region is equal to or smaller than a smallest value of dimensions in a two-dimensional view of the first opening region.

According to an embodiment, the mark wiring layer and the second diffusion barrier film covering the upper surface thereof are formed to reduce the possibility that a copper thin film layer is unintentionally formed in the interlayer insulating film and diffuses.

In a method of manufacturing a semiconductor device according to an embodiment, first of all, a copper-based first wiring layer is formed on a main surface of a semiconductor substrate. On the first wiring layer, a first diffusion barrier film is formed, which includes a first opening region as an opening region in a semiconductor circuit region that is a partial region in a two-dimensional view and a second opening region as an opening region different from the first opening region in a two-dimensional view. An insulating film is formed so as to cover the first diffusion barrier film. The upper surface of the insulating film is polished and planarized to form a first interlayer insulating film. A second interlayer insulating film is formed so as to cover the first interlayer insulating film thereby to form an interlayer insulating film. A copper-based second wiring layer and a connection portion connecting the first wiring layer with the second wiring layer are formed in the semiconductor circuit region so as to fill in a groove and a hole formed in the second interlayer insulating film. The first and second opening regions are formed in a region different from an opening region formed to allow the connection portion to pass through the first diffusion barrier film. In the step of forming the second wiring layer, a mark wiring layer is formed immediately above the second opening region as the same layer as the second wiring layer. A second diffusion barrier film is further formed in contact with an upper surface of the mark wiring layer.

According to another embodiment, the smallest value of the dimensions of the second opening region is reduced so as to be equal to or smaller than the smallest value of the dimensions of the first opening region, thereby reducing the possibility that an unintended depression is formed in the interlayer insulating film immediately above the second opening region. Therefore, the possibility that a copper thin film layer is unintentionally formed in the interlayer insulating film and diffuses is reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described below in conjunction with the figures.

First Embodiment

First of all, a semiconductor device in a wafer state in the present embodiment will be described.

Figure 1:
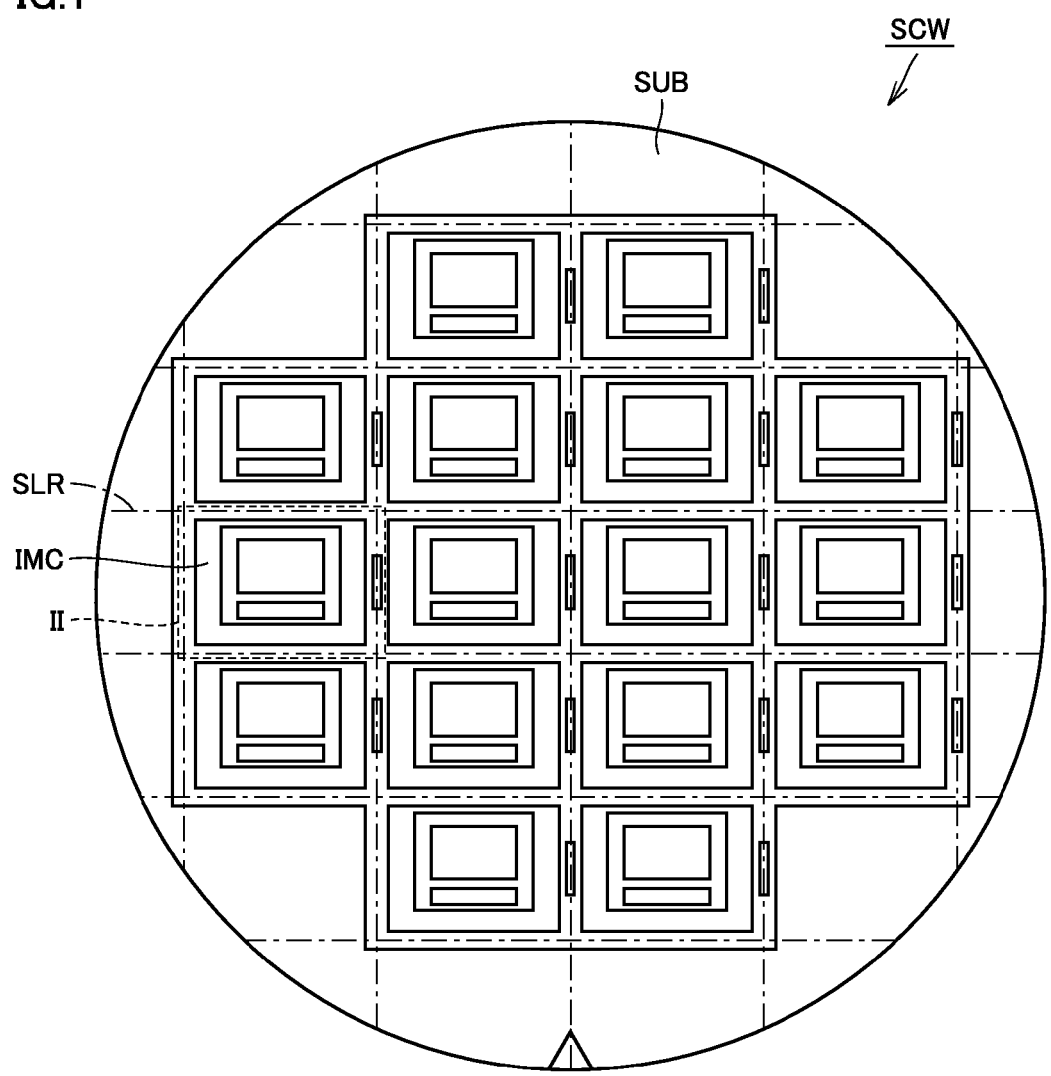
FIG. 1 is a cross-sectional view schematically showing a semiconductor device in a wafer state according to a first embodiment.

Referring to FIG. 1, for example, a plurality of chip regions IMC for image sensors are formed on a semiconductor wafer SCW based on a semiconductor substrate SUB. The chip regions IMC each have a rectangular two-dimensional shape and are arranged in a matrix.

In semiconductor wafer SCW, a scribe line region SLR is formed between chip regions IMC. Semiconductor wafer SCW is diced at scribe line region SLR, so that semiconductor wafer SCW is divided into a plurality of semiconductor chips.

Figure 2:
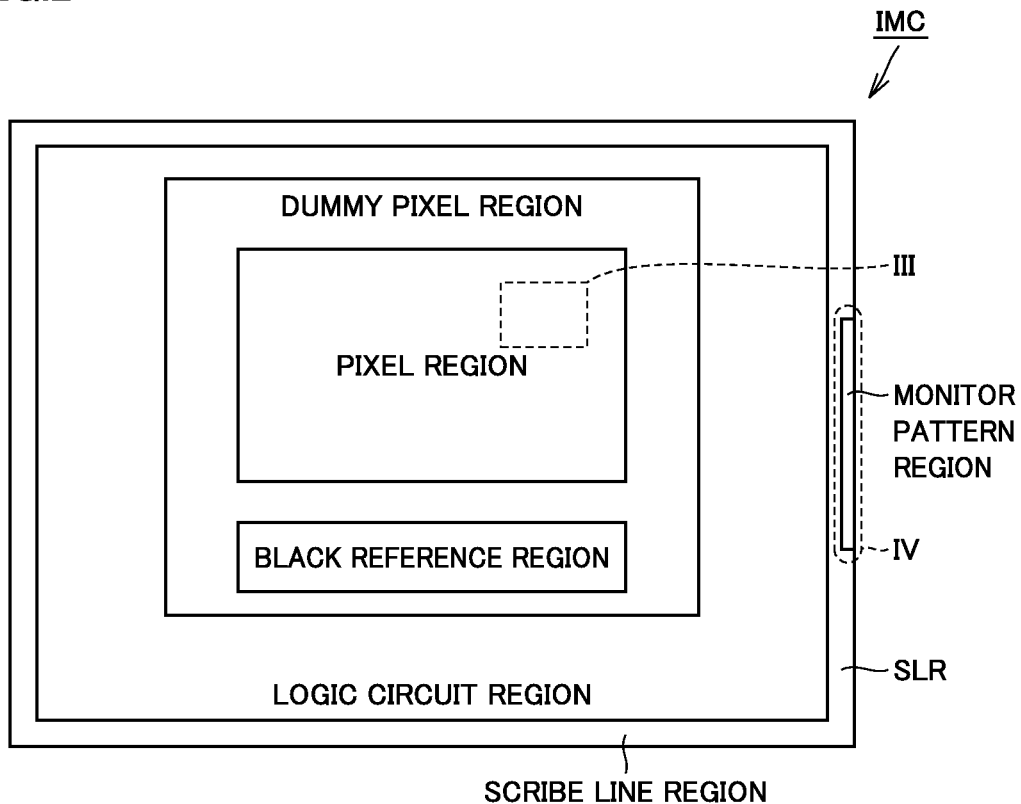
FIG. 2 is a schematic enlarged plan view of a region II surrounded by the dotted line in FIG. 1.
Figure 3:
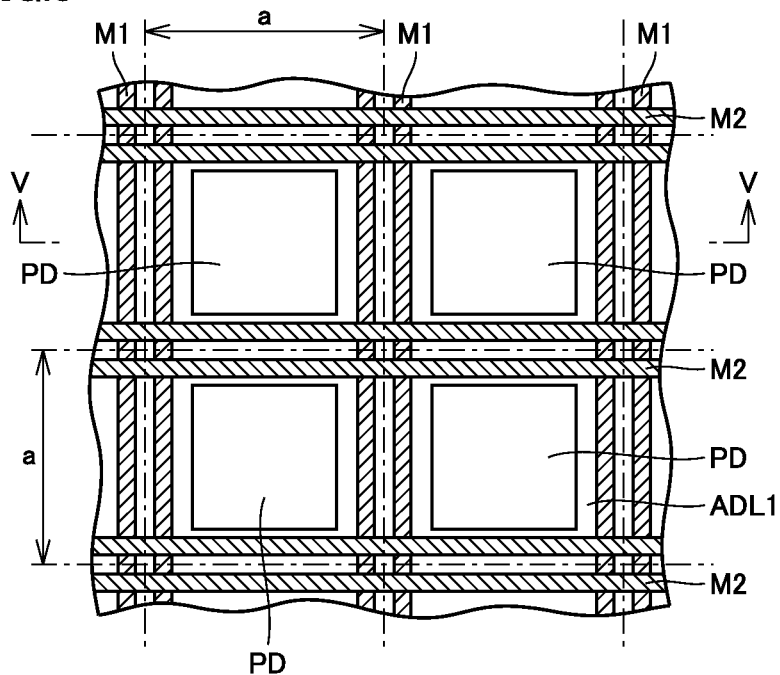
FIG. 3 is a schematic enlarged plan view of a region III surrounded by the dotted line in FIG. 2.
Figure 4:
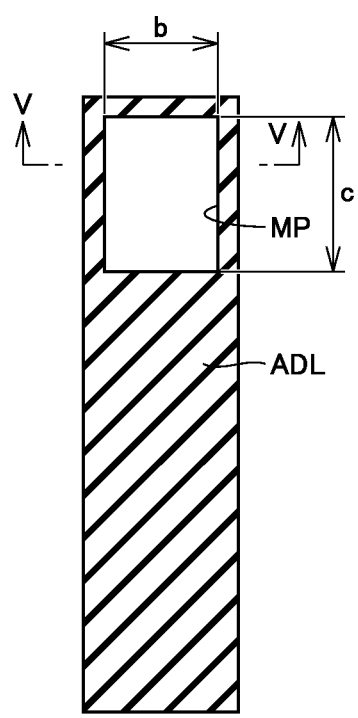
FIG. 4 is a schematic enlarged plan view of a region IV surrounded by the dotted line in FIG. 2.

Referring now to FIG. 2 to FIG. 4, a configuration of the divided semiconductor chip and a configuration of the regions therein will be described briefly.

Referring to FIG. 2, a semiconductor chip cut as an individual chip region IMC has a pixel region, a dummy pixel region, a black reference region, a logic circuit region, a scribe line region SLR, and a monitor pattern region. The pixel region is a region where, for example, a photodiode as a photoelectric conversion device and a transistor (for example, select transistor, amplifier transistor) for inputting/outputting a signal between the photodiode and the outside are formed. In the dummy pixel region, a photodiode similar to that in the pixel region may be formed or a photodiode may not be formed. The dummy pixel region is a region provided so as to surround, for example, the pixel region in order to suppress the effects on a circuit formed in the logic circuit region due to light applied to the photodiode in the pixel region and entering a region other than the pixel region, for example, the logic circuit region.

The black reference region is a region formed, in particular, in the center portion of the dummy pixel region. The black reference region is a region where a photodiode similar to that in the pixel region is formed but the photodiode is covered with a light-shielding film immediately above so that light is not incident on the photodiode. The black reference region therefore can output a reference value of a signal output when light is not incident on the photodiode.

The logic circuit region is configured with a signal processing circuit including a transistor, a capacitive element, and a resistive element for performing analog processing or digital processing on a signal output from the pixel region.

Scribe line region SLR is a region for cutting semiconductor wafer SCW into semiconductor chips including individual chip regions IMC as described above. Scribe line region SLR may be cut or removed by dicing semiconductor wafer SCW but may be partially left as shown in FIG. 2. The monitor pattern region, which is formed in scribe line region SLR, may also be left in the semiconductor chip after cutting as shown in FIG. 2.

The monitor pattern region is formed for the purpose of checking the film thickness of a thin film formed in a step of manufacturing a semiconductor device such as a photodiode and a logic circuit formed in semiconductor wafer SCW, or the dimensions of an opening partially formed in the thin film. In the example shown in FIG. 2, the monitor pattern region is formed in scribe line region SLR.

In FIG. 2, the dummy pixel region including the black reference region is arranged on the outside of the pixel region, the logic circuit region is arranged on the outside of the dummy pixel region, and the scribe line region is arranged on the outside of the logic circuit region. The manner in which those regions are arranged, however, is not limited thereto.

Referring to FIG. 3, a plurality of photodiodes PD as photoelectric conversion devices are arranged spaced apart from each other, for example, in a matrix in the pixel region. A diffusion barrier film ADL1 and wiring layers M1, M2 are formed above photodiodes PD. As will be described later, wiring layers M3, M4, an interlayer insulating film, and the like are actually formed above photodiodes PD, although not shown here.

Wiring layer M1 is arranged so as to extend vertically in FIG. 3. Wiring layer M2 is arranged so as to extend horizontally in FIG. 3 and intersect (for example, orthogonal to) wiring layer M1. Wiring layers M1 and M2 are both arranged in a region excluding a region immediately above photodiodes PD, that is, a region overlapped with photodiodes PD in a two-dimensional view. Since wiring layers M1 and M2 are arranged not immediately above photodiodes PD, light to be incident on photodiodes PD is less likely to be blocked by wiring layers M1 and M2.

In the foregoing, wiring layers M1, M2 are arranged in a region sandwiched between a pair of photodiodes PD adjacent to each other among a plurality of photodiodes PD arranged. In FIG. 3, two wiring layers M1 and M2 are arranged spaced apart from each other in each sandwiched region. The embodiment, however, is not limited to this manner.

A pitch a, which is an interval between individual regions (unit pixels) including a plurality of photodiodes PD and wiring layers M1, M2, is preferably 10 µm or less, for example, both in the vertical direction and in the horizontal direction in the figure, though not limited thereto.

Referring to FIG. 4, a diffusion barrier film ADL1 for preventing diffusion of a metal material such as copper detailed later is formed in the monitor pattern region. A monitor pattern MP is formed as an opening region formed by partially removing diffusion barrier film ADL1. Monitor pattern MP has, for example, a rectangular shape having a horizontal dimension b of 50 µm and a vertical dimension c of 70 µm, though not limited thereto. The other components arranged in the monitor pattern region are not shown also in FIG. 4.

Referring now to FIG. 5 to FIG. 9, the configurations of the pixel region, the logic circuit region, and the monitor pattern region both in a wafer state and in a chip state in the present embodiment will be described in details.

Figure 5:
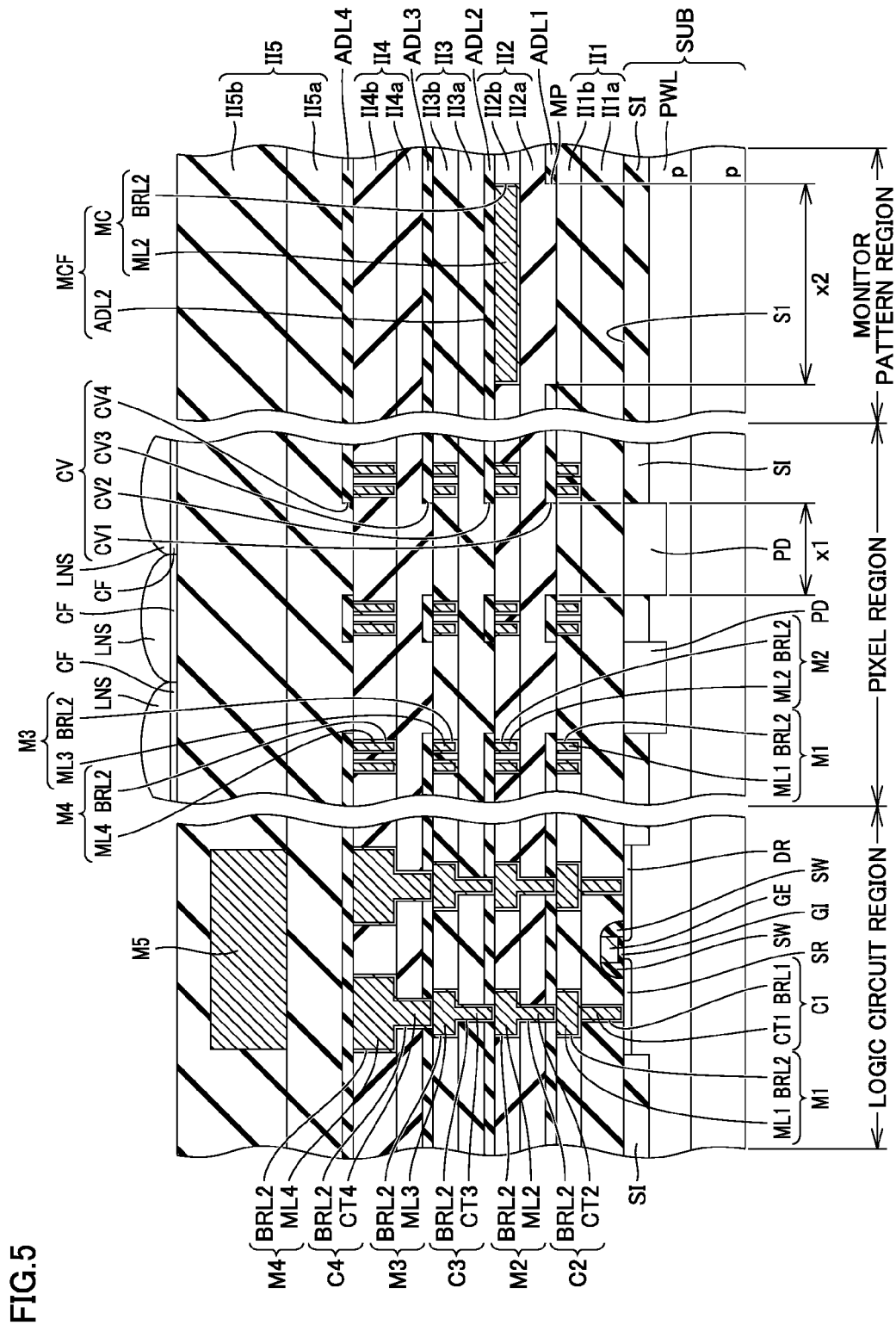
FIG. 5 is a schematic cross-sectional view showing a configuration of the semiconductor device according to the first embodiment including a portion along the line V-V in FIG. 3 and FIG. 4.

Referring to FIG. 5, an image sensor as a semiconductor device in the present embodiment is formed on a p-type semiconductor substrate SUB formed of, for example, silicon. The pixel region, the logic circuit region, and the monitor pattern region are separated from each other in a two-dimensional view by an isolation insulating film SI as a silicon oxide film formed at a main surface S1 of semiconductor substrate SUB.

A not-shown n-type impurity region is formed at main surface S1 of semiconductor substrate SUB in a p-type well region PWL in the pixel region. For example, the n-type impurity region and p-type well region PWL form a pn junction. This pn junction is formed as a photodiode PD. Photodiode PD is formed with such n-type impurity region and p-type well region PWL. Not only photodiode PD and a transfer transistor including a transfer gate electrode and a floating diffusion region but also a select transistor and an amplifier transistor are actually formed in the pixel region. However, the configuration of photodiode PD is not shown in FIG. 5, and the transfer gate electrode, the select transistor, and the like are not shown.

The p-type well region PWL in the logic circuit region includes a MOS (Metal Oxide Semiconductor) transistor, a capacitive element, and a resistive element that constitute a signal processing circuit for performing analog processing or digital processing on a signal output from the pixel region. In FIG. 5, however, only a MOS transistor is shown, and a capacitive element, a resistive element, and the like are not shown.

This MOS transistor has a pair of n-type source region SR and n-type drain region DR, a gate insulating film GI, and a gate electrode GE. The n-type source/drain regions SR and DR are formed spaced apart from each other at main surface S1 of semiconductor substrate SUB. A pair of n-type source/drain regions SR and DR has an n-type impurity region as a high concentration region and an n-type impurity region as an LDD (Lightly Doped Drain) that is a low concentration region.

Gate electrode GE is formed on main surface S1 of semiconductor substrate SUB sandwiched between a pair of n-type source/drain regions SR and DR with gate insulating film GI interposed. A sidewall insulating film SW formed of an oxide film and a nitride film is formed as a residue of the anti-reflection film on the sidewall of gate electrode GE.

The material of gate electrode GE of the MOS transistor may be, for example, polysilicon doped with an impurity or a metal such as titanium nitride.

In each of the pixel region, the logic circuit region, and the monitor pattern region, an interlayer insulating film II1 is formed so as to cover the aforementioned elements (photodiode PD and the MOS transistor) on main surface S1 of semiconductor substrate SUB. Interlayer insulating film II1 includes an interlayer insulating film II1a and an interlayer insulating film Mb stacked in this order.

In the logic circuit region and the pixel region, a contact region C1 is formed so as to pass through interlayer insulating film II1a vertically in the figure. Contact region C1 is formed to fill in a contact hole formed to pass through the inside of interlayer insulating film II1a vertically in the figure and is formed with a barrier metal BRL1 covering the inner wall of the contact hole for preventing diffusion of a metal material and a contact CT1 covering the surface of barrier metal BRL1 and filling in the contact hole. Although contact region C1 is not shown in the pixel region in FIG. 5, contact region C1 having the same manner as contact region C1 in the logic circuit region is also formed in a region other than the cross section shown in FIG. 5 in the pixel region. This is applicable to contact regions C2 to C4 described later.

In the logic circuit region and the pixel region, a wiring layer M1 is formed so as to pass through interlayer insulating film II1b vertically in the figure. Wiring layer M1 is formed to fill in a groove formed to pass through the inside of interlayer insulating film II1b vertically in the figure and has an elongated shape extending in one direction as shown in FIG. 3 in a two-dimensional view. Wiring layer M1 is formed with a barrier metal BRL2 covering the inner wall of the groove and a metal film ML1 covering the surface of barrier metal BRL2 and filling in the groove. Wiring layer M1 in the logic circuit region and wiring layer M1 in the pixel region have different shapes, which means that the direction in which wiring layer M1 extends is different between those regions. However, wiring layer M1 may extend in the same direction in those regions.

Wiring layer M1 is electrically connected to source region SR or drain region DR of the MOS transistor in the logic circuit region through contact region C1. Although not shown in FIG. 5, wiring layer M1 is also connected with a transistor (for example, select transistor, amplifier transistor, and the like) for inputting/outputting a signal between the gate electrode of the transfer transistor, the floating diffusion region, and the photodiode in the pixel region, and the outside.

Diffusion barrier film ADL1 (first diffusion barrier film) is formed on interlayer insulating film II1b. Diffusion barrier film ADL1 is formed so as to cover the upper surface of wiring layer M1. Diffusion barrier film ADL1 is also formed in part of the region other than the upper surface of wiring layer M1.

However, wiring layer M1 is not arranged immediately above photodiode PD in the pixel region as described above. Accordingly, diffusion barrier film ADL1 is removed immediately above photodiode PD, and an opening region CV1 (first opening region) of diffusion barrier film ADL1 is formed.

In the monitor pattern region which is part of the scribe line region which is a region excluding the semiconductor circuit region including photodiodes, MOS transistors, and the like, a monitor pattern MP (second opening region) shown in FIG. 4 is formed as an opening region in which diffusion barrier film ADL1 is partially removed.

In each of the pixel region, the logic circuit region, and the monitor pattern region, an interlayer insulting film II2 is formed on interlayer insulating film II1 so as to cover diffusion barrier film ADL1. Interlayer insulating film II2 includes an interlayer insulating film II2a (first interlayer insulating film) and an interlayer insulating film II2b (second interlayer insulating film) stacked in this order.

In the logic circuit region and the pixel region, a contact region C2 passing through interlayer insulating film II2a vertically in the figure and a wiring layer M2 passing through interlayer insulating film II2b vertically in the figure are formed. Specifically, contact region C2 is formed so as to fill in a contact hole formed to pass through interlayer insulating film II2a and diffusion barrier film ADL1 vertically in the figure and is formed with a barrier metal BRL2 and a contact CT2. Wiring layer M2 is formed so as to fill in a groove formed to pass through interlayer insulating film II2b vertically in the figure and is formed with barrier metal BRL2 and metal film ML2 in the same manner as wiring layer M1.

Wiring layer M2 and contact region C2 are integrally formed. That is, metal film ML2 and contact CT2 are integrally formed and are formed integrally also with barrier metal BRL2 in wiring layer M2 and barrier metal BRL2 in contact region C2.

The integrated wiring layer M2 and contact region C2 pass through anti-diffusion region ADL1 at the lower end of contact region C2 to be electrically connected with wiring layer M1 below. As described above, wiring layer M2 is electrically connected with wiring layer M1 through contact region C2. In other words, contact region C2 (connection portion) electrically connects wiring layer M1 (first wiring layer) arranged on the semiconductor substrate SUB side (lower side) of diffusion barrier film ADL1 with wiring layer M2 (second wiring layer) arranged on the opposite side (upper side) to the semiconductor substrate SUB side of diffusion barrier film ADL1.

As described above, diffusion barrier film ADL1 in the logic circuit region and the pixel region (semiconductor circuit region) has two kinds of opening regions, that is, the opening through which contact region C2 in the pixel region passes for connecting to wiring layer M1, and opening region CV1 immediately above photodiode PD. However, here, only opening region CV1 immediately above photodiode PD is defined as opening region CV1 as a first opening region, and the opening in diffusion barrier film ADL1 for allowing contact region C2 to pass through is not included in opening region CV1. The opening in diffusion barrier film ADL1 for allowing contact region C2 to pass through is not included in monitor pattern MP2 as a second opening region, either.

Although in actuality, wiring layer M1 and wiring layer M2 generally extend, for example, in directions orthogonal to each other in a two-dimensional view as shown in FIG. 3, all of wiring layers M1 to M4 including wiring layers M3, M4 described later extend in the same direction in FIG. 5 for the sake of simplification and easy understanding.

On the other hand, in the monitor pattern region, a mark wiring layer MC is formed. Mark wiring layer MC is formed as the same layer as wiring layer M2 so as to fill in a groove formed to pass through interlayer insulating film II2b vertically in the figure and is formed with barrier metal BRL2 and metal film ML2 in the same manner as wiring layer M2. However, mark wiring layer MC may not pass through interlayer insulating film II2b vertically in the figure but may be formed such that its bottom portion is formed in interlayer insulating film II2*b* (above the bottom portion of interlayer insulating film II2*b*). Mark wiring layer MC is arranged immediately above monitor pattern MP, that is, so as to overlap monitor pattern MP in a two-dimensional view.

A diffusion barrier film ADL2 is formed on interlayer insulating film II2*b* so as to cover the upper surfaces of wiring layer M2 and mark wiring layer MC. In the logic circuit region and the pixel region, diffusion barrier film ADL2 is basically arranged in the same region (immediately above diffusion barrier film ADL1) as diffusion barrier film ADL1 in a two-dimensional view and has an opening in the other region. Therefore, diffusion barrier film ADL2 is removed and an opening region CV2 is formed immediately above photodiode PD. Therefore, opening region CV2 is formed so as to overlap at least part of opening region CV1.

In the monitor pattern region, diffusion barrier film ADL2 (second diffusion barrier film) is arranged in contact with, in particular, the upper surface of mark wiring layer MC. Here, diffusion barrier layer ADL2 is preferably arranged in contact with the entire upper surface of mark wiring layer MC. Mark wiring layer MC and diffusion barrier film ADL2 in contact with the upper surface thereof constitute a mark wiring layer region MCF.

In each of the pixel region, the logic circuit region, and the monitor pattern region, an interlayer insulating film II3 is formed on interlayer insulating film II2 so as to cover diffusion barrier film ADL2. Interlayer insulating film II3 includes an interlayer insulating film II3*a* and an interlayer insulating film II3*b* stacked in this order.

In the logic circuit region and the pixel region, a contact region C3 passing through interlayer insulating film II3*a* and diffusion barrier film ADL2 vertically in the figure and a wiring layer M3 (second wiring layer) passing through interlayer insulating film II3*b* vertically in the figure are formed to be integrated. Specifically, in the same manner as described above, contact region C3 is formed with a barrier metal BRL2 and a contact CT3, and wiring layer M3 is formed with a barrier metal BRL2 and a metal film ML3. Barrier metal BRL2 in contact region C3 and barrier metal BRL2 in wiring layer M3 are integrated and are also integrated with contact CT3 and metal film ML3.

The integrated wiring layer M3 and contact region C3 pass through diffusion barrier film ADL2 at the lower end of contact region C3 to be electrically connected with wiring layer M2 below. Metal layer M3 is thus electrically connected with wiring layer M2 through contact region C3.

The same layer as wiring layer M3 may be formed partially or entirely, though not formed in the monitor pattern in FIG. 5. Although mark wiring layer MC is formed as the same layer as wiring layer M2 in the monitor pattern region in FIG. 5, mark wiring layer MC is not limited to this configuration as long as it is at least formed above (the opposite side to semiconductor substrate SUB) monitor pattern MP. For example, mark wiring layer MC may be formed as the same layer as wiring layer M3 or wiring layer M4 described later in place of the same layer as wiring layer M2. Although monitor pattern MP is formed in diffusion barrier film ADL1 in FIG. 5, monitor pattern MP is not limited thereto and, for example, may be formed in diffusion barrier film ADL2 or formed in diffusion barrier film ADL3.

Diffusion barrier film ADL3 is formed on interlayer insulating film II3*b* so as to cover the upper surface of wiring layer M3. A detailed description thereof is basically the same as above and is omitted. In particular, immediately above photodiode PD, an opening region CV3 in which diffusion barrier film ADL3 is removed is formed (so as to overlap at least part of opening regions CV1, CV2).

In FIG. 5, diffusion barrier film ADL3 is formed in the entire monitor pattern region. However, this is shown only by way of example and, for example, diffusion barrier film ADL3 may be formed in only part of the monitor pattern region or diffusion barrier film ADL3 may not be formed at all. Supposing mark wiring layer MC is formed as the same layer as wiring layer M3 as described above, diffusion barrier film ADL3 is formed in contact with the upper surface thereof.

In each of the pixel region, the logic circuit region, and the monitor pattern region, an interlayer insulating film II4 is formed on interlayer insulating film II3 so as to cover diffusion barrier film ADL3. Interlayer insulating film II4 includes an interlayer insulating film II4*a* and an interlayer insulating film II4*b* stacked in this order. In the logic circuit region and the pixel region, a contact region C4 and a wiring layer M4 passing through interlayer insulating film II4 are integrally formed. Contact region C4 is formed with a barrier metal BRL2 and a contact CT4, and wiring layer M4 is formed with a barrier metal BRL2 and a metal film ML4. Barrier metal BRL2 in contact region C4 and barrier metal BRL2 in wiring layer M4 are integrated and are also integrated with contact CT4 and metal film ML4. Contact region C4 passes through diffusion barrier film ADL3 and electrically connects wiring layer M4 with wiring layer M3.

Although not formed in the monitor pattern region in FIG. 5, the same layer as wiring layer M4 may be formed partially or entirely.

A diffusion barrier film ADL4 is formed on interlayer insulating film II4*b* so as to cover the upper surface of wiring layer M4. A description thereof is basically the same as above and omitted. In particular, an opening region CV4 in which diffusion barrier film ADL4 is removed is formed immediately above photodiode PD (so as to overlap at least part of opening regions CV1, CV2, CV3). In FIG. 5, opening regions CV1 to CV4 in the pixel region are collectively referred to as opening region CV.

In FIG. 5, diffusion barrier film ADL4 is formed in the entire monitor pattern region. However, this is shown only by way of example, and diffusion barrier film ADL4 may be formed in only part of the monitor pattern region or diffusion barrier film ADL4 may not be formed at all. However, supposing mark wiring layer MC is formed as the same layer as wiring layer M4 as described above, diffusion barrier film ADL4 is formed in contact with the upper surface thereof.

In each of the pixel region, the logic circuit region, and the monitor pattern region, an interlayer insulating film II5 is formed on interlayer insulating film II4 so as to cover diffusion barrier film ADL4. Interlayer insulating film II5 includes an interlayer insulating film II5*a* and an interlayer insulating film II5*b* stacked in this order. In the logic circuit region, a wiring layer M5 is formed on interlayer insulating film II5*a*. This is a wiring layer arranged to input/output an electrical signal between the MOS transistor and the like in the logic circuit region and the outside.

Though not shown, a planarization film, for example, made of a silicon oxide film may be formed on interlayer insulating film II5. In particular, a color filter CF is formed on interlayer insulating film II5 (or the planarization film) in the pixel region, and a light-receiving lens LNS is formed on color filter CF. The semiconductor device in the present embodiment therefore includes a solid state image sensor that photoelectrically coverts light incident on photodiode PD from light-receiving lens LNS through color filter CF to produce an electrical signal in photodiode PD.

The manner of the monitor pattern region in FIG. 5 described above and the plan view in FIG. 4 shows the monitor pattern region as a whole in a wafer state before dicing in FIG. 1. Since the monitor pattern region of the semiconductor chip after dicing as shown in FIG. 2 is formed at the edge of the chip and partially removed by cutting, only part of the manner shown in FIG. 4 and FIG. 5 is left (for example, the configuration in FIG. 4 is cut into two, which are formed at the left and right ends of chip region IMC in FIG. 2).

Figure 6A:
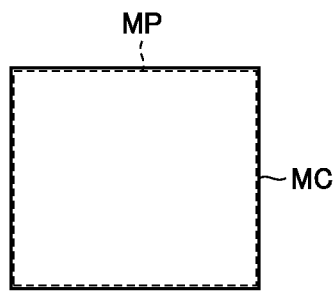
FIG. 6A is a schematic plan view showing a manner in which a monitor pattern and a mark wiring layer in the first embodiment overlap each other in a two-dimensional view.

Referring to FIG. 6A, in the present embodiment, mark wiring layer MC shown by the solid line in the figure has such a shape (almost same shape and dimension) that overlaps to almost completely coincide with monitor pattern MP in the monitor pattern region shown by the dotted line in the figure and has, for example, an approximately square two-dimensional shape. In this manner, mark wiring layer MC is preferably arranged so as to completely overlap the entire monitor pattern MP immediately below, in a two-dimensional view.

Figure 6B:
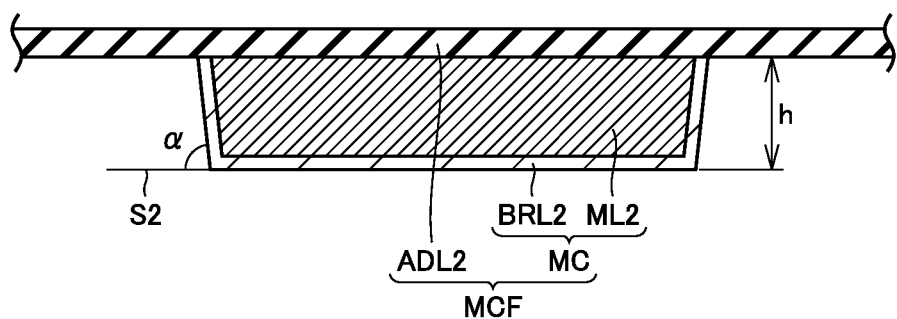
FIG. 6B is a schematic cross-sectional view showing the dimension of the mark wiring layer in the first embodiment.

Referring to FIG. 6B, the thickness h of mark wiring layer MC is preferably equal to or greater than one third of the thickness of interlayer insulating film II2 in which it is formed. In other words, referring to FIG. 5 and FIG. 6B, the thickness h of mark wiring layer MC is preferably equal to or greater than one third of the dimension (thickness) in the vertical direction in FIG. 5 of a set of wiring layer M2 and contact region C2 in line with mark wiring layer MC as the same layer.

Further referring to FIG. 6B, the angle α of the sidewall of mark wiring layer MC is preferably not less than 70° and not more than 90° relative to the direction (the horizontal direction in FIG. 5) of main surface S1 of semiconductor substrate SUB. Here, in particular, the angle α of that surface of the sidewall of mark wiring layer MC which faces outside relative to a surface S2 parallel to the main surface and extending outward (the outside of mark wiring layer MC) at the bottom portion of the sidewall is preferably not less than 70° and not more than 90°.

As shown in FIG. 5, the dimension x2 in the direction along main surface S1 of monitor pattern MP of diffusion barrier film ADL1 as the second opening region is basically larger than the dimension x1 in the direction along main surface S1 of opening region CV1 of diffusion barrier film ADL1 as the first opening region. This will now be described in details with reference to FIG. 7 to FIG. 9.

Figure 7:
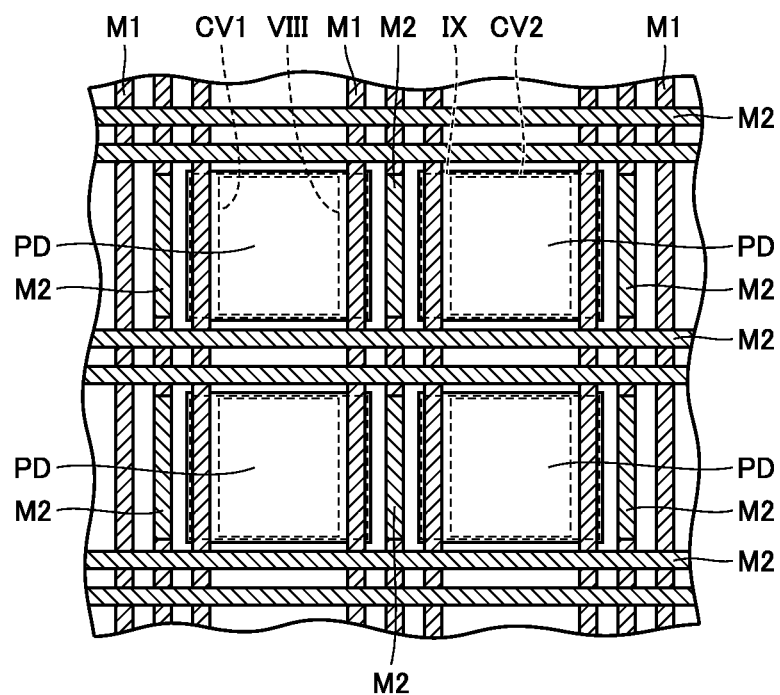
FIG. 7 is a schematic plan view of an opening region of a diffusion barrier film in a pixel region in the first embodiment.

Referring to FIG. 7, opening regions CV1 to CV4 each forming opening region CV are basically formed immediately above photodiode PD and therefore they are preferably overlap to almost completely coincide with each other in a two-dimensional view. However, since wiring layer M1 and the overlying wiring layer M2 are different in the direction and the location in which they extend, opening region CV1 of diffusion barrier film ADL1 formed dependently on the arrangement location of wiring layer M1 and opening region CV2 of diffusion barrier film ADL2 formed dependently on the arrangement location of wiring layer M2 are at least partially overlapped, but the dimensions of opening region CV1 and opening region CV2 may not be equal to each other.

Figure 8:
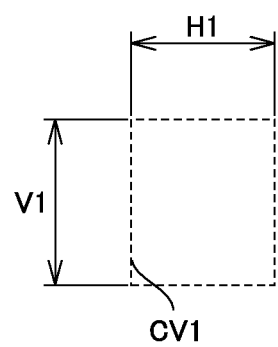
FIG. 8 is a schematic plan view showing the shape and the dimension of the opening region of the diffusion barrier film in a bottom layer in the pixel region in the first embodiment.
Figure 9:
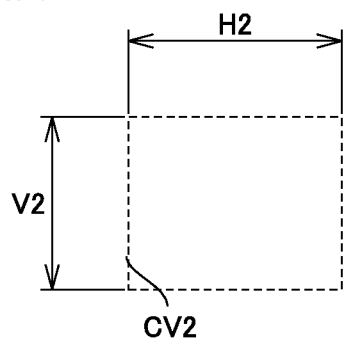
FIG. 9 is a schematic plan view showing the shape and the dimension of the opening region of the diffusion barrier film in a layer immediately overlying the bottom layer in the pixel region in the first embodiment.

Referring to FIG. 8 and FIG. 9, for example, assume that opening region CV1 formed in diffusion barrier film ADL1 has a rectangular shape having a horizontal dimension H1 and a vertical dimension V1 (H1<V1) and that opening region CV2 formed in diffusion barrier film ADL2 has a rectangular shape having a horizontal dimension H2 and a vertical dimension V2 (H2>V2).

In the present embodiment, supposing monitor pattern MP is formed in diffusion barrier film ADL1 as shown in FIG. 5, the smallest value of the dimensions of, for example, a rectangular shape that forms monitor pattern MP is larger than H1 that is the smallest value of the dimensions in a two-dimensional view of opening region CV1. Supposing that monitor pattern MP is formed in diffusion barrier film ADL2, the smallest value of the dimensions of, for example, a rectangular shape that forms monitor pattern MP is larger than V2 that is the smallest value of the dimensions in a two-dimensional view of opening region CV2.

As described above, in the present embodiment, the smallest value of the dimensions in a two-dimensional view of monitor pattern MP formed in diffusion barrier film ADL1 is larger than the smallest value H1 of the dimensions in a two-dimensional view of first opening region CV1 of diffusion barrier film ADL1 formed immediately above photodiode PD as shown in FIG. 8. Although the smallest value H1 of the dimensions of opening region CV1 in FIG. 8 is in the horizontal direction, the dimension larger than H1 of monitor pattern MP is in any direction, the horizontal direction, the vertical direction, or the diagonal direction in a two-dimensional view.

Similarly, supposing that monitor pattern MP is formed in diffusion barrier film ADL2, the smallest value of the dimensions in a two-dimensional view of monitor pattern MP is larger than the smallest value V2 of the dimension of opening region CV2 in FIG. 9. Also in this case, the dimension larger than V2 of monitor pattern MP is in any direction, the horizontal direction, the vertical direction, or the diagonal direction in a two-dimensional view.

The operational effects below can be achieved by applying the present embodiment when monitor pattern MP and first opening region CV1 has the size relation as described above.

A method of manufacturing a semiconductor device in the present embodiment shown in FIG. 5 will now be described with reference to FIG. 10 to FIG. 25.

Figure 10:
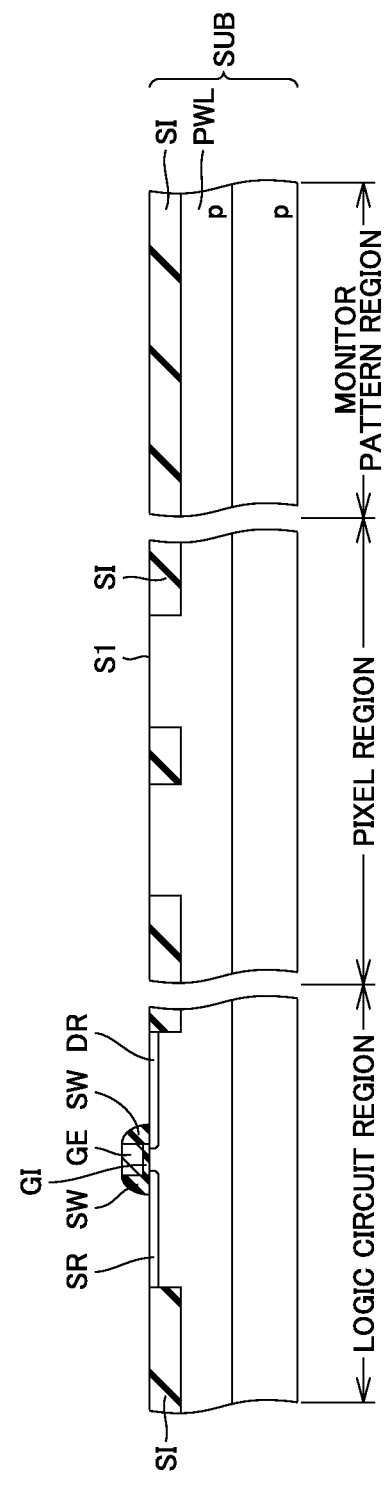
FIG. 10 is a schematic cross-sectional view showing a first step of a method of manufacturing a semiconductor device in the first embodiment.

Referring to FIG. 10, semiconductor substrate SUB is prepared, which is made of a semiconductor material that varies depending on wavelengths of light applied during use, such as silicon or germanium. P-type well region PWL is formed at main surface S1 of semiconductor substrate SUB, for example, by general ion implantation technique. Isolation insulating film SI is formed, for example, in a boundary region between the logic circuit region and the pixel region, and a region sandwiched between a pair of photodiodes adjacent to each other in the pixel region. Isolation insulating film SI electrically isolates the logic circuit region, the pixel region, and the monitor pattern region from each other.

Next, in a state in which main surface S1 in the pixel region and the monitor pattern region is coated with a photoresist (photoconductive material), gate insulating film GI and gate electrode GE are formed at a desired position in the logic circuit region. Source region SR and drain region DR are formed at main surface S1 of semiconductor substrate SUB on the left and right sides of gate electrode GE using general photolithography technique and ion implantation technique. Sidewall insulating film SW, for example, made of a silicon oxide film and a silicon nitride film is formed on the sidewalls of the gate electrode GE and gate insulating film GI.

Figure 11:
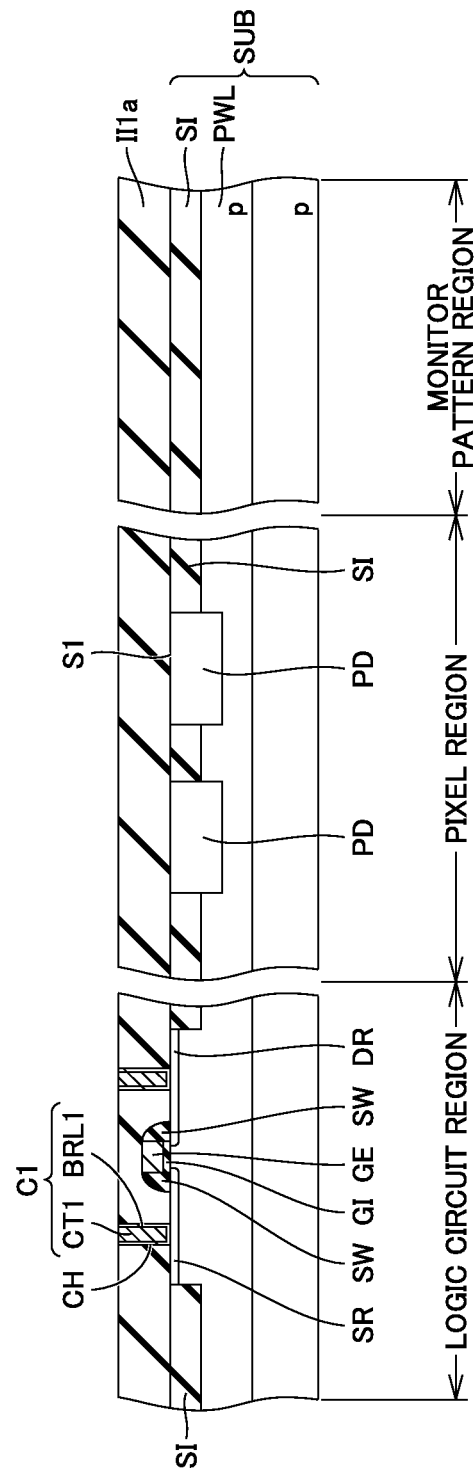
FIG. 11 is a schematic cross-sectional view showing a second step of the method of manufacturing a semiconductor device in the first embodiment.

Referring to FIG. 11, next, with the photoresist in the pixel region removed, an n-type impurity region is formed using general photolithography technique and ion implantation technique in the inside of p-type well region PWL in the pixel region. Photodiode PD including p-type well region PWL and the n-type impurity region is thus formed.

Next, interlayer insulating film II1a made of a silicon oxide film is formed using, for example, CVD (Chemical Vapor Deposition). Interlayer insulating film II1a may include carbon. Interlayer insulating film II1a is thereafter polished so that the upper surface is flat, by a chemical mechanical polishing method called CMP. Next, contact hole CH is formed in interlayer insulating film II1a so as to reach source region SR and drain region DR by general photolithography technique and etching technique.

Next, barrier metal BRL1 is formed on interlayer insulating film II1a so as to cover the inner wall of contact hole CH, for example, by sputtering. Barrier metal BRL1 is preferably formed of a single layer or a plurality of layers, for example, including at least one or more titanium or titanium nitride layers.

Next, the inside of contact hole CH is filled with contact CT1, for example, as a tungsten thin film. In this process, for example, CVD is used to form a tungsten-based thin film also on interlayer insulating film II1a. Barrier metal BRL1 and contact CT1 on interlayer insulating film II1a are removed by CVD. Contact region C1 including barrier metal BRL1 and contact CT1 is formed as described above.

Figure 12:
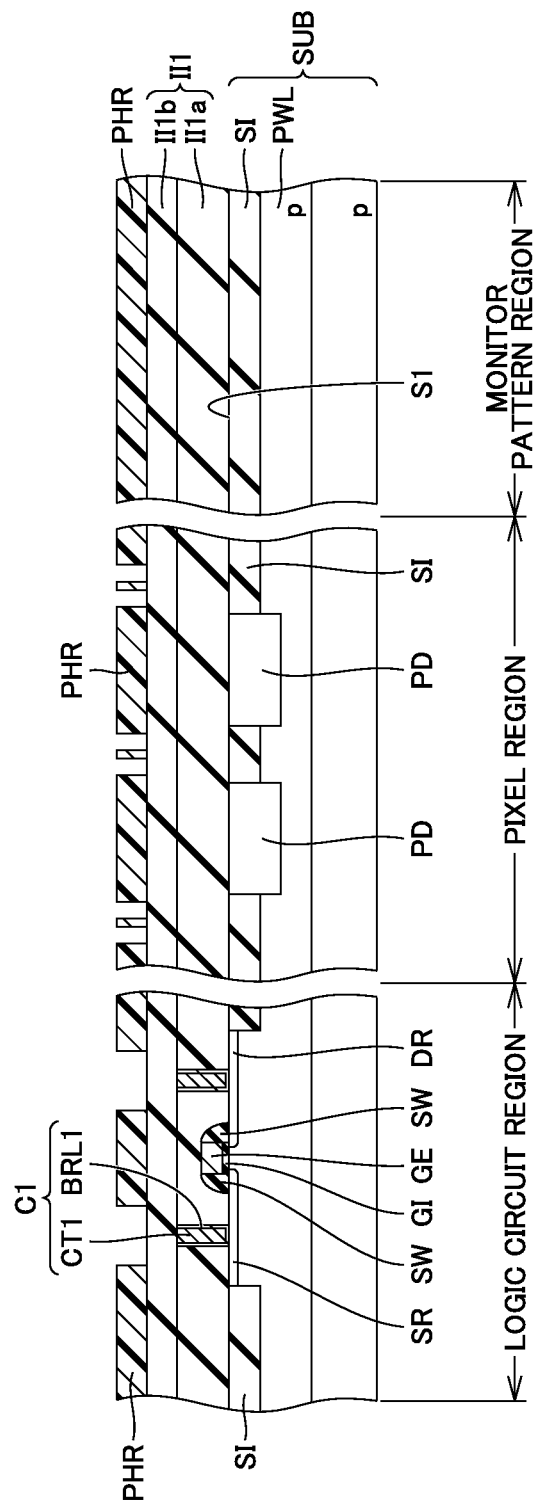
FIG. 12 is a schematic cross-sectional view showing a third step of the method of manufacturing a semiconductor device in the first embodiment.

Referring to FIG. 12, interlayer insulating film II1b formed of a silicon oxide film is formed by CVD on interlayer insulating film II1a. After the surface of interlayer insulating film Mb is polished by CMP and interlayer insulating film II1 is formed together with interlayer insulating film II1a, a pattern of photoresist PHR is formed, which has an opening in a region overlapped in a two-dimensional view with the region where wiring layer M1 is to be formed, by general photolithography technique. The opening in photoresist PHR is preferably formed so as to include the region immediately above contact region C1.

Figure 13:
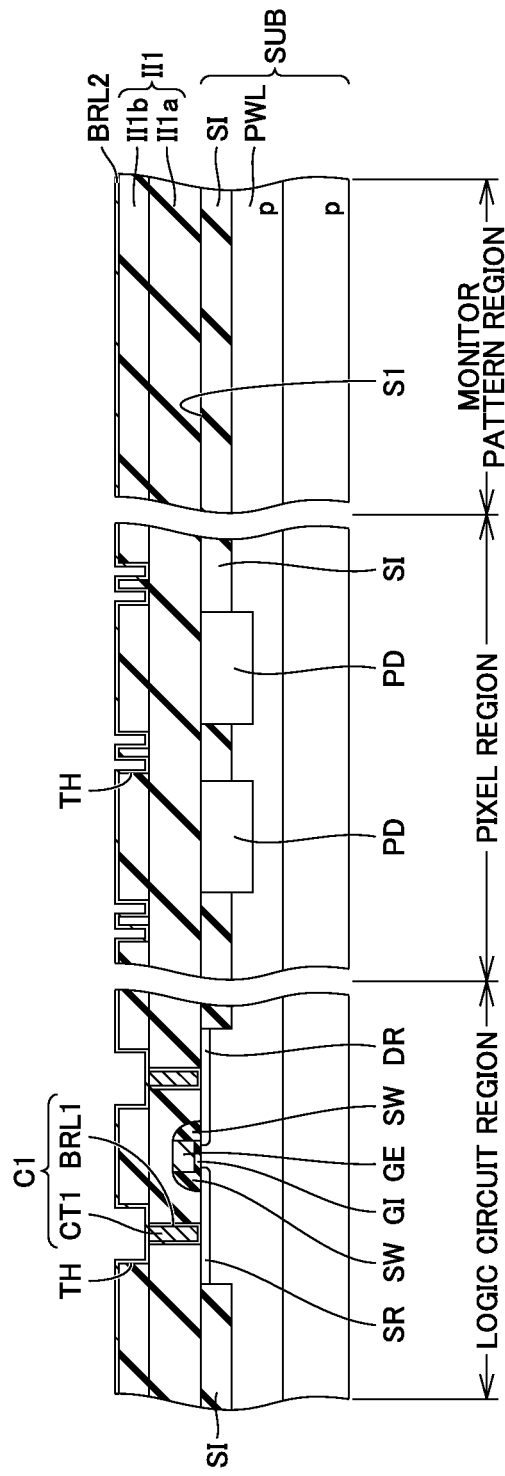
FIG. 13 is a schematic cross-sectional view showing a fourth step of the method of manufacturing a semiconductor device in the first embodiment.

Referring to FIG. 13, groove TH extending in a desired direction, for example, in the depth direction in the drawing sheet, is formed so as to pass through interlayer insulating film II1b to reach contact region C1 immediately below, by general etching technique using the pattern of photoresist PHR in FIG. 12. Next, barrier metal BRL2 is formed on interlayer insulating film Mb so as to cover the inner wall of groove TH, for example, by a general sputtering method. Barrier metal BRL2 is preferably formed with one selected from the group consisting of tantalum, titanium, tantalum nitride, and titanium nitride.

Figure 14:
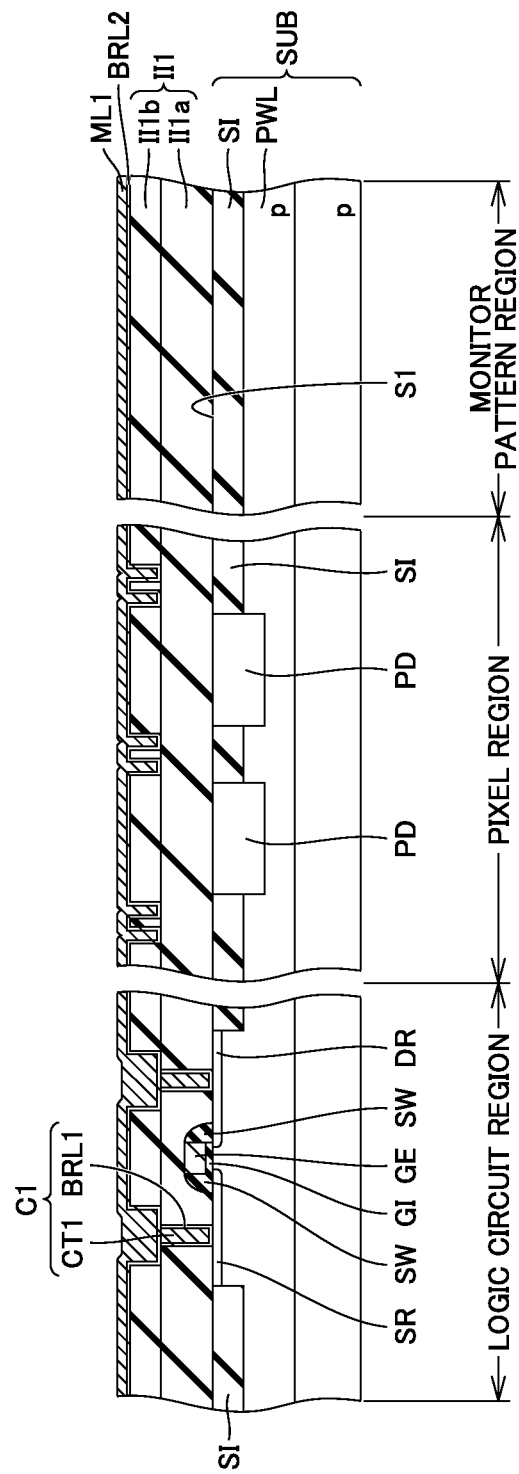
FIG. 14 is a schematic cross-sectional view showing a fifth step of the method of manufacturing a semiconductor device in the first embodiment.

Referring to FIG. 14, the inside of groove TH is filled with metal film ML1 based on, for example, copper, using CVD or plating.

Figure 15:
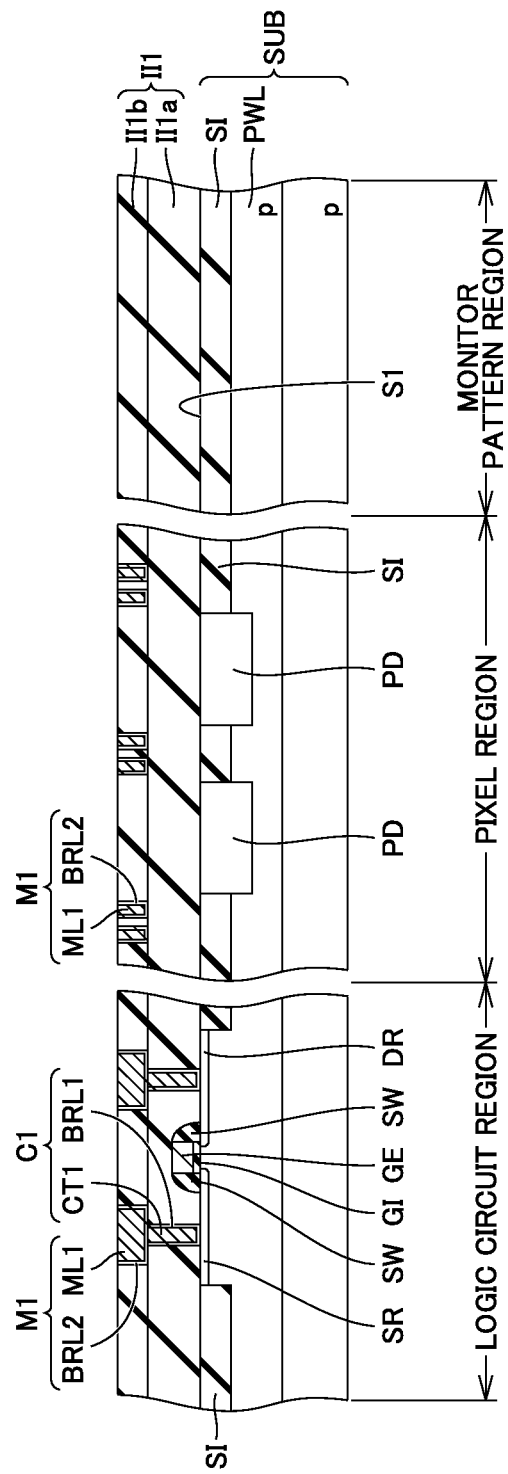
FIG. 15 is a schematic cross-sectional view showing a sixth step of the method of manufacturing a semiconductor device in the first embodiment.

Referring to FIG. 15, metal film ML1 and barrier metal BRL2 on interlayer insulating film II1b are removed by CMP. Copper-based wiring layer M1 (first wiring layer) is formed on main surface S1 of semiconductor substrate SUB as described above.

Figure 16:
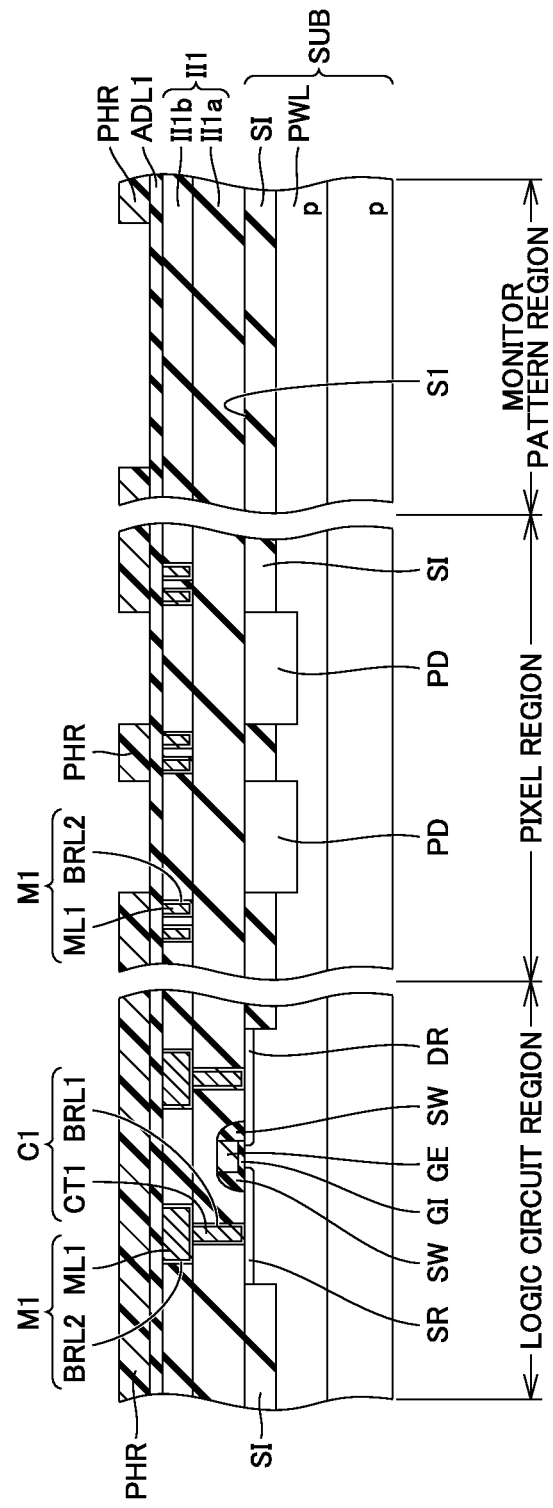
FIG. 16 is a schematic cross-sectional view showing a seventh step of the method of manufacturing a semiconductor device in the first embodiment.

Referring to FIG. 16, diffusion barrier film ADL1 is formed on interlayer insulating film II1b so as to cover the upper surface of wiring layer M1. Diffusion barrier film ADL1 is a compound mainly formed of silicon nitride, silicon carbide, silicon, nitride, carbon and is preferably formed by, for example, CVD. Diffusion barrier film ADL1 may be a single-layer film formed of the material above or may be a stacked film including a plurality of thin films. For example, a silicon nitride film and a TEOS film may be stacked. In this case, the TEOS film is formed for etching the silicon nitride film.

Next, a pattern of photoresist PHR is formed by general photolithography technique. The pattern of photoresist PHR is formed such that, for example, an opening is formed to include at least part of the region overlapped with photodiode PD in a two-dimensional view in the pixel region and, for example, an opening is formed in the region overlapped with the region where monitor pattern MP is to be formed in a two-dimensional view in the monitor pattern region.

Figure 17:
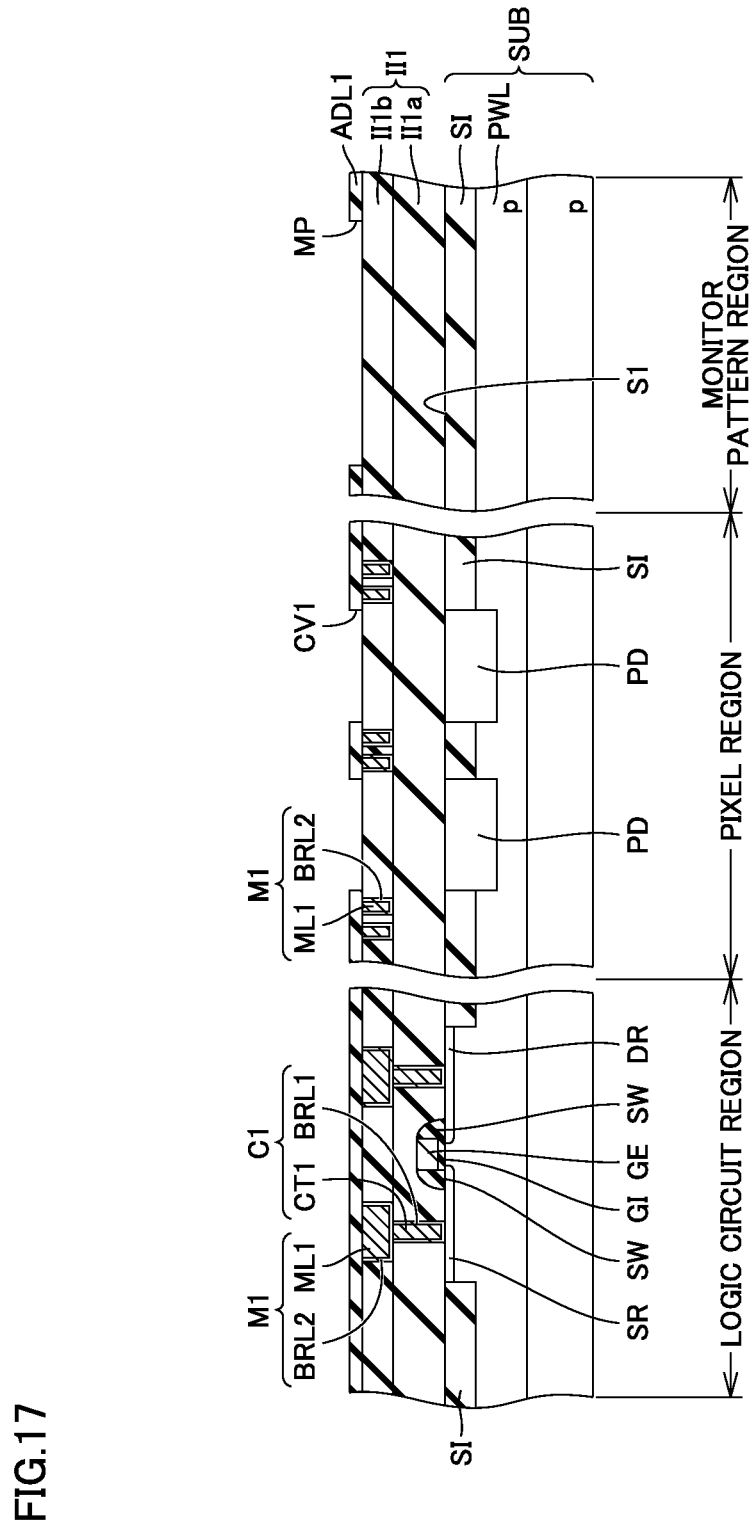
FIG. 17 is a schematic cross-sectional view showing an eighth step of the method of manufacturing a semiconductor device in the first embodiment.

Referring to FIG. 17, diffusion barrier film ADL1 (first diffusion insulating film) is formed by general etching technique using the pattern of photoresist PHR in FIG. 12, in which opening region CV1 is formed as the first opening region immediately above photodiode PD and monitor pattern MP is formed as the second opening region in the monitor pattern region. Here, the smallest value of the dimensions in a two-dimensional view of the monitor pattern MP is larger than the smallest value of the dimensions in a two-dimensional view of opening region CV1.

Figure 18:
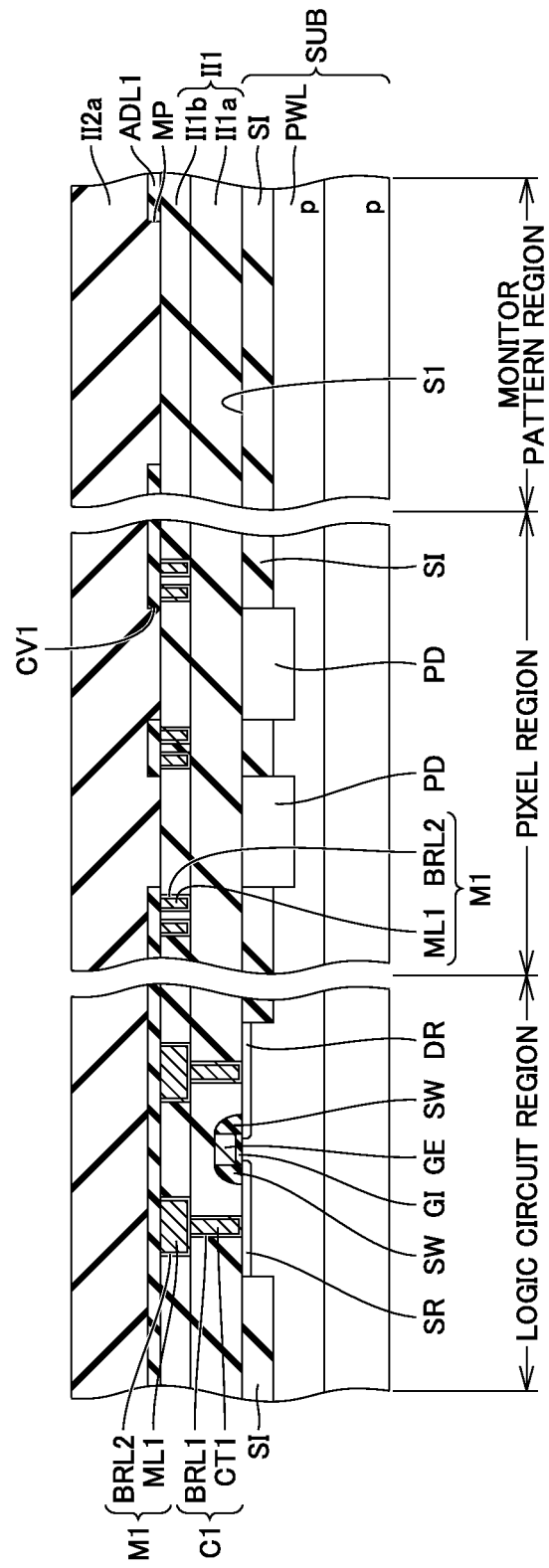
FIG. 18 is a schematic cross-sectional view showing a ninth step of the method of manufacturing a semiconductor device in the first embodiment.

Referring to FIG. 18, interlayer insulating film II2a (insulating film) having the same material as described above is formed so as to cover diffusion barrier film ADL1 by the same method as described above.

Figure 19:
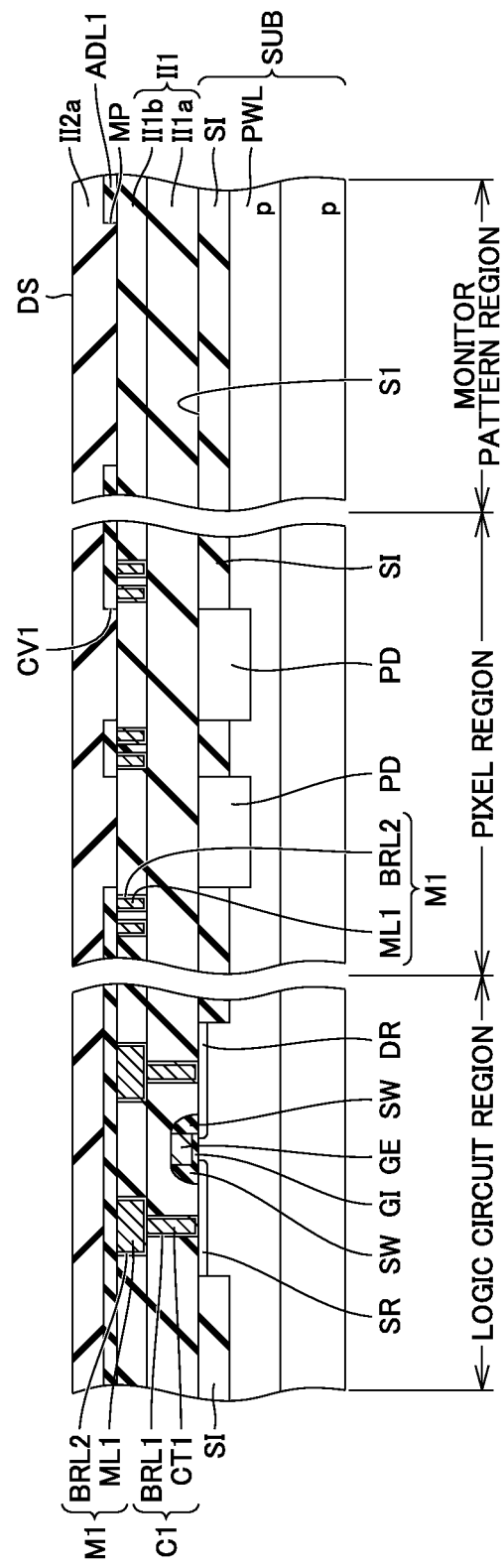
FIG. 19 is a schematic cross-sectional view showing a tenth step of the method of manufacturing a semiconductor device in the first embodiment.

Referring to FIG. 19, the upper surface of interlayer insulating film II2a is polished by, for example, CMP, resulting in interlayer insulating film II2a having a flat upper surface (first interlayer insulating film).

Figure 20:
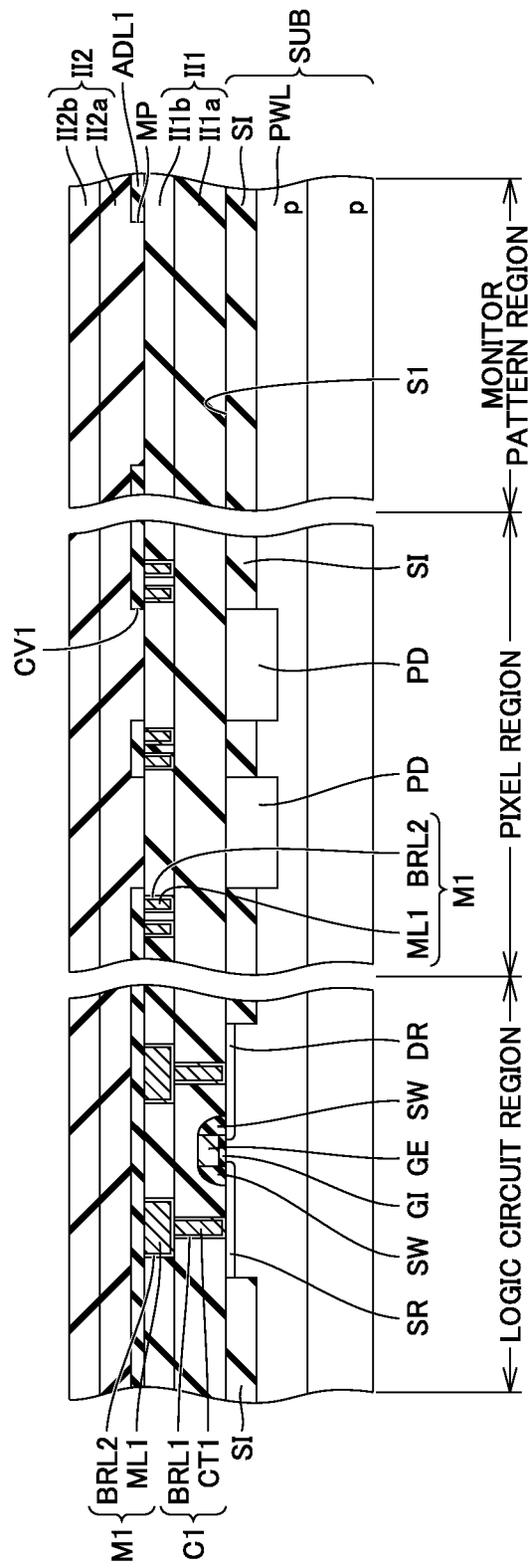
FIG. 20 is a schematic cross-sectional view showing an eleventh step of the method of manufacturing a semiconductor device in the first embodiment.

Referring to FIG. 20, interlayer insulating film II2b having the same material as described above is formed so as to cover the flat interlayer insulating film II2a by the same method as described above. The upper surface of interlayer insulating film II2b is polished to form interlayer insulating film II2 together with interlayer insulating film II2a.

Figure 21:
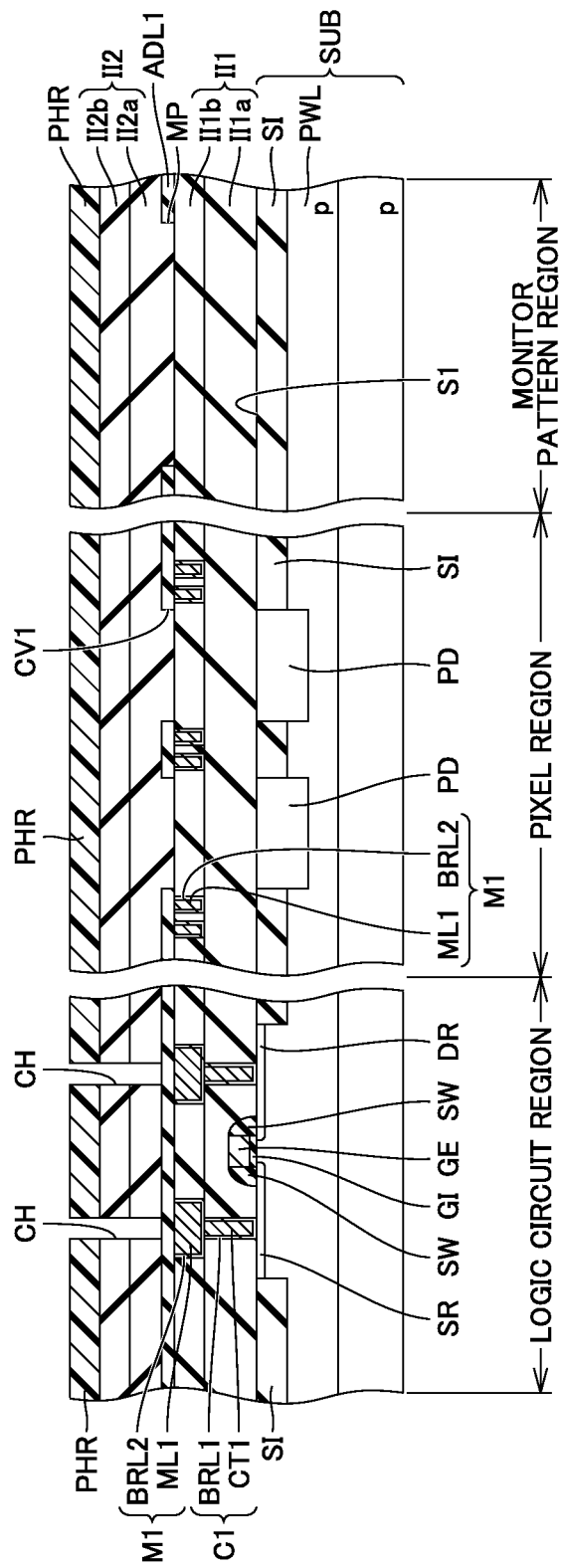
FIG. 21 is a schematic cross-sectional view showing a twelfth step of the method of manufacturing a semiconductor device in the first embodiment.

Referring to FIG. 21, contact hole CH (hole) is formed in the region where contact region C2 is to be formed in interlayer insulating film II2, by general photolithography technique and etching technique. Contact hole II2 is formed so as to reach the upper surface of diffusion barrier film ADL1.

Figure 22:
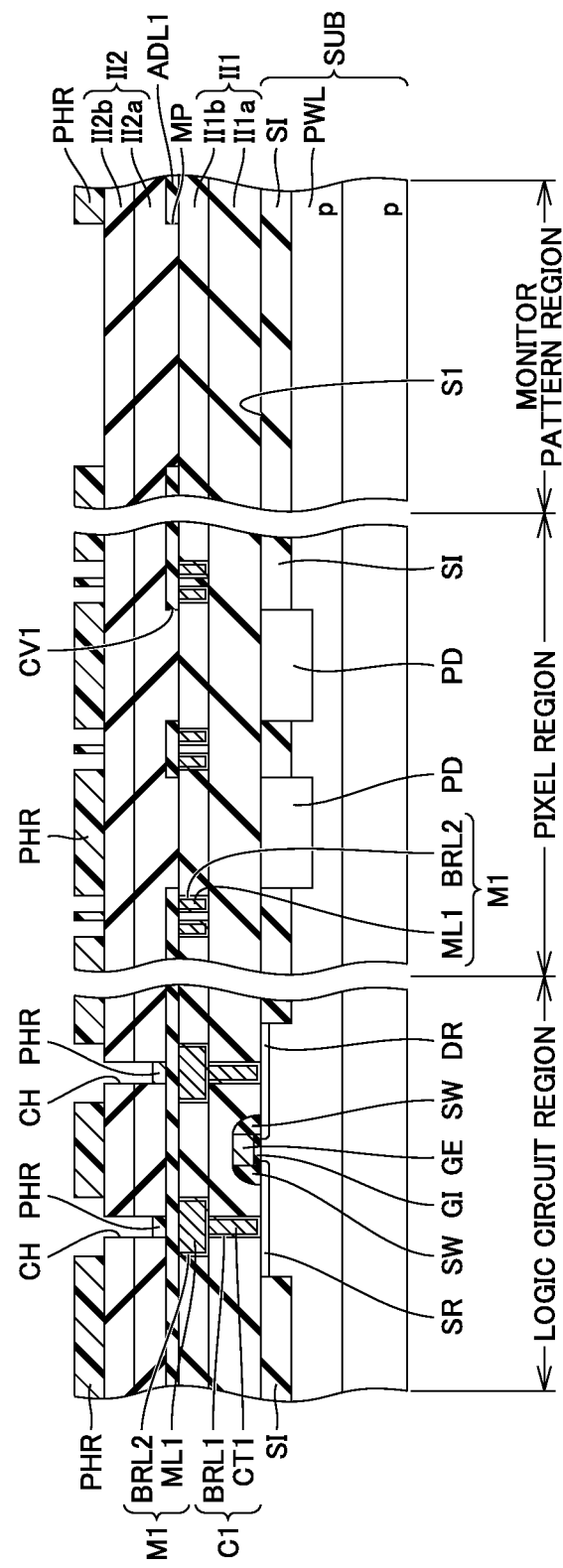
FIG. 22 is a schematic cross-sectional view showing a thirteenth step of the method of manufacturing a semiconductor device in the first embodiment.

Referring to FIG. 22, a pattern of photoresist PHR is formed, which has openings in the regions overlapped in a two-dimensional view with the region where wiring layer M1 is to be formed in the semiconductor circuit region and the region where mark wiring layer MC is to be formed in the monitor pattern region. The opening of photoresist PHR is preferably formed to include the region immediately above contact hole CH. The bottom wall of contact hole CH is also covered with the pattern of photoresist PHR.

Figure 23:
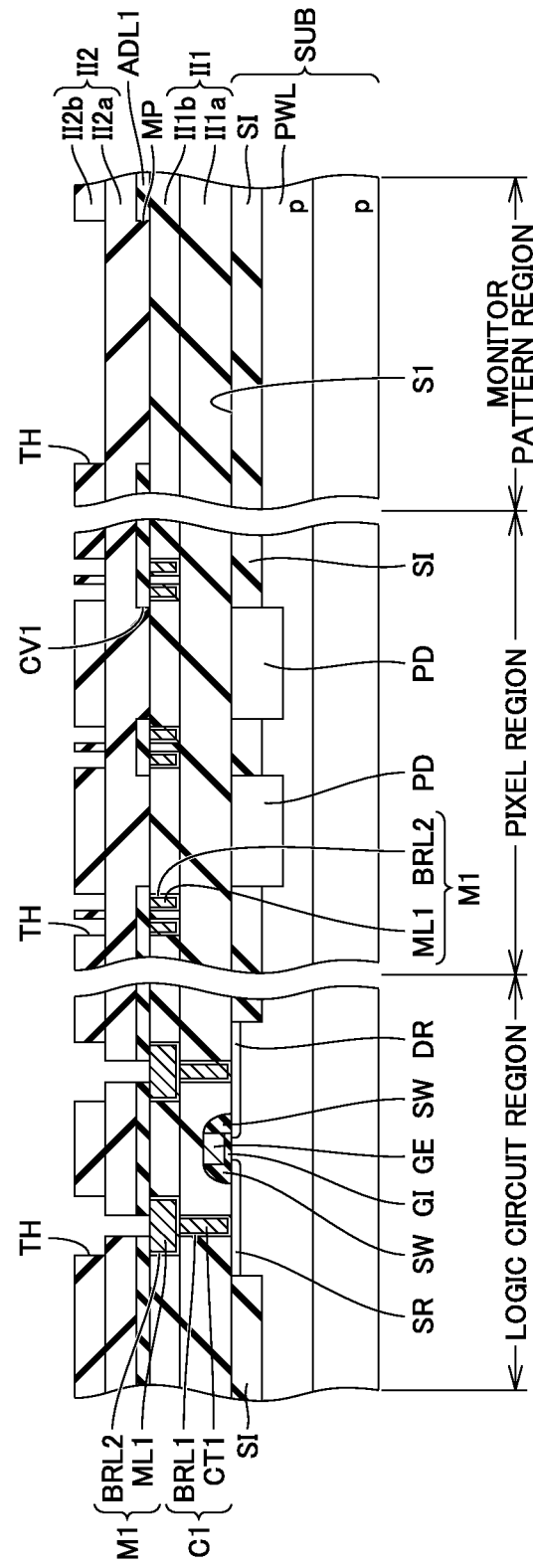
FIG. 23 is a schematic cross-sectional view showing a fourteenth step of the method of manufacturing a semiconductor device in the first embodiment.

Referring to FIG. 23, groove TH extending in a desired direction, for example, such as the depth direction in the drawing sheet is formed so as to pass through interlayer insulating film II2b to reach contact hole CH immediately below, by general etching technique using the pattern of photoresist PHR in FIG. 22. Contact hole CH and groove TH are thus integrated, in particular, in the semiconductor circuit region (the logic circuit region and the pixel region).

In the monitor pattern region, groove TH for forming mark wiring layer MC is formed immediately above monitor pattern MP. In the present embodiment, groove TH having the same shape and size as monitor pattern MP is formed so as to two-dimensionally overlap monitor pattern MP almost completely. Next, after the pattern of photoresist PHR in FIG. 22 is removed, diffusion barrier film ADL1 exposed on the bottom wall of contact hole CH is removed by etching. The opening portion of diffusion barrier film ADL1 formed here is not included in the first and second opening regions described above.

The surface of the copper-based thin film serving as metal film ML1, which is the underlying wiring exposed on the bottom wall of contact hole CH, is cleaned by performing sputter etching using argon, thermal treatment in a hydrogen atmosphere, or wet etching, as necessary.

Figure 24:
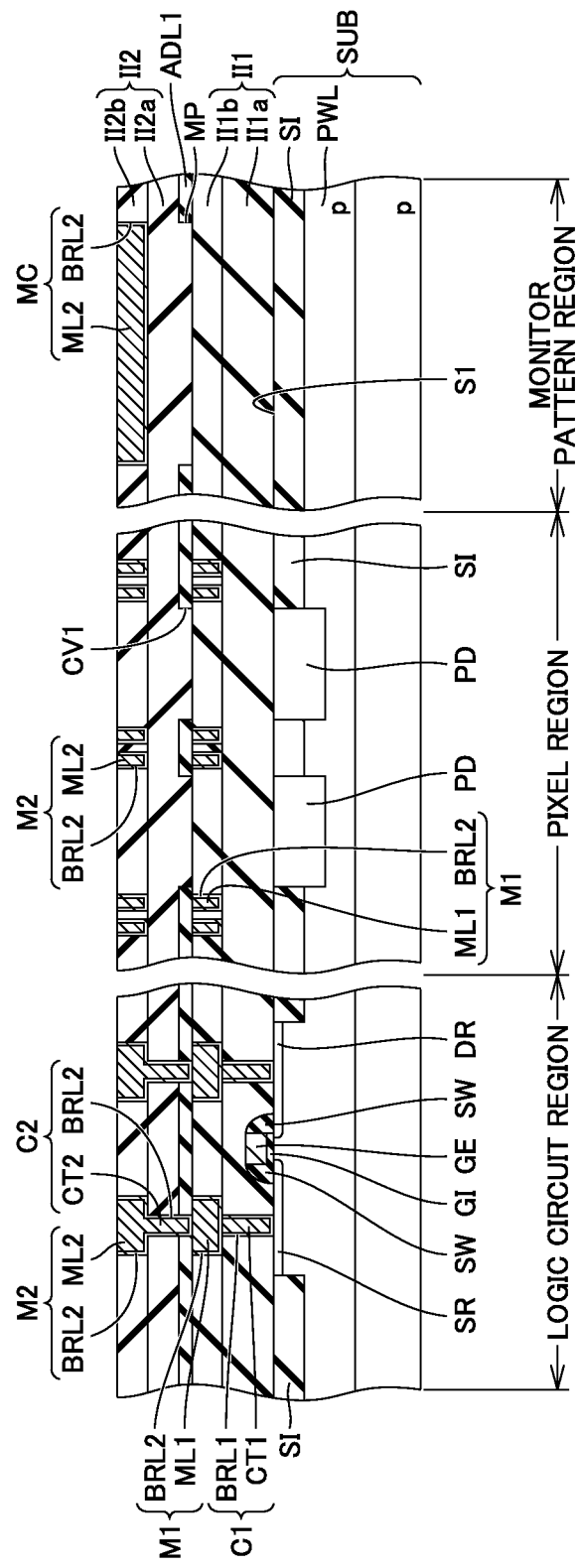
FIG. 24 is a schematic cross-sectional view showing a fifteenth step of the method of manufacturing a semiconductor device in the first embodiment.

Referring to FIG. 24, barrier metal BRL is formed on interlayer insulating film II2b so as to cover the inner walls of grove TH and contact hole CH, for example, by general sputtering. Next, the inside of groove TH and contact hole CH is filled with, for example, a copper-based thin film. The thin film in the inside of groove TH is formed as copper-based metal film ML2, and the thin film in the inside of contact hole CH is formed as contact CT2. Contact CT2 and metal film ML2 are integrally formed with the copper-based thin film. Here, a thin film serving as a shield film is initially formed, and a copper-based film is thereafter formed with a thickness that can fill the inside of groove TH and contact hole CH by plating so as to plate the shield film.

In the monitor patter region, the thin films, that is, barrier metal BRL2 and metal film ML2 are formed to fill in the inside of groove TH simultaneously with the formation of metal film ML2 and the like in the semiconductor circuit region as described above.

Metal film ML2 and barrier metal BRL2 on interlayer insulating film II2b are thereafter removed by CMP. As described above, in the semiconductor circuit region, wiring layer M2 (second wiring layer) formed of copper-based metal film ML2 and barrier metal BRL2 and contact region C2 (connection portion) connecting wiring layer M1 with wiring layer M2 are integrally formed. In the monitor pattern region, mark wiring layer MC as the same layer as wiring layer M2 is formed immediately above monitor pattern MP. It is noted that the dimension h and the angle α of mark wiring layer MC shown in FIG. 6B are sized as described above thereby achieving the operational effects below.

As described above, in formation of wiring layer M2 and the like, it is preferable to use the dual damascene method in which groove TH and contact hole CH are formed and the inside thereof is filled with the metal film, whereby the wiring layer and the connection portion are integrally formed.

Figure 25:
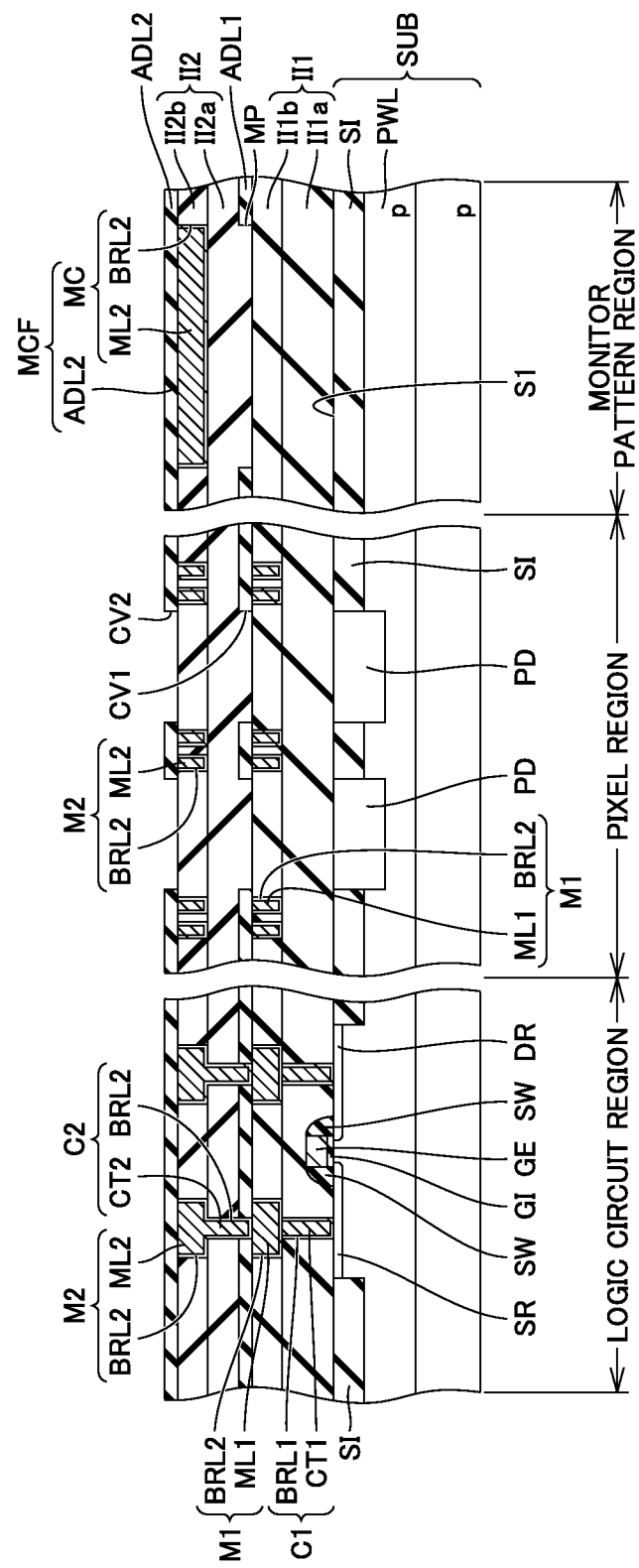
FIG. 25 is a schematic cross-sectional view showing a sixteenth step of the method of manufacturing a semiconductor device in the first embodiment.

Referring to FIG. 25, diffusion barrier film ADL2 is formed on interlayer insulating film II2b so as to cover the upper surface of wiring layer M2. The formation method, configuration, and material of diffusion barrier film ADL2 are the same as in diffusion barrier film ADL1. This diffusion barrier film ADL2 has opening region CV2 formed so as to include at least part of the region overlapped with photodiode PD in a two-dimensional view, for example, in the pixel region.

In the monitor pattern region, diffusion barrier film ADL2 is formed in contact with at least the upper surface of mark wiring layer MC so that mark wiring layer region MCF including mark wiring layer MC and diffusion barrier film ADL2 is formed. Here, diffusion barrier film ADL2 is preferably formed in contact with the entire upper surface of mark wiring layer MC.

In the following process, the same processes as described above are basically repeated to form the image sensor as a semiconductor device shown in FIG. 5, and a detailed description is omitted.

Referring now to a comparative example in FIG. 26 to FIG. 31, the operational effects of the present embodiment will be described.

Figure 26:
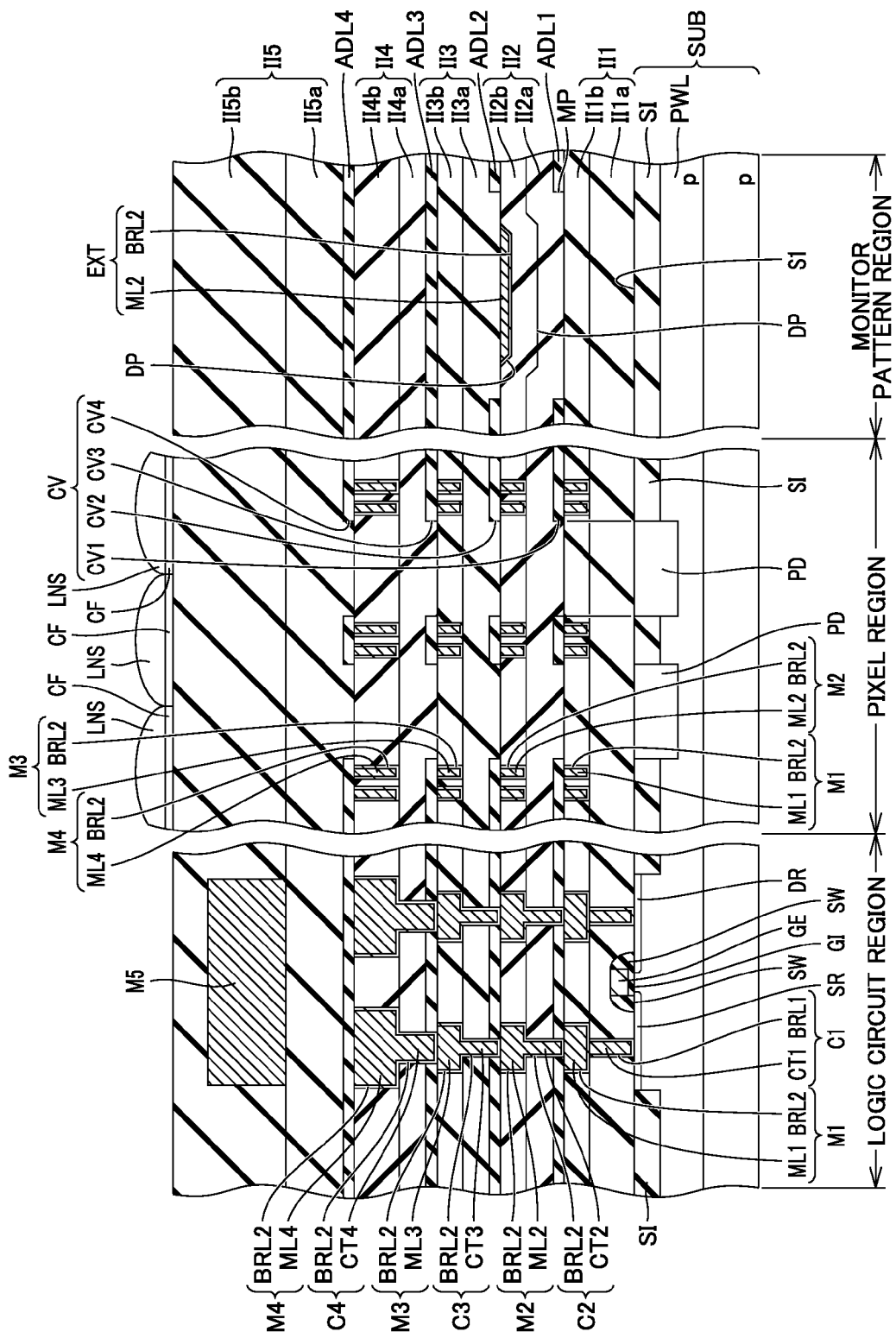
FIG. 26 is a schematic cross-sectional view showing a configuration of a semiconductor device in a comparative example.

Referring to FIG. 26, an image sensor as a semiconductor device in a comparative example basically has a similar configuration to the image sensor as a semiconductor device in the present embodiment but slightly differs in the configuration of the monitor pattern. Specifically, mark wiring layer MC is not formed in interlayer insulating film II2b, in which mark wiring layer MC is formed in the present embodiment, but an extra formation layer EXT is formed in this region. Extra formation layer EXT is formed with metal film ML2 and barrier metal BRL2 in the same manner as mark wiring layer MC.

Extra formation layer EXT is formed in a depression DP formed in the surface on the upper side of interlayer insulating film II2b. This depression DP is formed as a step in the surface on the upper side of interlayer insulating films II2a, II2b formed to cover monitor pattern MP that is an opening region of diffusion barrier film ADL1.

Figure 27:
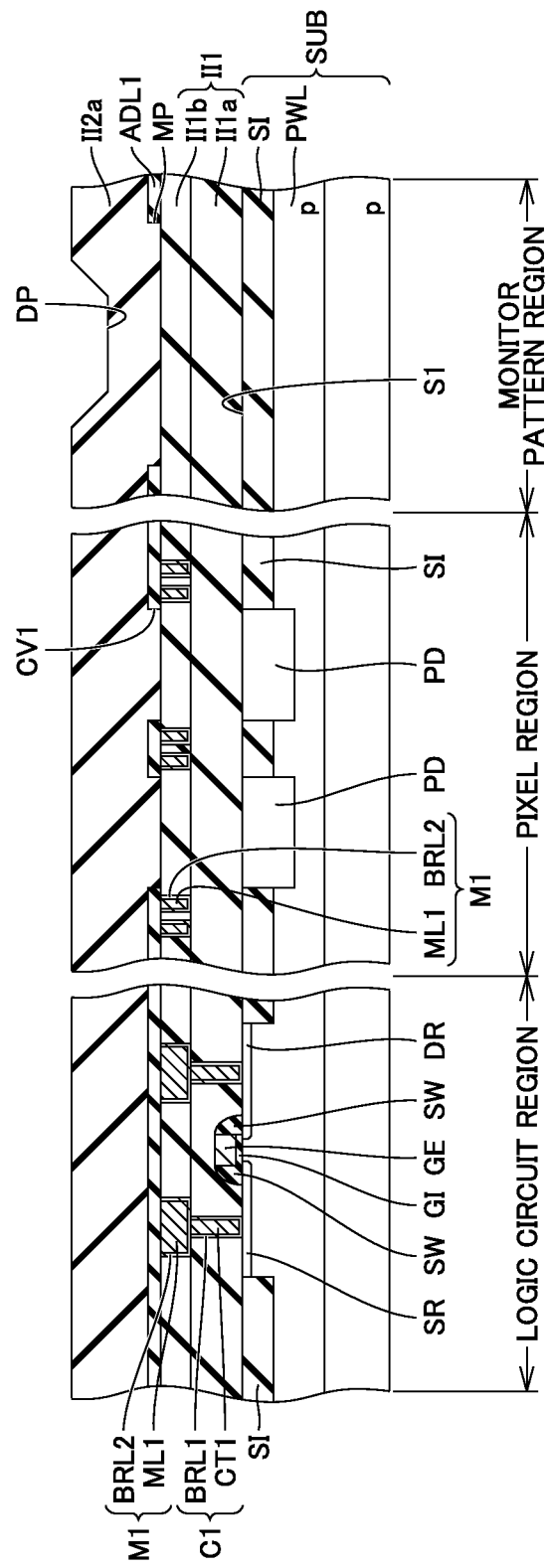
FIG. 27 is a schematic cross-sectional view showing a first step of a method of manufacturing a semiconductor device in the comparative example.

Specifically, referring to FIG. 27, in a method of manufacturing a semiconductor device in the comparative example, here, interlayer insulating film II2a is formed in the same manner as in the step in FIG. 18 in the present embodiment. Here, in interlayer insulating film II2a immediately above monitor pattern MP, depression DP is formed as a step such that the top surface is lower at a portion where diffusion barrier film ADL1 is not arranged. The shape of depression DP shown in FIG. 27 is shown only by way of example and varies depending on the employed process.

Figure 28:
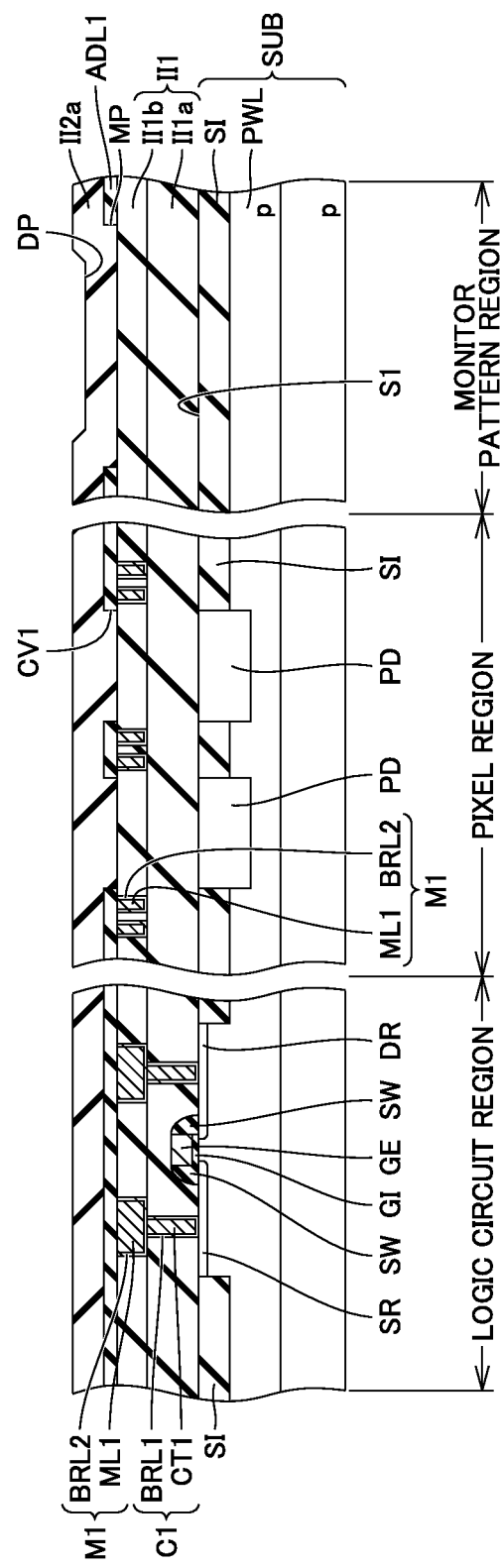
FIG. 28 is a schematic cross-sectional view showing a second step of a method of manufacturing a semiconductor device in the comparative example.
Figure 29:
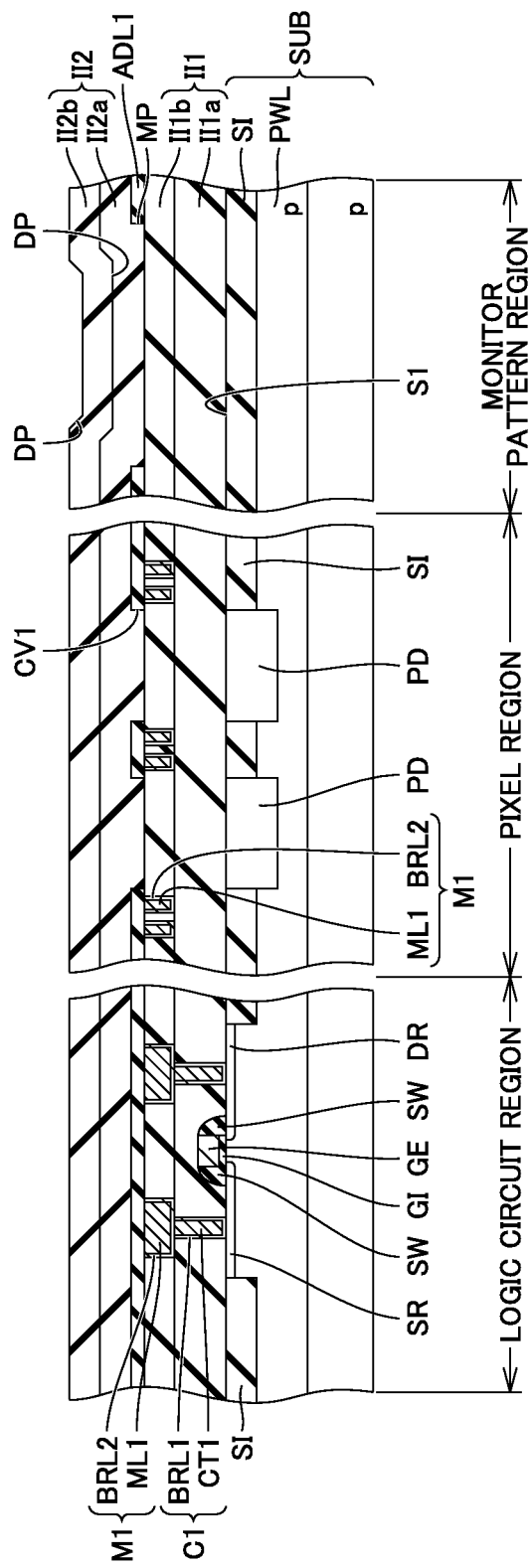
FIG. 29 is a schematic cross-sectional view showing a third step of a method of manufacturing a semiconductor device in the comparative example.

Referring to FIG. 28, here, the upper surface of interlayer insulating film II2a is polished away in the same manner as in the step in FIG. 19 but may not be removed completely if the area of the step of depression DP is large. Referring to FIG. 29, if interlayer insulating film II2b is formed on depression DP left in the same manner as in the step in FIG. 20, depression DP is also formed in the upper surface of interlayer insulating film II2b.

Figure 30:
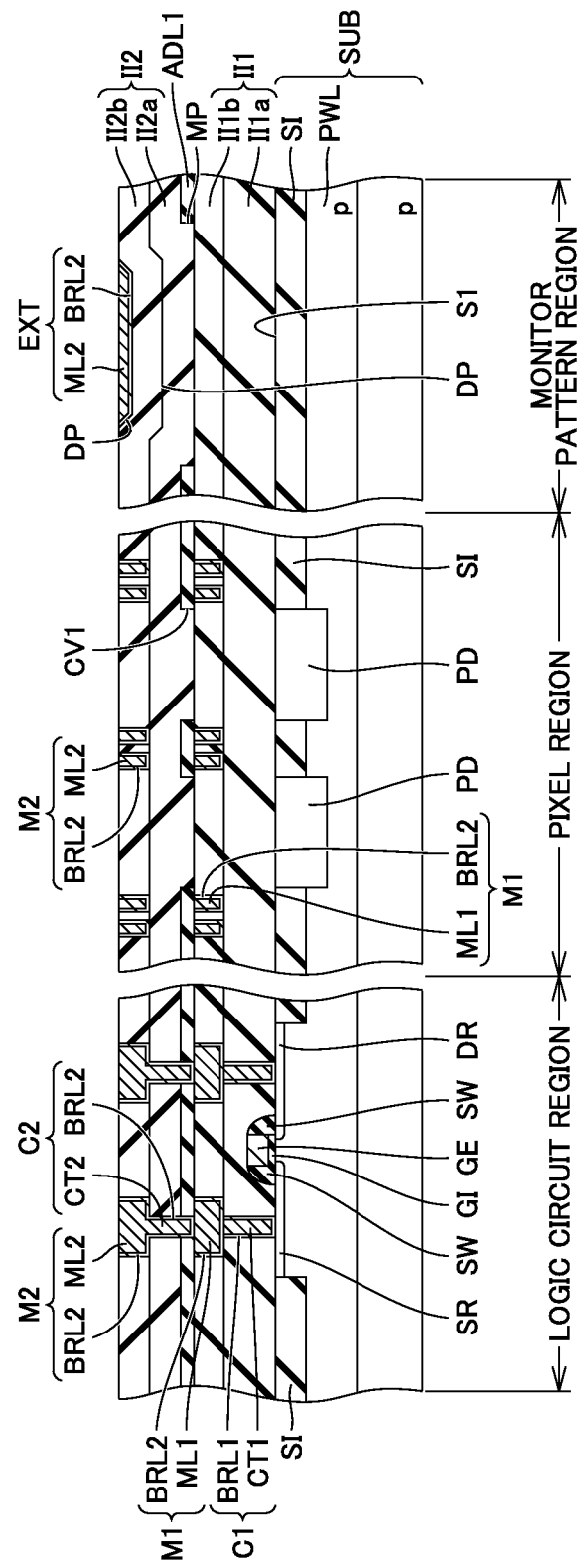
FIG. 30 is a schematic cross-sectional view showing a fourth step of a method of manufacturing a semiconductor device in the comparative example.

Referring to FIG. 30, wiring layer M2 is formed by forming barrier metal BRL2 and metal film ML2 in the same manner as in the step in FIG. 21 to FIG. 23. Here, since depression DP is formed in the upper surface of interlayer insulating film II2b, metal film ML2 and the like formed simultaneously with metal film ML2 and the like that constitute wiring layer M2 remain in depression DP even after polishing the surface, for example, by CMP in the same manner as in the step in FIG. 24. Extra formation layer EXT is thus formed in depression DP.

Figure 31:
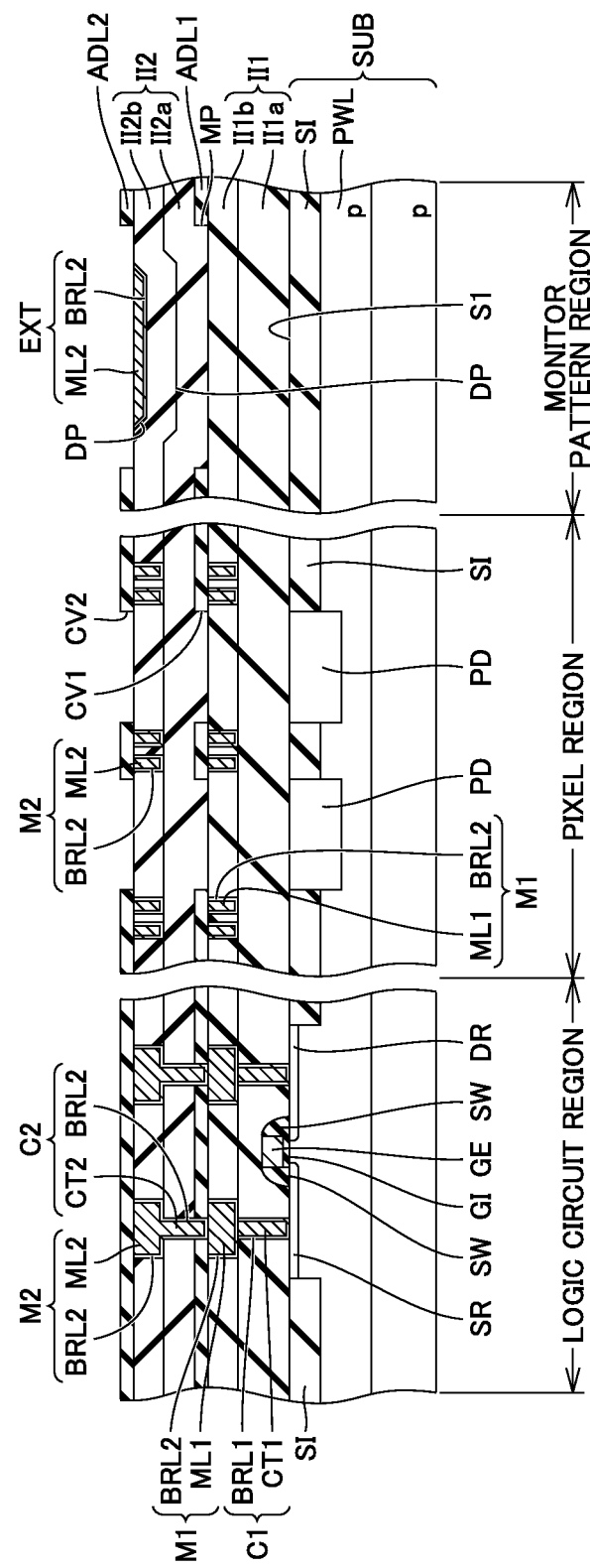
FIG. 31 is a schematic cross-sectional view showing a fifth step of a method of manufacturing a semiconductor device in the comparative example.

Referring to FIG. 31, diffusion barrier film ADL2 covering the upper surface of wiring layer M2 is formed in the same manner as in the step in FIG. 25. However, extra formation layer EXT in the monitor pattern region should not essentially be formed and therefore diffusion barrier film ADL2 is not formed immediately above it.

In this case, when interlayer insulating film II3 and the like are further formed after the step in FIG. 31, extra formation layer EXT not protected by diffusion barrier film ADL2 falls off from depression DP and remains as a foreign substance in the semiconductor device, possibly leading to operation failure and low yields of semiconductor devices. In addition, for example, copper that forms metal film ML2 of extra formation layer EXT diffuses very easily and diffuses to the outside, possibly causing a failure such as a short-circuit in an unintended region in the inside of the semiconductor device.

Those problems are produced because of the following reasons. Among monitor patterns MP, for example, a thickness monitor for measuring the film thickness of diffusion barrier film ADL1 in the vicinity of the edge portion of the opening region of diffusion barrier film ADL1 in the pixel region has a large dimension b and dimension c shown in FIG. 4 and has an extremely large area in a two-dimensional view. Therefore, even if the upper surface of the interlayer insulating film that covers monitor pattern MP having a large two-dimensional area is polished by CMP by the largest permissible thickness, for example, the upper surface DS of interlayer insulating film II2a immediately above monitor pattern MP shown in FIG. 19 actually leaves a step depressed downward in the portion corresponding to the step formed by the opening in diffusion barrier film ADL1, when compared with the region other than upper surface DS in the upper surface of interlayer insulating film II2a.

For example, in the first opening region of diffusion barrier film ADL1 formed immediately above photodiode PD in the pixel region, the step formed in the upper surface of the overlying interlayer insulating film II2a can be polished by CMP and thereby removed to form a flat surface. Therefore, a step is not formed either in interlayer insulating film II2b formed on interlayer insulating film II2a, and such inconvenience as in monitor pattern MP is unlikely to occur. This is because the first opening region formed immediately above photodiode PD has a small area in a two-dimensional view when compared with the aforementioned monitor pattern MP, and a step formed in the overlying interlayer insulating film IIa, if any, can be removed by polishing.

Since interlayer insulating film II2 has a two-layer structure including first interlayer insulating film II2a and second interlayer insulating film II2b, the surface of first interlayer insulating film II2a can be removed once after it is formed, and interlayer insulating film II2b can be formed thereon. Therefore, in particular in the semiconductor circuit region such as the pixel region, the flatness of interlayer insulating film II2b can be increased. Groove TH and wiring layer M2 are formed as the same layer as interlayer insulating film II2b, and contact hole CH and contact region C2 are formed as the same layer as interlayer insulating film II2a, so that the wiring layer and the contact region can be easily formed by the dual damascene method.

In light of suppressing the formation of extra formation layer EXT in interlayer insulating film II2 on monitor pattern MP as described above, in the present embodiment, mark wiring layer MC is formed in advance in the region where extra formation layer EXT may be formed, that is, the region immediately above monitor pattern MP so as to be overlapped in a two-dimensional view, and diffusion barrier film ADL2 is further formed so as to cover the upper surface of mark wiring layer MC. By doing so, even when the dimension of monitor pattern MP is larger than the dimension of the first opening region immediately above photodiode PD, the presence of mark wiring layer MC above monitor pattern MP can reduce the possibility of, for example, occurrence of diffusion of a metal material due to extra formation layer EXT. Since the upper surface of mark wiring layer MC is covered with diffusion barrier film ADL2, the possibility that the copper residue diffuses to the outside to cause operation failure and low yields of semiconductor devices can be reduced. Therefore, when, for example, the dual damascene method is used to form a metal film so as to fill in the inside of the groove formed in the interlayer insulating film, the possibility of unintentional formation of extra formation layer EXT is eliminated, and the reliability of the formed semiconductor device can be increased.

Referring to FIG. 8 and FIG. 9, if the smallest value of the dimensions in a two-dimensional view of monitor pattern MP formed in diffusion barrier film ADL1 is larger than the smallest value of the dimensions in a two-dimensional view of the opening region of diffusion barrier film ADL1 in the semiconductor circuit region, depression DP and extra formation layer EXT are likely to be formed. It is therefore preferable to apply the present embodiment when the smallest value of the dimensions in a two-dimensional view of the second opening region is larger than the smallest value of the dimensions in a two-dimensional view of the first opening region.

In the example described above, monitor pattern MP is arranged in the scribe line region. However, referring to FIG. 32, monitor pattern MP may be formed in, for example, the logic circuit region in the semiconductor circuit region. Also in this case, the same effects can be achieved as when monitor pattern MP is formed in the scribe line region. Though not shown, monitor pattern MP may be formed as the second opening region different from first opening region CV1, in a region other than the region where first opening region CV1 is formed, in the pixel region in the semiconductor circuit region.

Figure 32:
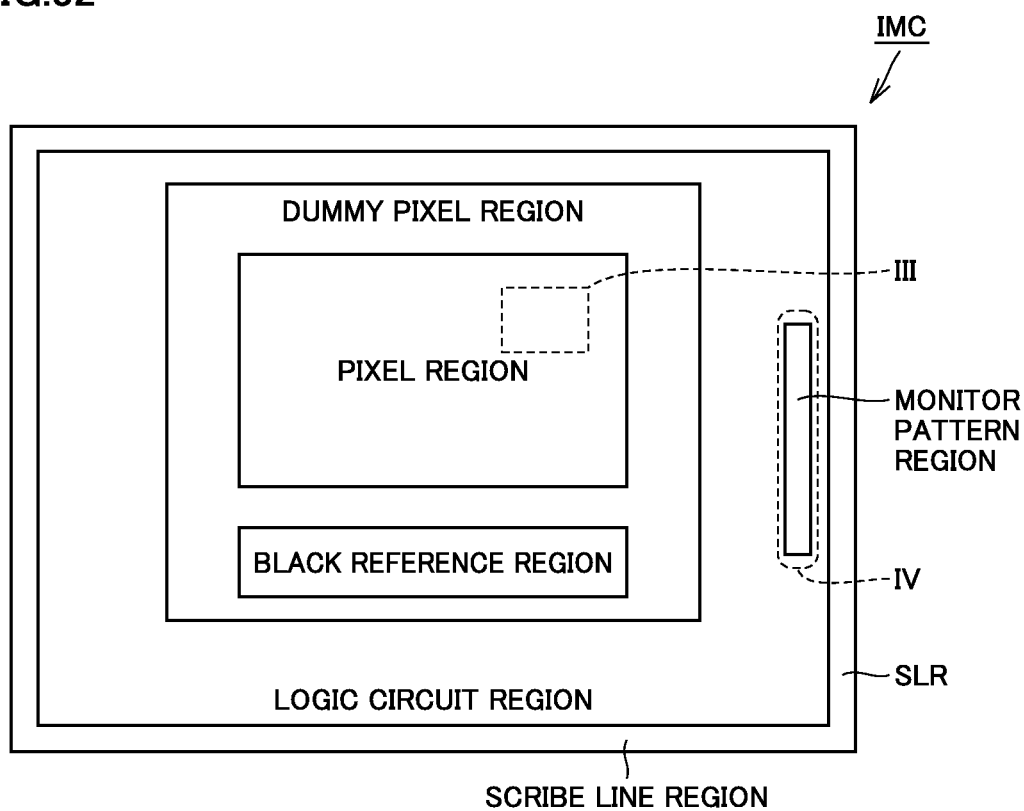
FIG. 32 is a schematic enlarged plan view showing a modification to the manner shown in FIG. 2 in the first embodiment.

When monitor pattern MP is formed in the semiconductor circuit region as in FIG. 32, unlike the case above, monitor pattern MP is not cut by dicing. Therefore, the monitor pattern region shown in FIG. 4, FIG. 5 and the following figures is entirely left both in a wafer state shown in FIG. 1 and in a semiconductor chip state after division as shown in FIG. 32.

Second Embodiment

Figure 33:
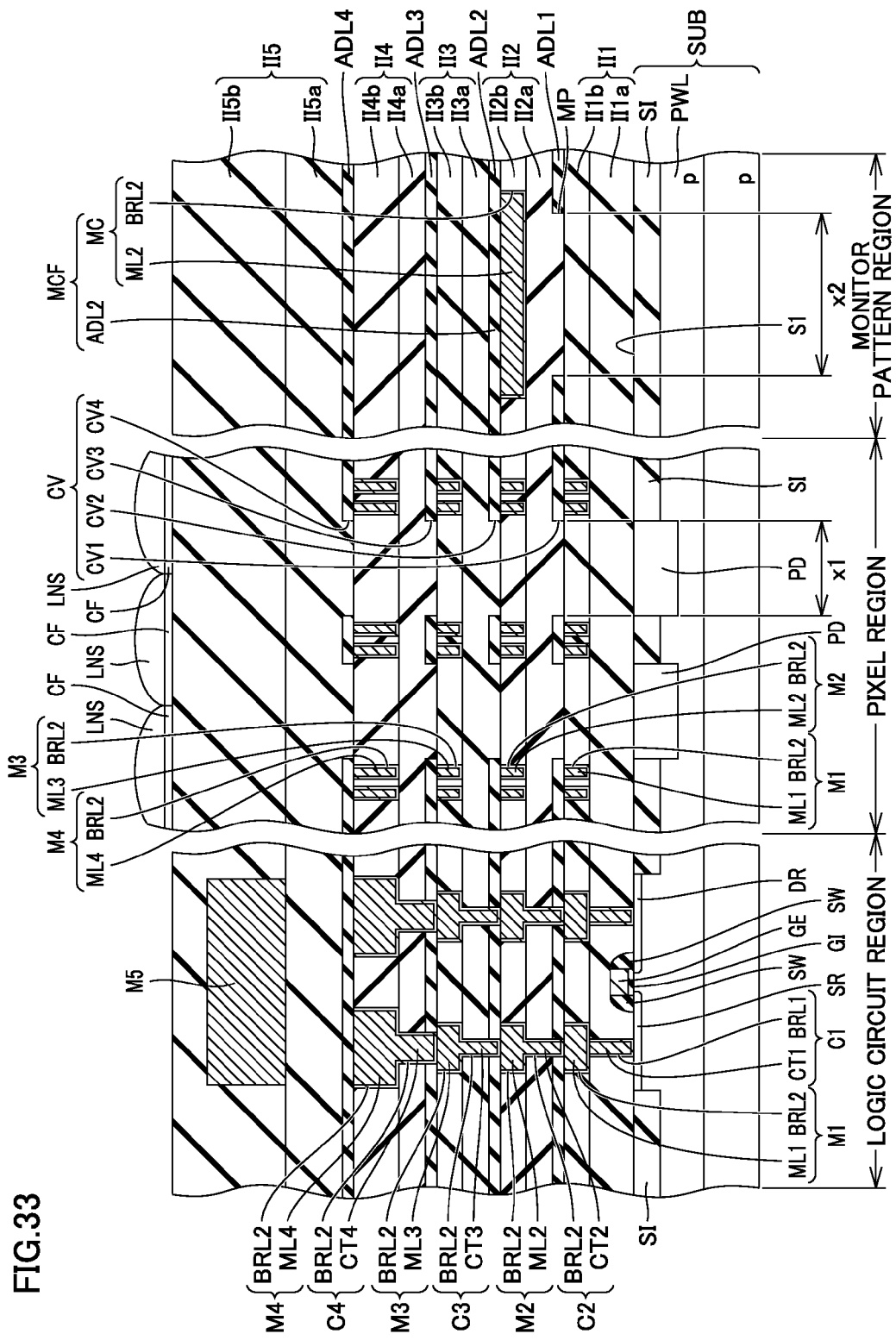
FIG. 33 is a schematic cross-sectional view showing a configuration of a semiconductor device according to a second embodiment.
Figure 34A:
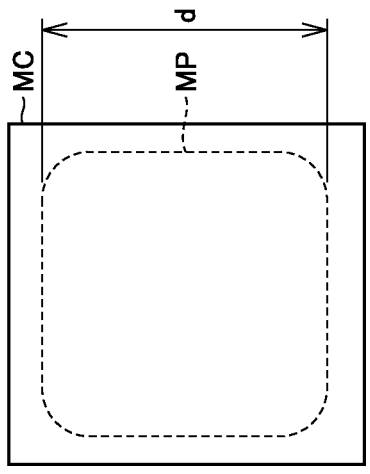
FIG. 34A to FIG. 34E show first to fifth examples in a two-dimensional manner in which the mark wiring layer having a rectangular shape and the monitor pattern having a shape other than a rectangular shape overlap each other in the second embodiment.
Figure 34B:
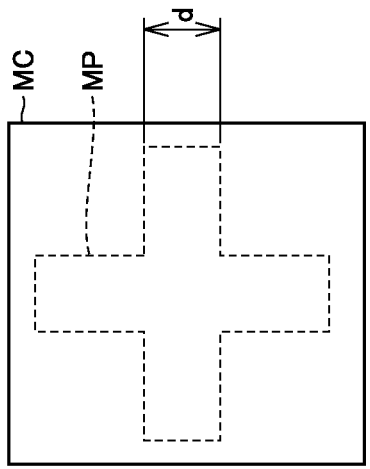
Figure 34C:
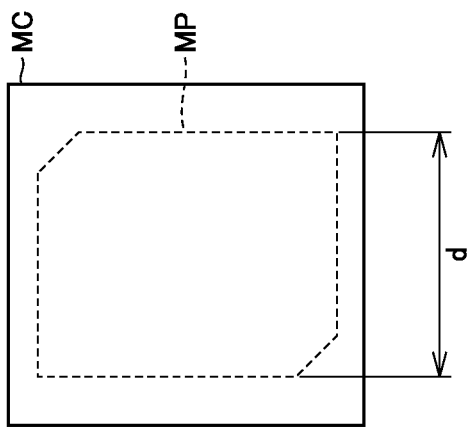
Figure 34D:
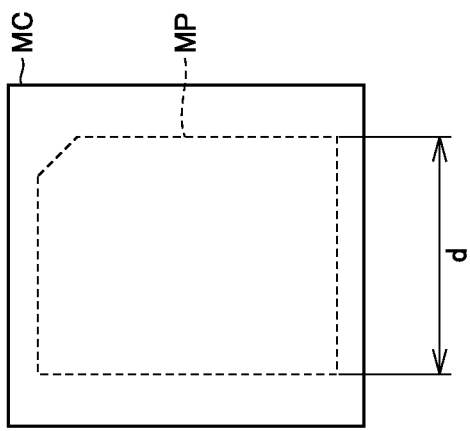
Figure 34E:
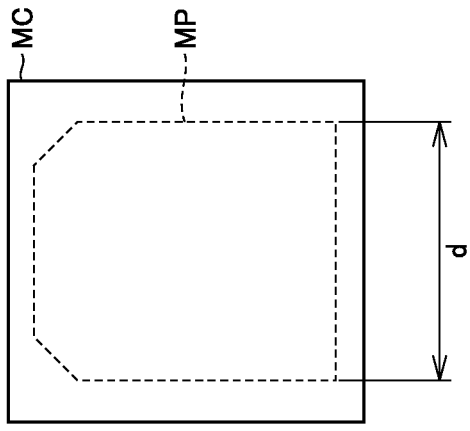
Figure 35B:
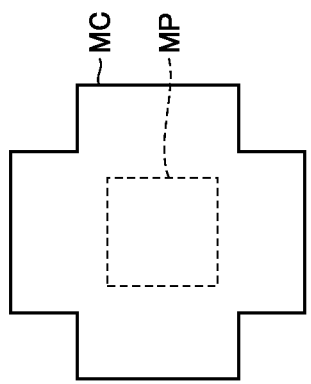
FIG. 35A to FIG. 35E show first to fifth examples in a two-dimensional manner in which the mark wiring layer having a shape other than a rectangular shape and the monitor pattern having a rectangular shape overlap each other in the second embodiment.
Figure 35A:
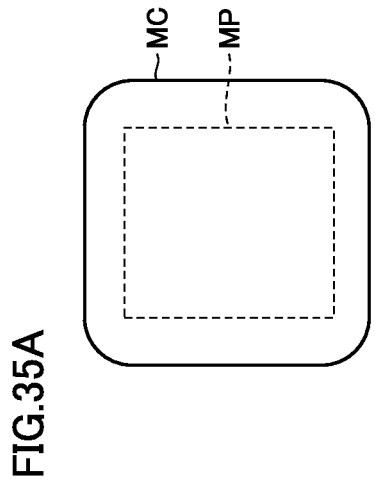
Figure 35E:
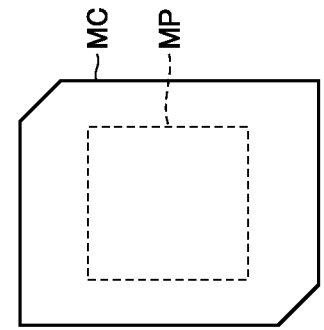
Figure 35D:
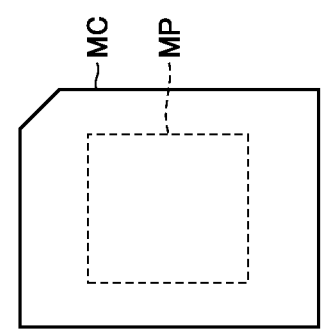
Figure 35C:
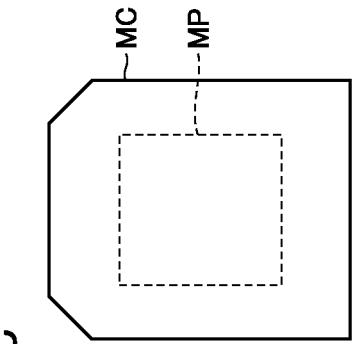
Figure 36B:
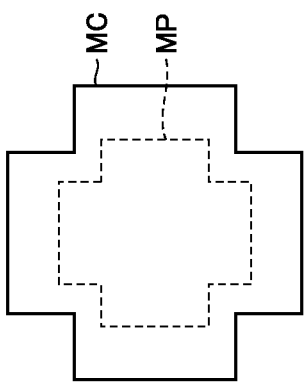
FIG. 36A to FIG. 36E show first to fifth examples in a two-dimensional manner in which the mark wiring layer and the monitor pattern both having a shape other than a rectangular shape overlap each other in the second embodiment.
Figure 36A:
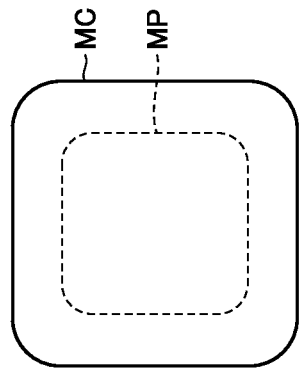
Figure 36E:
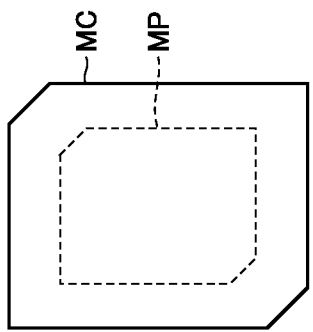
Figure 36D:
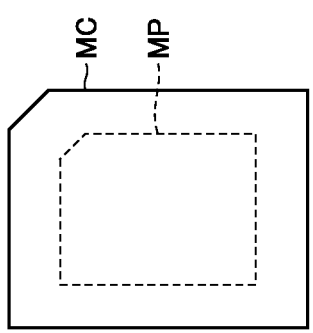
Figure 36C:
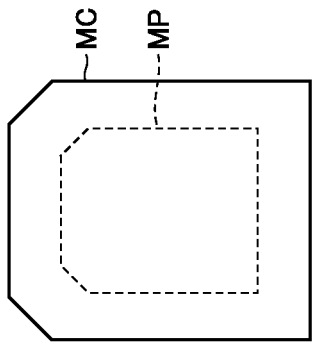

Referring to FIG. 33, an image sensor as a semiconductor device in the present embodiment basically has a similar configuration to the image sensor as a semiconductor device in the first embodiment shown in FIG. 5. Also in the present embodiment, the manners shown in the figures are basically those in a wafer state before dicing.

In the present embodiment, however, the area of mark wiring layer MC in a two-dimensional view is larger than the area of monitor pattern MP in a two-dimensional view. Mark wiring layer MC is arranged so as to include the entire region overlapped with monitor pattern MP in a two-dimensional view (that is, such that mark wiring layer MC is overlapped with the entire monitor pattern MP in a two-dimensional view). In this respect, the present embodiment differs from the first embodiment shown in FIG. 6A in which monitor pattern MP and mark wiring layer MC have the same size and shape in a two-dimensional view and they entirely overlap each other.

In summary, the area in a two-dimensional view of mark wiring layer MC in the monitor pattern region in the present embodiment is (formed to be) equal to or larger than the area in a two-dimensional view of monitor pattern MP. It is noted that, also in the present embodiment, mark wiring layer MC is preferably arranged to completely overlap the entire monitor pattern MP immediately below, in a two-dimensional view. Also in this case, the same operational effects as in the first embodiment can be achieved.

Therefore, in the present embodiment, mark wiring layer MC and monitor pattern MP may have different shapes. Referring to FIG. 34A to FIG. 34E, for example, as shown in those figures, mark wiring layer MC shown by the solid line in the figures may have a rectangular two-dimensional shape, such as a square, and monitor pattern MP having a two-dimensional shape other than a rectangular shape as shown by the dotted line in the figures may be formed to completely fit in mark wiring layer MC. Monitor pattern MP has a two-dimensional shape such as a rectangular shape with rounded corners in FIG. 34A, the shape of a cross in FIG. 34B, and a rectangular shape with one or two corners diagonally cut in FIG. 34C, FIG. 34D, and FIG. 34E.

Also in the present embodiment, the smallest value d of the dimensions of each monitor pattern MP is (formed to be) larger than the smallest value of the dimensions of the first opening region immediately above photodiode PD in the diffusion barrier film in which monitor pattern MP is formed.

Referring to FIG. 35A to FIG. 35E, for example, as shown in those figures, mark wiring layer MC shown by the solid line in the figures may have a two-dimensional shape other than a rectangular shape, and monitor pattern MP having an approximately square two-dimensional shape shown by the dotted line in the figures may be formed so as to completely fit in mark wiring layer MC. Mark wiring layer MC has a two-dimensional shape such as a rectangular shape with rounded corners in FIG. 35A, the shape of a cross in FIG. 35B, and a rectangular shape with one or two corners diagonally cut in FIG. 35C, FIG. 35D, and FIG. 35E.

Referring to FIG. 36A to FIG. 36E, for example, as shown in those figures, mark wiring layer MC shown by the solid line in the figures and monitor pattern MP shown by the dotted line in the figures both may have a two-dimensional shape other than a square shape. They have a two-dimensional shape such as a rectangular shape with rounded corners in FIG. 36A, the shape of a cross in FIG. 36B, and a rectangular shape with one or two corners diagonally cut in FIG. 36C, FIG. 36D, and FIG. 36E.

Figure 37A:
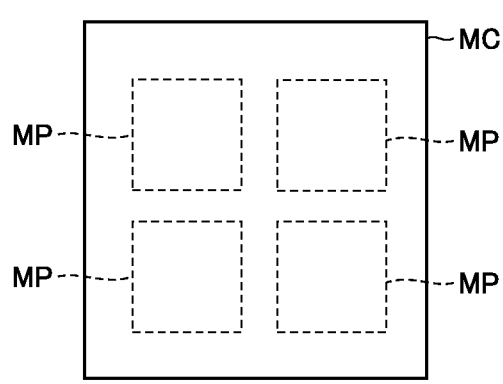
FIG. 37A and FIG. 37B show a first example (A), different from FIG. 34A to FIG. 36E, in a two-dimensional manner in which the mark wiring layer and the monitor patterns overlap each other, and a second example (B) in this two-dimensional manner, according to the second embodiment.
Figure 37B:
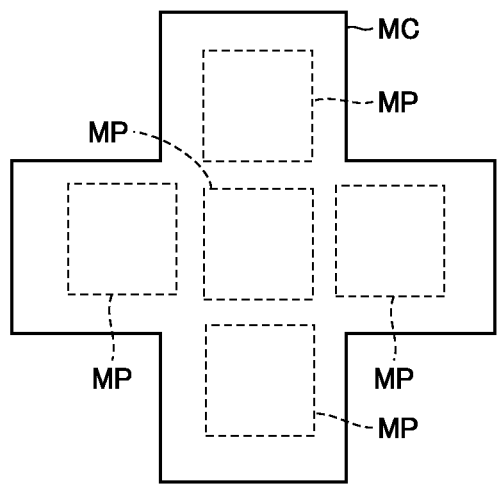

Referring to FIG. 37A and FIG. 37B, for example, as shown in those figures, a plurality of monitor patterns MP shown by the dotted line in the figures may be arranged spaced apart from each other so as to two-dimensionally overlap mark wiring layer MC shown by the solid line in the figures. Mark wiring layer MC and monitor patterns MP both have a rectangular shape in FIG. 37A. Mark wiring layer MC has the shape of a cross and monitor patterns MP each have a rectangular shape in FIG. 37B.

Third Embodiment

Figure 38:
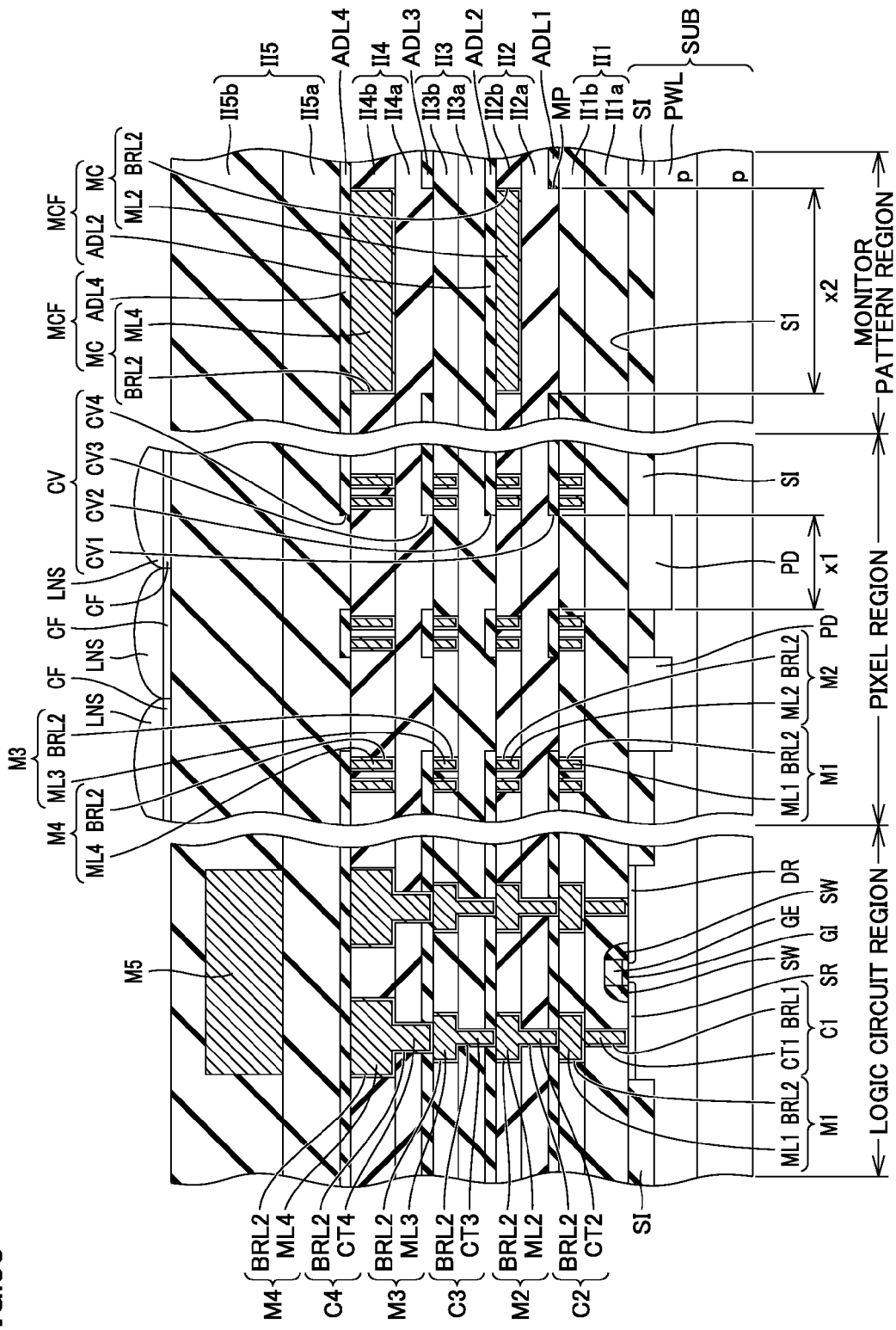
FIG. 38 is a schematic cross-sectional view showing a configuration of a semiconductor device according to a third embodiment.

Referring to FIG. 38, an image sensor as a semiconductor device in the present embodiment basically has a similar configuration to the image sensor as a semiconductor device in the first embodiment shown in FIG. 5. In the present embodiment, however, monitor pattern MP is formed also in diffusion barrier film ADL3 in addition to diffusion barrier film ADL1.

Mark wiring layer MC including metal film ML2 and barrier metal BRL2 is arranged immediately above monitor pattern MP of diffusion barrier film ADL1, and mark wiring layer region MCF is arranged together with diffusion barrier film ADL2 arranged in contact with the upper surface of mark wiring layer MC. Similarly, monitor pattern MP as a second opening region different from opening region CV3 (first opening region) formed immediately above photodiode PD is formed in diffusion barrier film ADL3, for example, in the monitor pattern region in the scribe line region.

Mark wiring layer MC including metal film ML4 and barrier metal BRL2 is arranged immediately above monitor pattern MP formed in diffusion barrier film ADL3, and mark wiring layer region MCF is arranged together with diffusion barrier film ADL4 arranged in contact with the upper surface of mark wiring layer MC.

As described above, in the present embodiment, a plurality of monitor patterns MP, which are the second opening regions in the diffusion barrier films in the monitor pattern region, are formed so as to be stacked on each other (in line in the vertical direction of the stack in FIG. 38). Mark wiring layer MC is formed immediately above each of a plurality of stacked monitor patterns MP.

That is, in the present embodiment, a plurality of monitor patterns MP are formed in line in the vertical direction of the stack in FIG. 38 (in a plurality of diffusion barrier films), and a plurality of mark wiring layers MC are formed.

In FIG. 38, a plurality of monitor patterns MP are arranged at a position where they completely overlap each other in a two-dimensional view, and a plurality of mark wiring layers MC are arranged so as to completely overlap each other in a two-dimensional view. They may be arranged at a position where they completely overlap each other in a two-dimensional as described above or may not be arranged so as to be overlapped in a two-dimensional view. That is, a plurality of monitor patterns MP may have different two-dimensional shapes and sizes, and a plurality of mark wiring layers MC may have different two-dimensional shapes and sizes, similarly.

The other configuration is generally the same as the configuration of the first embodiment. The same elements are denoted with the same reference signs and a description thereof is not repeated.

Next, the operational effects of the present embodiment will be described.

For example, when due to the formation of monitor pattern MP, depression DP (see FIG. 27 to FIG. 31) is inevitably left in the overlying interlayer insulating film, if monitor pattern MP is to be formed in the overlying layer, it is necessary to form it at a two-dimensional position that is intentionally different from the position where the underlying monitor pattern MP is formed. In the present embodiment, however, mark wiring layer MC immediately above monitor pattern MP formed in diffusion barrier film ADL1 ensures the flatness of the top surface of interlayer insulating film II2. Therefore, even when monitor pattern MP is further formed above interlayer insulating film II2, it is not necessary to make a design so as to avoid the position where the underlying monitor pattern MP is formed, thereby increasing the flexibility of design. Accordingly, a plurality of monitor patterns MP and mark wiring layers MC can be formed at a position where they completely overlap (almost completely same position) in a two-dimensional view.

Fourth Embodiment

First of all, a semiconductor device in a wafer state in the present embodiment will be described.

Figure 39:
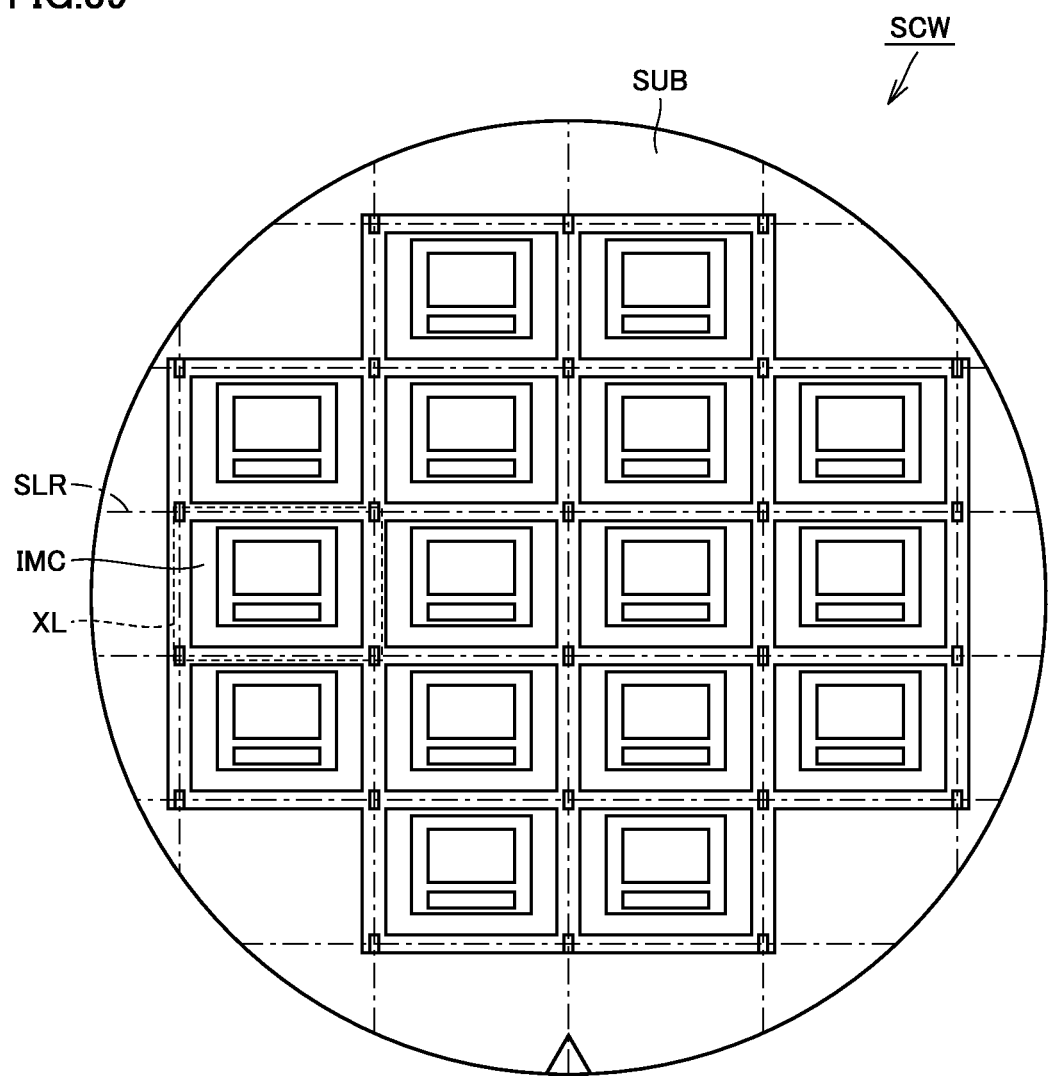
FIG. 39 is a schematic cross-sectional view showing a semiconductor device in a wafer state according to a fourth embodiment.
Figure 40:
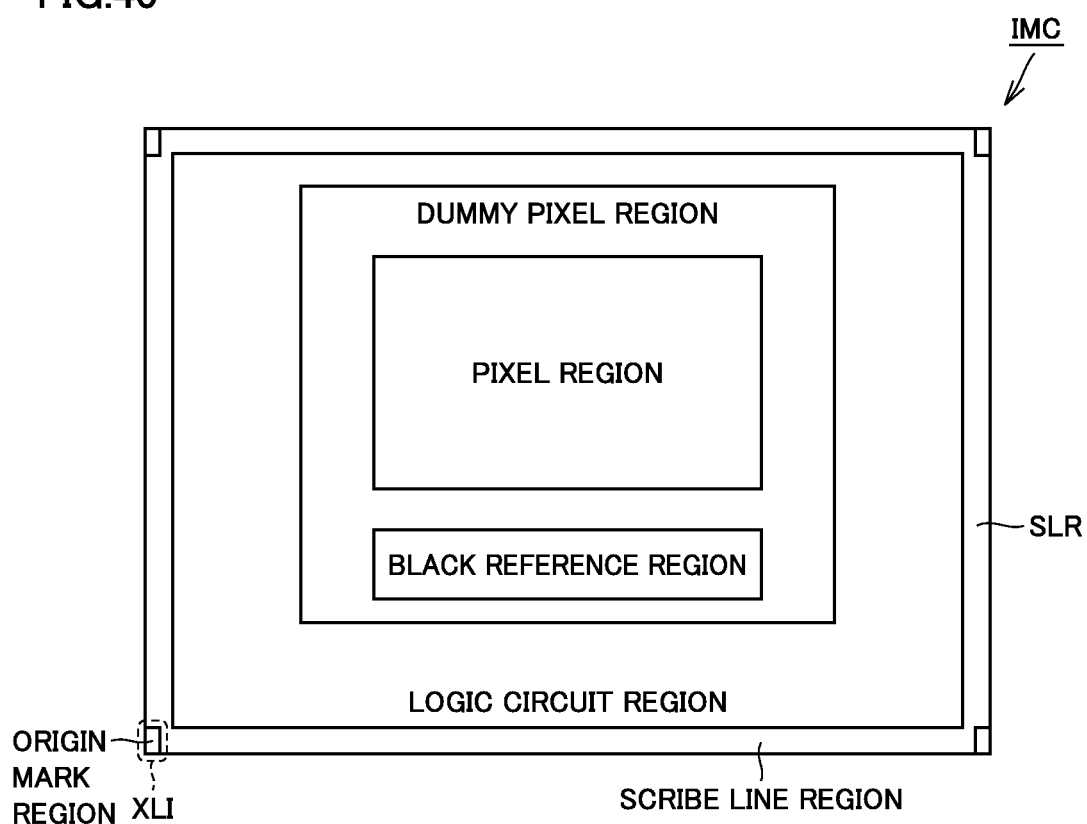
FIG. 40 is a schematic enlarged plan view of a region XL surrounded by the dotted line in FIG. 39.

Referring to FIG. 39 and FIG. 40, the configuration of a semiconductor chip in a wafer state and in a divided state in the present embodiment is basically similar to that in FIG. 1 and FIG. 2, except that an origin mark region is formed in place of the monitor pattern region in scribe line region SLR. The origin mark refers to a mark to be used for recognizing a reference (origin) at the same position throughout the steps, for example, used when registration between patterns formed in the step of forming a semiconductor device is accurately performed. This pattern may be formed as a region where a mark for recognizing the origin position of the semiconductor wafer is formed in a manufacturing process.

It is therefore requested that the origin mark not to be covered with, in particular, a metal film (for example, such as metal film ML1 that constitutes wiring layer M1) such as copper with a high light-blocking characteristic in each step in order to be visibly recognized from above in each step after being formed in the lower layer in the initial step.

Figure 41:
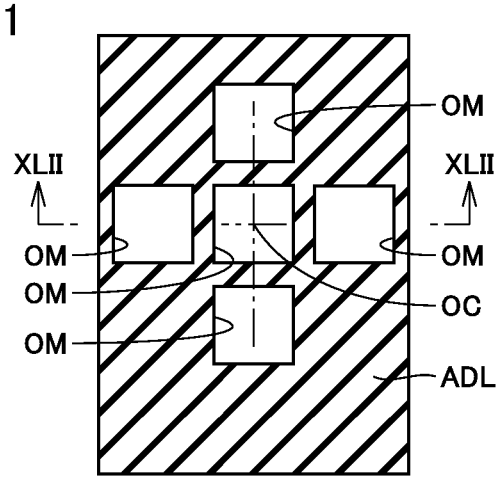
FIG. 41 is a schematic enlarged plan view of a region XLI surrounded by the dotted line in FIG. 40.
Figure 42:
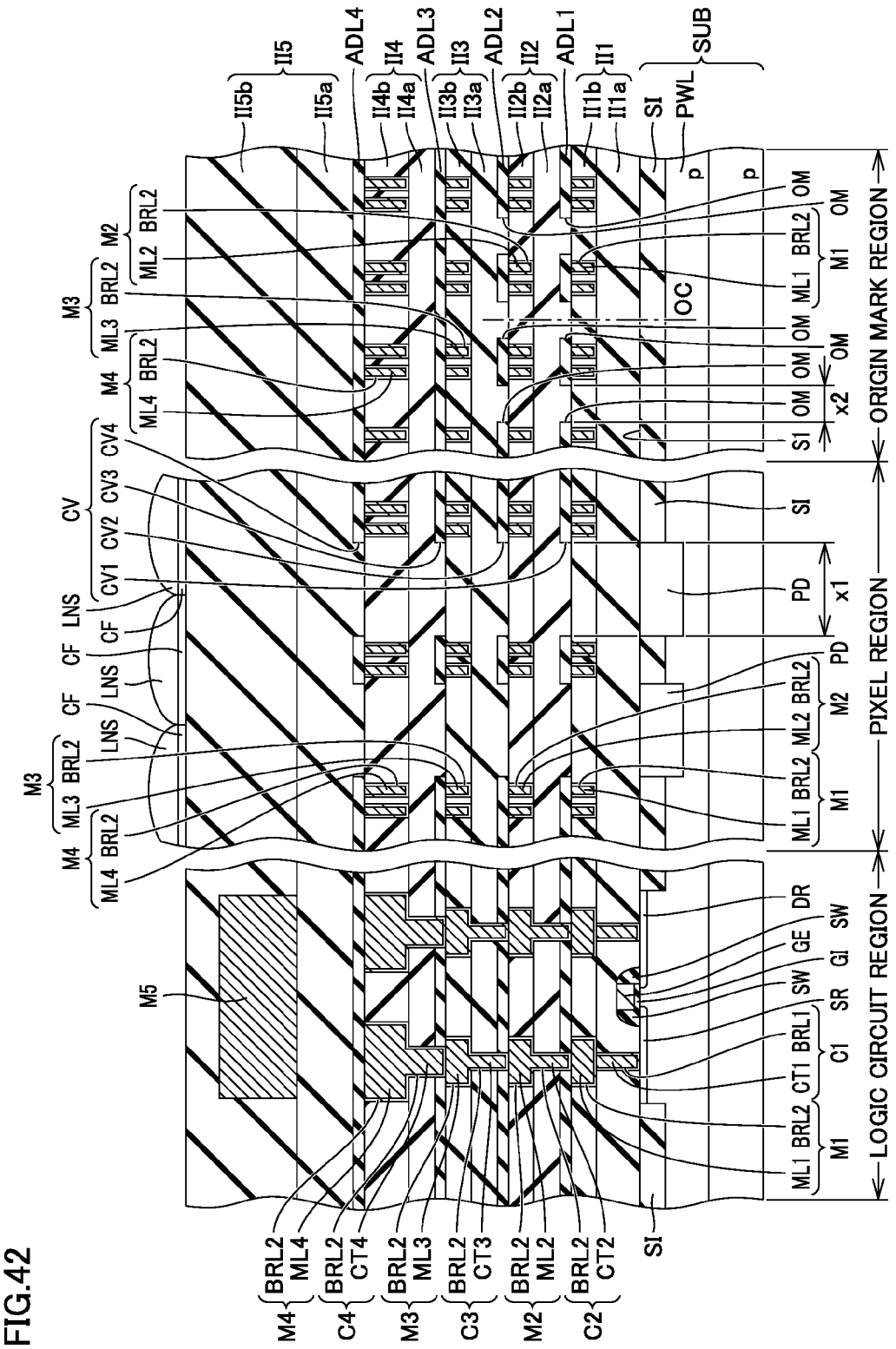
FIG. 42 is a schematic cross-sectional view showing a configuration of the semiconductor device according to the fourth embodiment including a portion along the line XLII-XLII in FIG. 41.

Referring to FIG. 41 and FIG. 42, the present embodiment is configured such that the portion above origin OC at the position indicated by the origin marks is not covered with metal films ML1 to ML4 (wiring layers M1 to M4).

In FIG. 41 and FIG. 42, neither wiring layer M1 nor M2 is arranged in the origin mark region. Accordingly, origin mark OM is formed as a second opening region in each of diffusion barrier films ADL1, ADL2.

Three origin marks OM are arranged in the horizontal direction in the origin mark region in FIG. 41 and FIG. 42 and in the vertical direction in FIG. 41. In total, five are arranged spaced apart from each other to form the shape of a cross in a macroscopic view. Each origin mark OM has, for example, a rectangular shape (approximately square shape) in a two-dimensional view.

The origin mark region is a region other than the semiconductor circuit region. In FIG. 42, wiring layers M1 to M4 having the same manner as wiring layers M1 to M4 formed in the pixel region are formed in all of interlayer insulating films II1 to II4. In the origin mark region in FIG. 42, all of wiring layers M1 to M4 are arranged at the same position (so as to overlap each other) in a two-dimensional view. Diffusion barrier films ADL1 to ADL4 are similarly arranged at the same position (so as to overlap each other) in a two-dimensional view. The arrangement of wiring layers M1 to M4, for example, shown in FIG. 42 is shown only by way of example and the embodiment is not limited thereto. In particular, wiring layers M1 to M4 in the origin mark region other than the region overlapped in a two-dimensional view with other than origin marks OM including origin OC are arranged in any manner.

Although diffusion barrier films ADL3, ADL4 are formed in the entire origin mark region in FIG. 42, they may be formed in any manner. For example, an opening region as origin mark OM may be formed even in part of diffusion barrier films ADL3, ADL4 (for example, immediately above origin marks OM in diffusion barrier films ADL1, ADL2). Alternatively, diffusion barrier films ADL3, ADL4 may not be formed at all in the origin mark region. For example, an origin mark may be formed as the second opening region only in one of diffusion barrier films ADL1 to ADL4.

In the present embodiment, as shown in FIG. 42, the dimension x2 in the direction along main surface S1 of origin mark OM in diffusion barrier films ADL1, ADL2 as the second opening region is basically equal to or smaller than the dimension x1 in the direction along main surface S1 of opening region CV1 in diffusion barrier film ADL1 as a first opening region. More specifically, the smallest value of the dimensions in the direction along main surface S1 (in a two-dimensional view) of origin mark OM is equal to or smaller than the smallest value H1, V2 (see FIG. 8, FIG. 9) of the dimensions in a two-dimensional view of first opening region CV1 in diffusion barrier film ADL1 formed immediately above photodiode PD in the pixel region. In this respect, the present embodiment differs from the first to third embodiments in which the dimension x2 (monitor pattern) is larger than the dimension x1.

As described above, in order to ensure the visibility of origin mark OM in the present embodiment throughout the steps, mark wiring layer MC as in the first to third embodiments is not formed immediately above it. The present embodiment differs from the first to third embodiments in this respect.

The other configuration of the present embodiment is generally the same as the configuration of the first embodiment. The same elements are denoted with the same reference signs and a description thereof is not repeated.

The manner of the monitor pattern region in FIG. 42 described above and the plan view in FIG. 41 shows the monitor pattern region as a whole in a wafer state before dicing in FIG. 39. Since the monitor pattern region of the semiconductor chip after dicing as shown in FIG. 40 is formed at the edge portion of the chip and partially removed by cutting, only part of the manner shown in FIG. 41 and FIG. 42 is left (for example, origin OC is arranged at the position corresponding to the corner of the semiconductor chip, and four divided parts of the configuration in FIG. 41 are formed at four corners of chip region IMC in FIG. 40).

A method of manufacturing the semiconductor device in the present embodiment shown in FIG. 42 will now be described with reference to FIG. 43 to FIG. 49.

Figure 43:
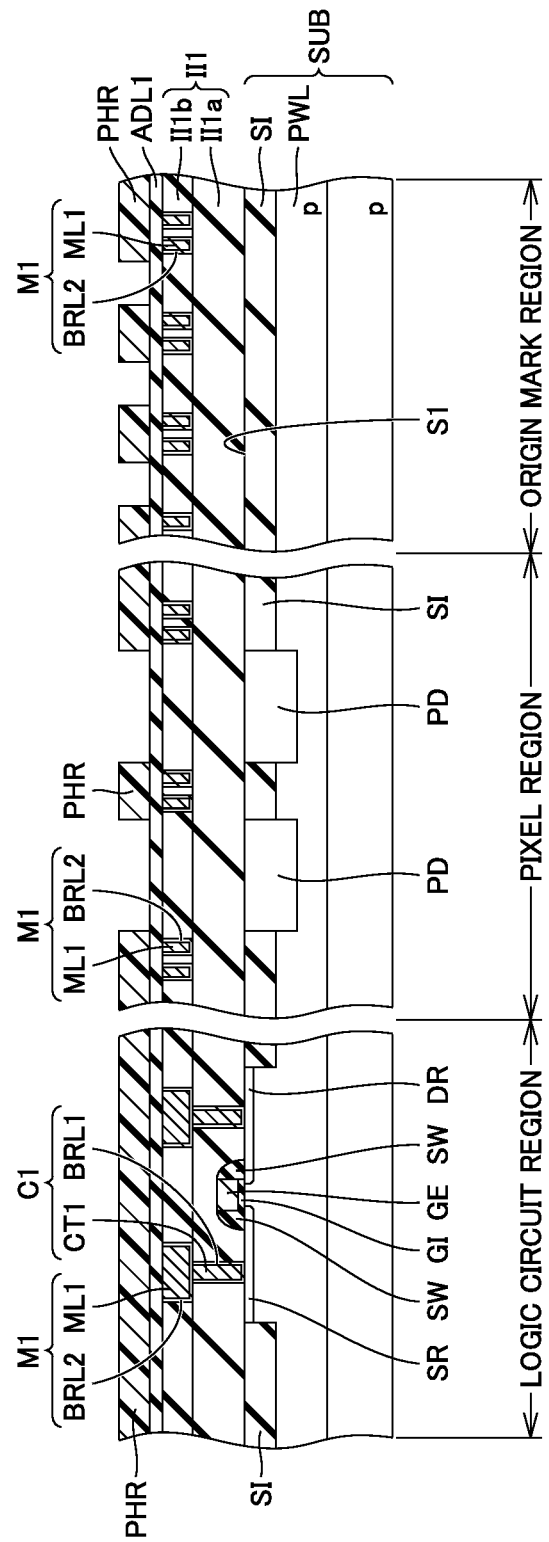
FIG. 43 is a schematic cross-sectional view showing a first step of a method of manufacturing a semiconductor device in the fourth embodiment.

Referring to FIG. 43, basically the same processes as in FIG. 10 to FIG. 16 in the first embodiment are performed. However, the present embodiment differs from the first embodiment in that wiring layer M1 is formed in the origin mark region as in the pixel region. Diffusion barrier film ADL1 is formed on interlayer insulating film II1$b$ so as to cover the upper surface of wiring layer M1, and a pattern of photoresist PHR is formed by general photolithography technique. The pattern of photoresist PHR is formed such that, for example, an opening is formed so as to include at least part of the region overlapped in a two-dimensional view with photodiode PD in the pixel region and, for example, an opening is formed in a region overlapped in a two-dimensional view with the region where origin mark OM is to be formed in the origin mark region.

Figure 44:
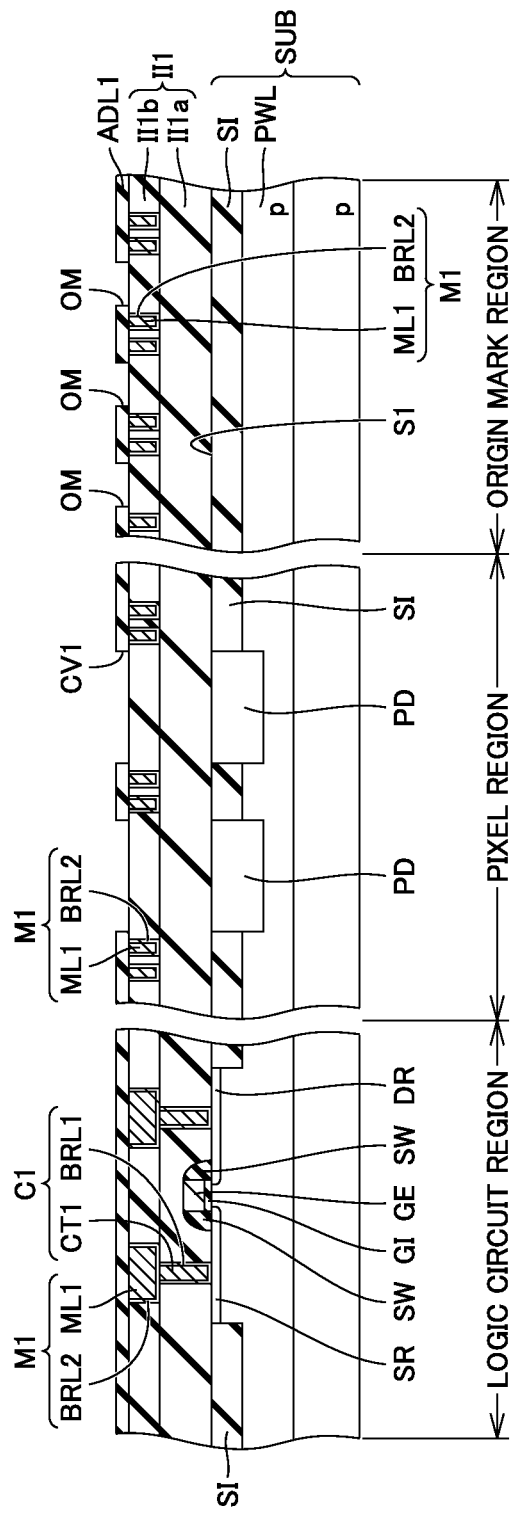
FIG. 44 is a schematic cross-sectional view showing a second step of the method of manufacturing a semiconductor device in the fourth embodiment.

Referring to FIG. 44, the same process as in the step in FIG. 17 is performed to form opening region CV1 and origin mark OM in diffusion barrier film ADL1. Here, the smallest value of the dimensions in a two-dimensional view of origin mark OM is formed to be equal to or smaller than the smallest value of the dimensions in a two-dimensional view of opening region CV1.

Figure 45:
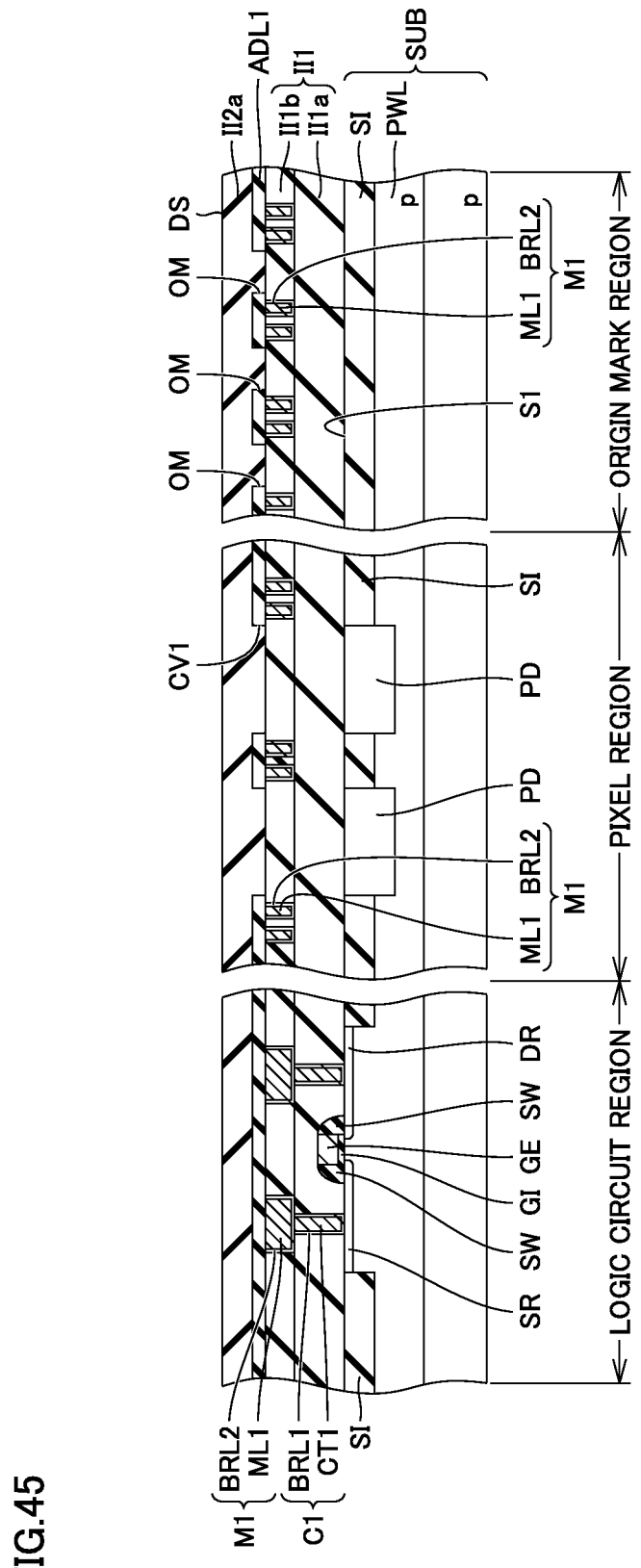
FIG. 45 is a schematic cross-sectional view showing a third step of a method of manufacturing a semiconductor device in the fourth embodiment.

Referring to FIG. 45, the same processes as in FIG. 18 and FIG. 19 are performed. Opening regions in diffusion barrier film ADL1 are thus formed such that the smallest value of the dimensions of the opening region (in a two-dimensional view) in diffusion barrier film ADL1 in the origin mark region is equal to or smaller than the smallest value of the dimensions of the opening region (in a two-dimensional view) in diffusion barrier film ADL1 in the pixel region (semiconductor circuit region).

Figure 46:
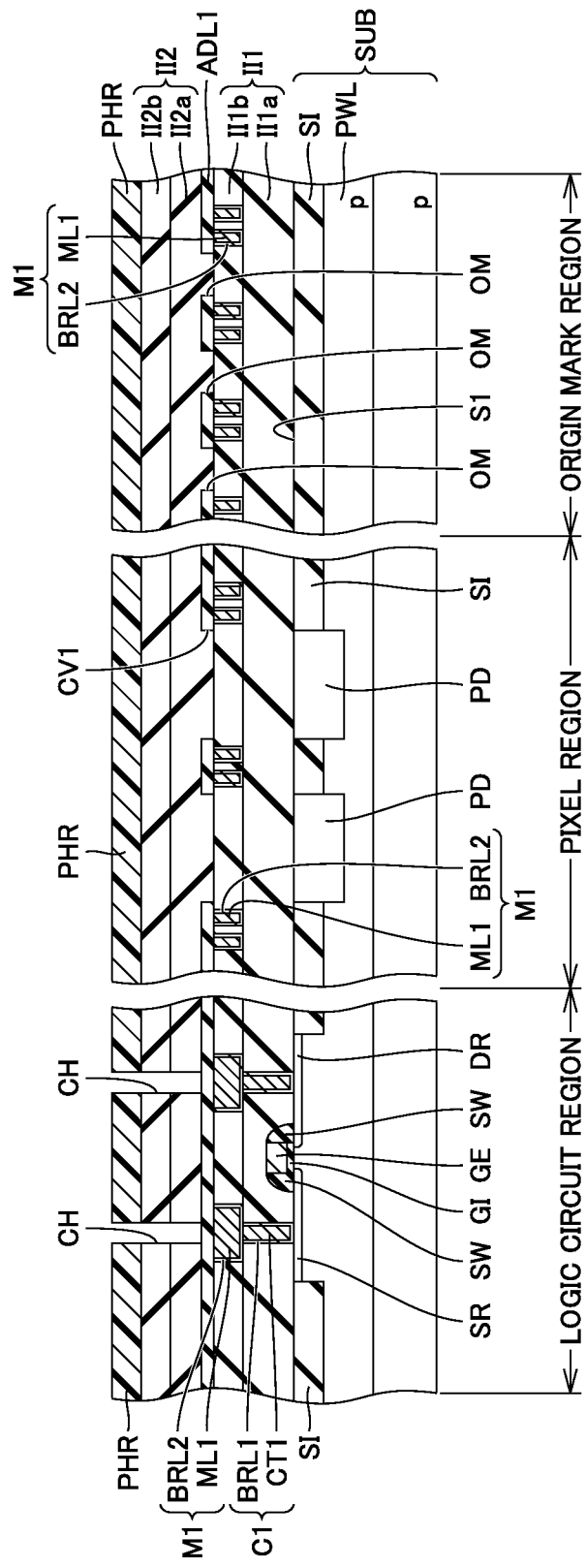
FIG. 46 is a schematic cross-sectional view showing a fourth step of the method of manufacturing a semiconductor device in the fourth embodiment.
Figure 47:
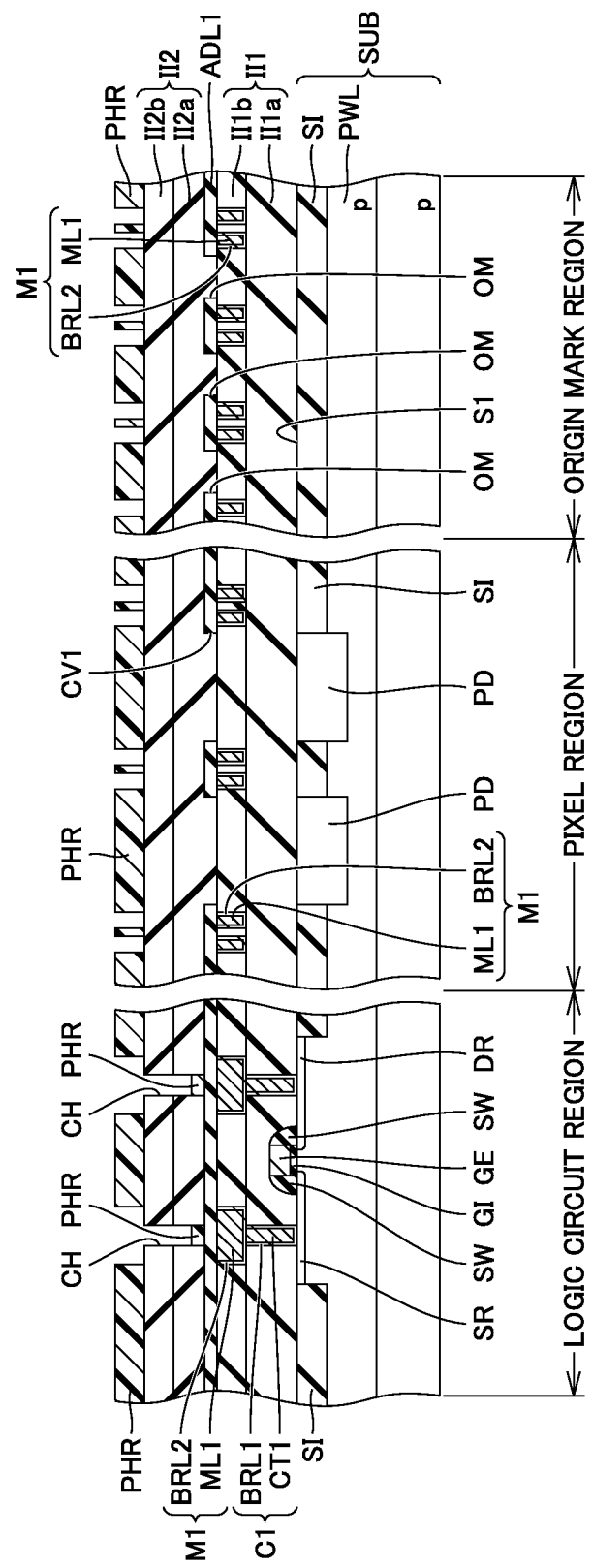
FIG. 47 is a schematic cross-sectional view showing a fifth step of the method of manufacturing the semiconductor device in the fourth embodiment.
Figure 48:
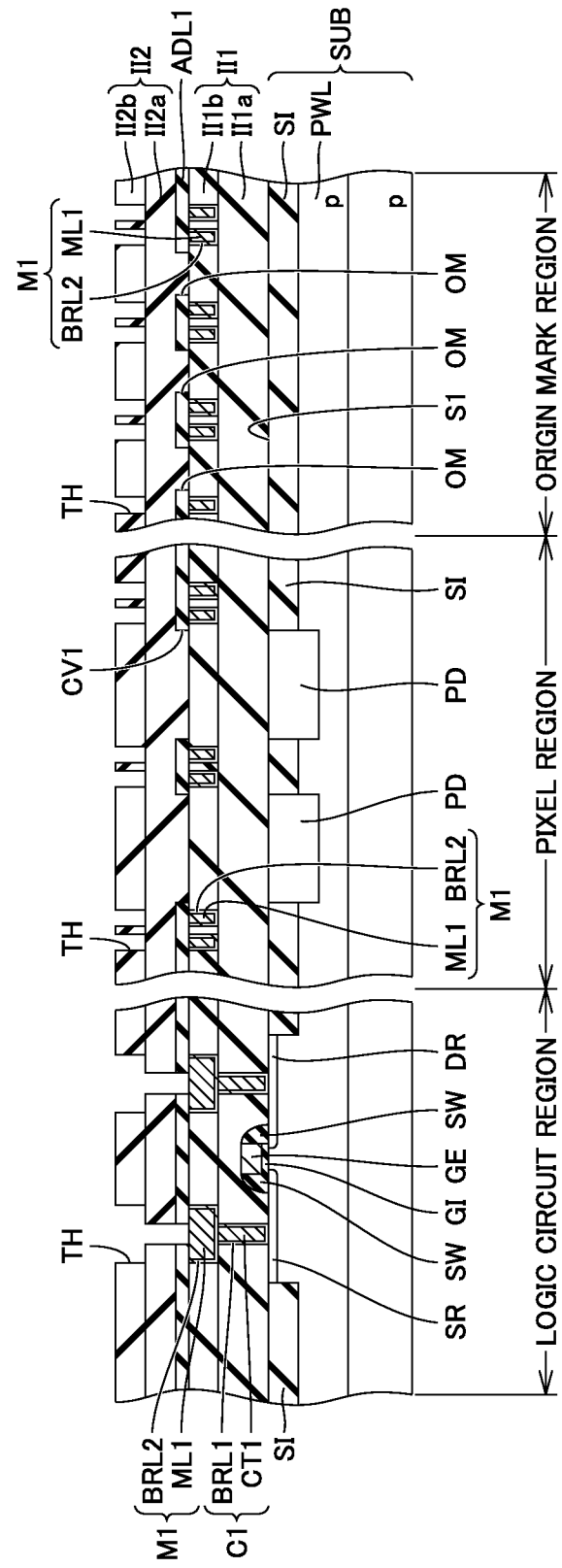
FIG. 48 is a schematic cross-sectional view showing a sixth step of the method of manufacturing a semiconductor device in the fourth embodiment.
Figure 49:
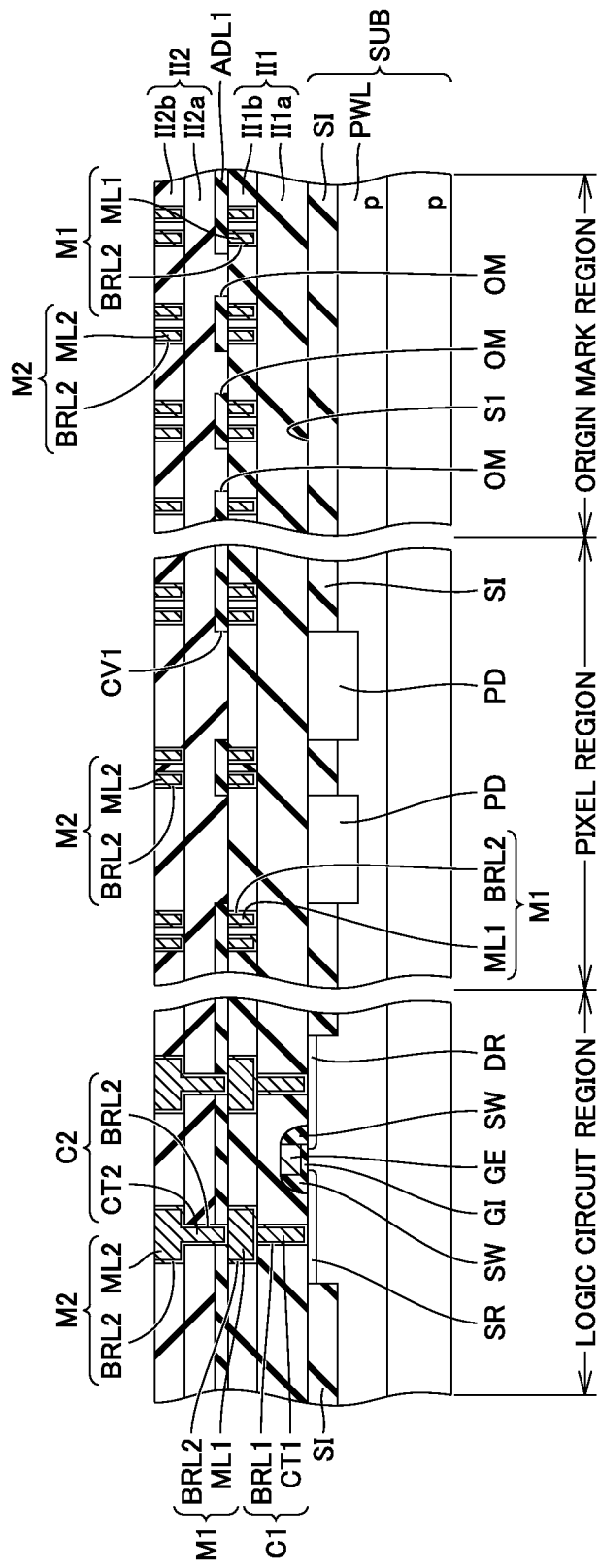
FIG. 49 is a schematic cross-sectional view showing a seventh step of the method of manufacturing a semiconductor device in the fourth embodiment.

Referring to FIG. 46, the same processes as in FIG. 20 and FIG. 21 are performed. Referring to FIG. 47 to FIG. 49, the same processes as in FIG. 22 to FIG. 24 are performed to form wiring layer M2 and contact region C2 in interlayer insulating film II2. Here, wiring layer M2 is patterned so that wiring layer M2 does not cover the portion immediately above origin mark OM formed in diffusion barrier film ADL1 (that is, wiring layer M2 is arranged in a region other than a region immediately above origin mark OM) in the origin mark region. The subsequent steps are the same as in the first embodiment and a description thereof is omitted. Part of the procedure not described above is basically the same as in the procedure described in the first embodiment.

The operational effects of the present embodiment will now be described.

As described above, in the present embodiment, since mark wiring layer MC cannot be formed immediately above origin mark OM as an opening region formed in diffusion barrier film ADL1, for example, it is requested that depression DP should not be formed in interlayer insulating film II2$a$ formed after the step in FIG. 45 and the surface of interlayer insulating film II2$b$ formed after the step in FIG. 46.

Therefore, the smallest value of the dimensions in a two-dimensional view of origin mark OM as an opening region formed in diffusion barrier film ADL1 is set equal to or smaller than the smallest value of the dimensions in a two-dimensional view of first opening region CV1 in diffusion barrier film ADL1 formed immediately above photodiode PD in the pixel region.

By doing so, the step formed, for example, in interlayer insulating film II2a immediately above origin mark OM, which has such a size and depth that can be removed by polishing, can be easily removed, in the same manner as the case where the first opening region formed immediately above photodiode PD in the pixel region has a small area and, therefore, a step formed in the overlying interlayer insulating film II2a, if any, can be removed by polishing. Even without mark wiring layer MC and the like formed immediately above origin mark OM, the possibility that depression DP and extra formation layer EXT are formed immediately above origin mark OM can be reduced. Therefore, a wiring layer and a contact region with high reliability can be formed by the dual damascene method using two-layer interlayer insulating films II2a, II2b.

Figure 50:
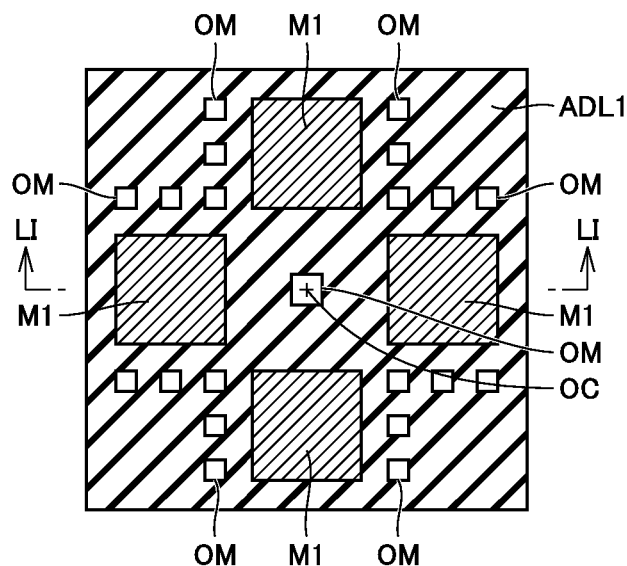
FIG. 50 is a schematic plan view showing a modification of the origin marks in the fourth embodiment.
Figure 51:
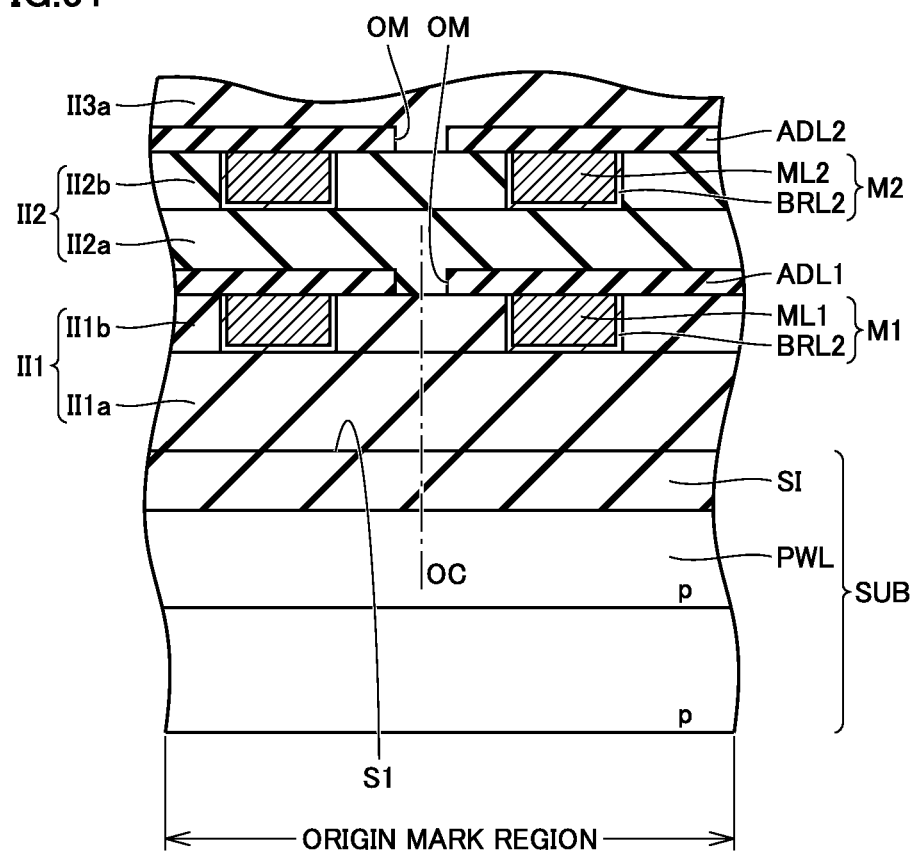
FIG. 51 is a schematic cross-sectional view showing the modification of the origin mark in the fourth embodiment in a portion along the line LI-LI in FIG. 50.

The visibility of origin OC can be ensured as long as (the same layers as) wiring layers M1 to M4 do not cover immediately above origin marks OM including origin OC. Therefore, the two-dimensional shape of origin mark OM in the present embodiment is not limited to the manner shown in FIG. 41 but may have the manner, for example, as shown in FIG. 50 and FIG. 51. In FIG. 50, only wiring layer M1, diffusion barrier film ADL1, and origin marks OM are extracted from FIG. 51.

In the example described above, origin mark OM is arranged in the scribe line region. However, referring to FIG. 52, origin mark OM may be formed in, for example, the logic circuit region in the semiconductor circuit region. Also in this case, the same effects as when monitor pattern MP is formed in the scribe line region can be achieved. Although not shown, origin mark OM may be formed as the second opening region different from first opening region CV1 in a region other than the region where first opening region CV1 is formed, in the pixel region in the semiconductor circuit region.

Figure 52:
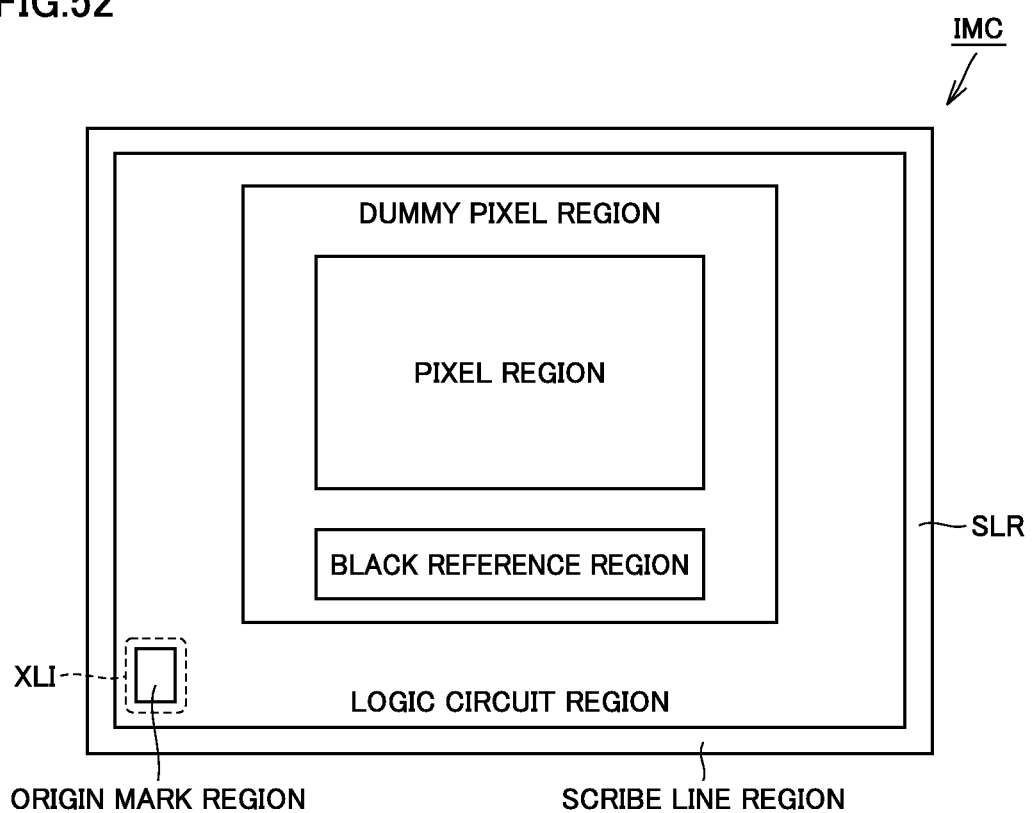
FIG. 52 is a schematic enlarged cross-sectional view showing a modification to the manner shown in FIG. 40 in the fourth embodiment.

When origin mark OM is formed in the semiconductor circuit region as in FIG. 52, unlike the case above, original mark OM is not cut by dicing. Therefore, the original mark region shown in FIG. 41, FIG. 42 and subsequent figures is left as a whole both in a wafer state shown in FIG. 1 and in a semiconductor chip state after division as shown in FIG. 52.

Fifth Embodiment

The following manners may be used in the fourth embodiment. Also in those cases, the same operational effects as in the fourth embodiment can basically be achieved. The manners shown in the figures are basically the manners in a wafer state before dicing.

Figure 53:
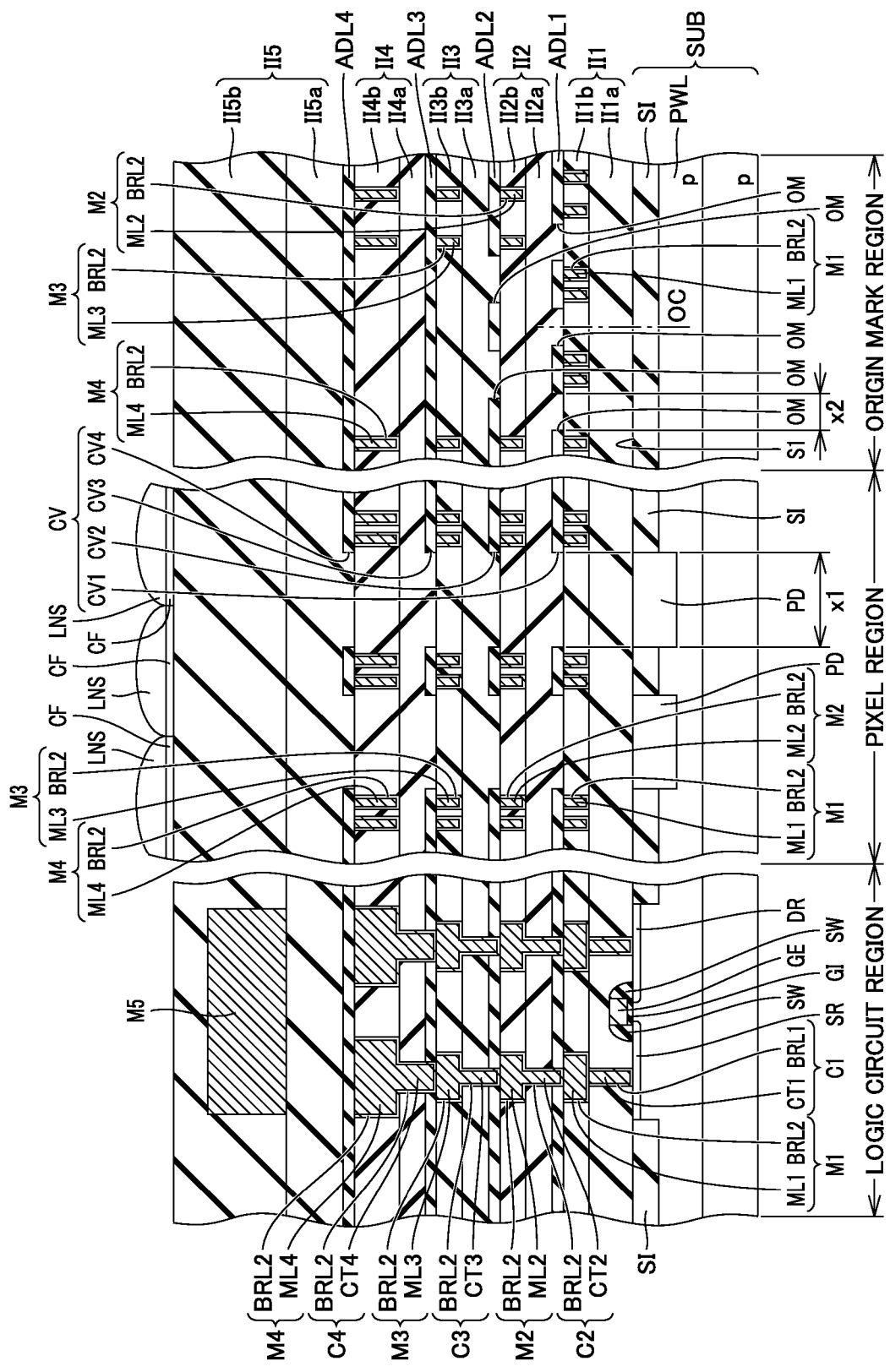
FIG. 53 is a schematic cross-sectional view showing a configuration of a semiconductor device according to a fifth embodiment.

Referring first to FIG. 53, an image sensor as a semiconductor device in the present embodiment basically has a similar configuration to the image sensor as a semiconductor device in the fourth embodiment shown in FIG. 42. In the present embodiment, however, diffusion barrier film ADL2 is arranged immediately above origin marks OM including origin OC formed in diffusion barrier film ADL1, and wiring layer M2 is not arranged immediately below it. In this respect, the present embodiment differs from the fourth embodiment in which diffusion barrier film ADL1 and diffusion barrier film ADL2 overlap each other in a two-dimensional view in the origin mark region.

Figure 54:
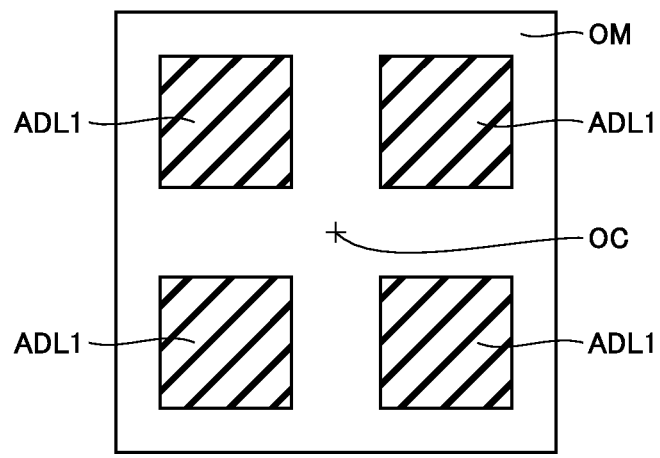
FIG. 54 is a schematic plan view showing a first modification of the arrangement manner of the origin and the origin marks in the fifth embodiment.

Referring to FIG. 54, origin mark OM is formed as an opening region in diffusion barrier film ADL1 such that it is sandwiched between the patterns of a plurality of diffusion barrier films ADL1, for example, each having a rectangular (approximately square) two-dimensional shape and arranged spaced apart from each other in a matrix. Origin OC may be arranged in origin mark OM.

Figure 55:
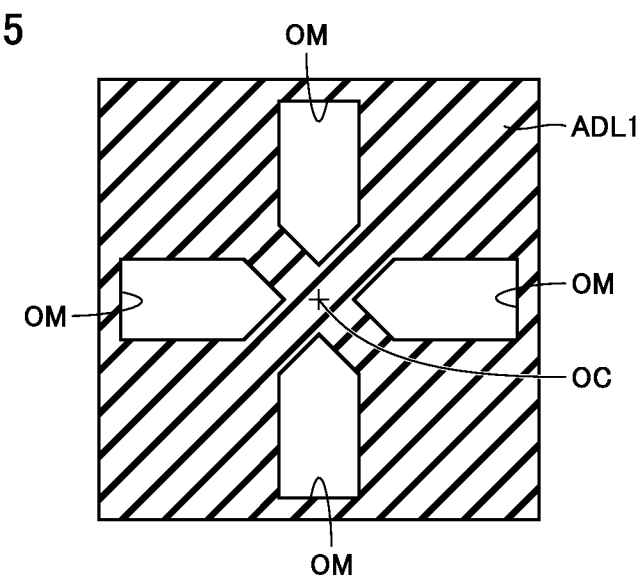
FIG. 55 is a schematic plan view showing a second modification of the arrangement manner of the origin and the origin marks in the fifth embodiment.

Referring to FIG. 55, a plurality of (for example, four) origin marks OM as opening regions formed in diffusion barrier film ADL1 each may have such a two-dimensional shape that is pointed toward one direction and the pointed portion may be oriented in the direction of origin OC. In this case, although origin OC is arranged in the region covered with diffusion barrier film ADL1, origin OC can be recognized to be arranged at the position where the directions in which the pointed portions of origin marks OM point intersect with each other. In the case of such a configuration, the position of origin OC may not necessarily have an opening in diffusion barrier film ADL1 but a copper-based metal film may be formed so as to overlap the region where diffusion barrier film ADL1 is formed.

Figure 56:
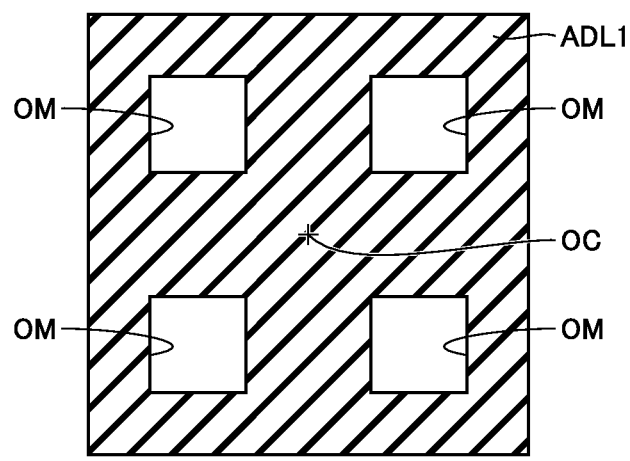
FIG. 56 is a schematic plan view showing a third modification of the arrangement manner of the origin and the origin marks in the fifth embodiment.

Referring to FIG. 56, a plurality of origin marks OM having a rectangular shape similar to diffusion barrier film ADL1 in FIG. 54 are arranged in a matrix as opening regions in diffusion barrier film ADL1. Origin OC is arranged at the center of the portion sandwiched between origin marks OM. Also in this case, as in FIG. 55, since the position of origin OC can be specified by the arrangement of a plurality of origin marks OM, origin OC may not be formed per se in the opening region in diffusion barrier film ADL1.

Figure 57:
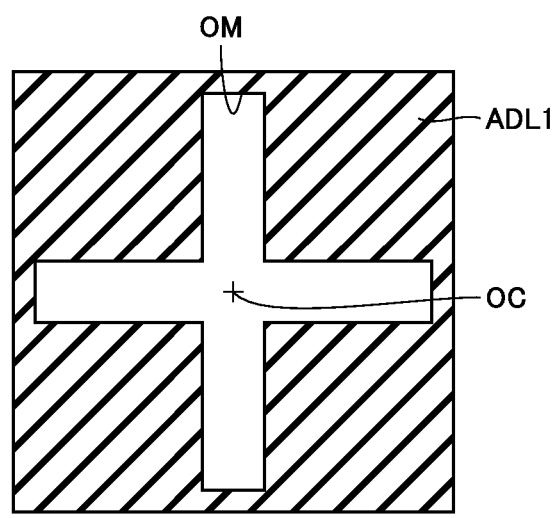
FIG. 57 is a schematic plan view showing a fourth modification of the arrangement manner of the origin and the origin mark in the fifth embodiment.

Referring to FIG. 57, origin mark OM as an opening region in diffusion barrier film ADL1 may have the shape of a cross, at the center of which origin OC may be arranged.

Figure 58B:
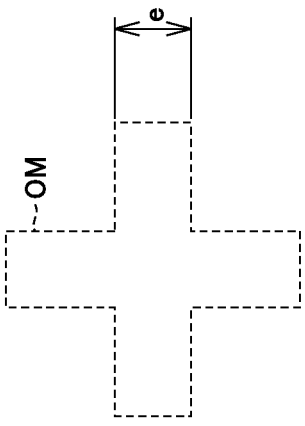
FIG. 58A to FIG. 58E are first to fifth examples of the two-dimensional manner including the origin mark alone in the second embodiment.
Figure 58A:
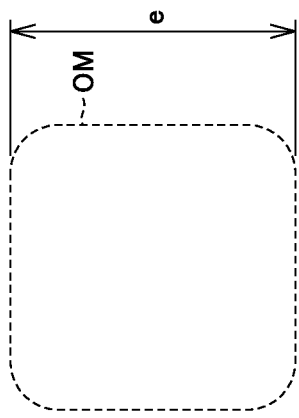
Figure 58E:
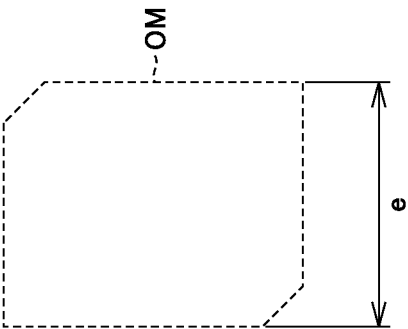
Figure 58D:
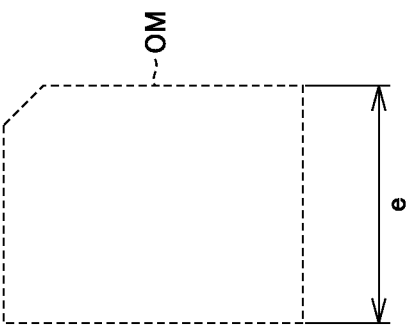
Figure 58C:
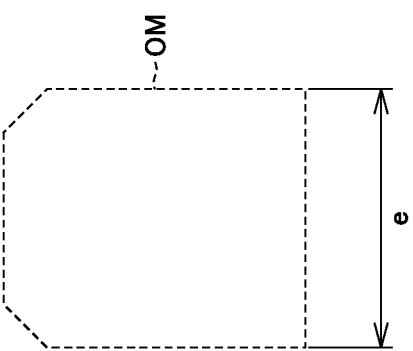

Referring to FIG. 58A to FIG. 58E, origin mark OM having origin OC arranged at the center as shown in FIG. 57 may have a two-dimensional shape other than a rectangular shape. Origin mark OM has a two-dimensional shape such as a rectangular shape with rounded corners in FIG. 58A, the shape of a cross in FIG. 58B, and a rectangular shape with one or two corners diagonally cut in FIG. 58C, FIG. 58D, and FIG. 58E. The shape of origin mark OM in FIG. 58B is approximately equal to the shape of origin mark OM in FIG. 57.

As described above, it is preferable that the smallest value of the dimensions of the opening region in the diffusion barrier film (which forms origin mark OM) in the origin mark region should be equal to or smaller than the smallest value of the dimensions of the opening region in the diffusion barrier film in the semiconductor circuit region. For example, origin mark OM shaped like a cross is formed as in FIG. 58B, so that origin OC can be reliably fitted in the inside of origin mark OM if origin mark OM is formed to be large to some extent, and the visibility of origin mark OM can be increased. In addition, the smallest value e of the dimensions of origin mark OM can be reduced.

For example, in FIG. 58A, FIG. 58C, FIG. 58D, FIG. 58E, the smallest value e of the dimensions appears as the dimension of the outline of the shape, whereas in FIG. 58B, the smallest value e of the dimensions is formed not as the outline of the shape but as the narrow width of each of the elongated regions that constitute a cross shape. Therefore, the dimensions of the outline are approximately the same in FIG. 58A to FIG. 58E, whereas the smallest value e of the dimensions is significantly smaller in FIG. 58B than the other shapes. Based on this, in particular, the formation of origin mark OM shaped like a cross as shown in FIG. 58B can increase the effect of suppressing formation of depression DP and extra formation layer EXT immediately above origin mark OM shown in the fourth embodiment.

In the foregoing embodiments, an opening region formed in the diffusion barrier film immediately above photodiode PD of the image sensor has been described. The present invention, however, is not limited thereto and can be applied to a semiconductor device not including an image sensor, in which an opening region is formed in the diffusion barrier film in the semiconductor circuit region. The technical features in the foregoing embodiments may be combined as appropriate to such a degree that does not cause technical contradictions.

The contents described in the embodiments are partially described below.

(1) In a method of manufacturing a semiconductor device, first, a copper-based first wiring layer is formed on a main surface of a semiconductor substrate. On the first wiring layer, a first diffusion barrier film is formed, which has a first opening region as an opening region in a semiconductor circuit region that is a partial region in a two-dimensional view and a second opening region as an opening region different from the first opening region in a two-dimensional view. An insulating film is formed so as to cover the first diffusion barrier film. The upper surface of the insulating film is polished and planarized to form a first interlayer insulating film. A second interlayer insulating film is formed so as to cover the first interlayer insulating film to form an interlayer insulating film. A copper-based second wiring layer and a connection portion connecting the first wiring layer with the second wiring layer are formed in the semiconductor circuit region so as to fill in the inside of a groove and a hole formed in the second interlayer insulating film. The first and second opening regions are formed in a region different from an opening region formed to allow the connection portion to pass through the first diffusion barrier film. The smallest value of the dimensions in a two-dimensional view of the second opening region is formed to be equal to or smaller than the smallest value of the dimensions in a two-dimensional view of the first opening region.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor substrate having a main surface;
   a first diffusion barrier film on the main surface of the semiconductor substrate;
   a connection portion connecting a copper-based first wiring layer arranged on the semiconductor substrate side of the first diffusion barrier film with a copper-based second wiring layer arranged on an opposite side to the semiconductor substrate side of the first diffusion barrier film;
   an interlayer insulating film covering the first diffusion barrier film,
   the first diffusion barrier film including a first opening region formed in a semiconductor circuit region that is a partial region in a two-dimensional view and a second opening region formed as an opening region different from the first opening region in a two-dimensional view,
   the first and second opening regions being formed in a region different from an opening region formed to allow the connection portion to pass through the first diffusion barrier film,
   the second wiring layer being formed so as to fill in a groove formed in the interlayer insulating film in the semiconductor circuit region;
   a mark wiring layer arranged immediately above the second opening region as the same layer as the second wiring layer; and
   a second diffusion barrier film arranged in contact with an upper surface of the mark wiring layer.

2. The semiconductor device according to claim 1, wherein the interlayer insulating film includes a first interlayer insulating film and a second interlayer insulating film stacked so as to cover an upper surface of the first interlayer insulating film.

3. The semiconductor device according to claim 1, wherein a smallest value of dimensions in a two-dimensional view of the second opening region is larger than a smallest value of dimensions in a two-dimensional view of the first opening region.

4. The semiconductor device according to claim 1, wherein a thickness of the mark wiring layer is equal to or greater than one third of a thickness of the interlayer insulating film.

5. The semiconductor device according to claim 1, wherein an angle of a sidewall of the mark wiring layer is not less than 70° and not more than 90° relative to the main surface.

6. The semiconductor device according to claim 1, wherein an area of the mark wiring layer in a two-dimensional view is equal to or larger than an area of the second opening region in a two-dimensional view.

7. The semiconductor device according to claim 1, wherein
   a plurality of second opening regions are formed so as to be stacked on each other, and
   the mark wiring layer is arranged immediately above each of the plurality of second opening regions.

8. A semiconductor device comprising:
   a semiconductor substrate having a main surface;
   a first diffusion barrier film on the main surface of the semiconductor substrate;
   a connection portion connecting a copper-based first wiring layer arranged on the semiconductor substrate side of the first diffusion barrier film with a copper-based second wiring layer arranged on an opposite side to the semiconductor substrate side of the first diffusion barrier film; and
   an interlayer insulating film covering the first diffusion barrier film,
   the first diffusion barrier film including a first opening region formed in a semiconductor circuit region that is a partial region in a two-dimensional view and a second opening region formed as an opening region different from the first opening region in a two-dimensional view,
   the first and second opening regions being formed in a region different from an opening region formed to allow the connection portion to pass through the first diffusion barrier film,
   the second wiring layer being formed to fill in a groove formed in the interlayer insulating film in the semiconductor circuit region,
   wherein a smallest value of dimensions in a two-dimensional view of the second opening region is equal to or smaller than a smallest value of dimensions in a two-dimensional view of the first opening region.

9. A method of manufacturing a semiconductor device, comprising the steps of:

forming a copper-based first wiring layer on a main surface of a semiconductor substrate;

forming a first diffusion barrier film on the first wiring layer, the diffusion barrier film including a first opening region as an opening region in a semiconductor circuit region that is a partial region in a two-dimensional view and a second opening region as an opening region different from the first opening region in a two-dimensional view;

forming an insulating film so as to cover the first diffusion barrier film;

polishing and planarizing an upper surface of the insulating film to form a first interlayer insulating film;

forming a second interlayer insulating film so as to cover the first interlayer insulating film thereby to form an interlayer insulating film;

forming a copper-based second wiring layer and a connection portion connecting the first wiring layer with the second wiring layer in the semiconductor circuit region so as to fill in a groove and a hole formed in the second interlayer insulating film, the first and second opening regions being formed in a region different from an opening region formed to allow the connection portion to pass through the first diffusion barrier film, wherein, in the step of forming the second wiring layer, a mark wiring layer is formed immediately above the second opening region as the same layer as the second wiring layer; and forming a second diffusion barrier film in contact with an upper surface of the mark wiring layer.

10. The method of manufacturing a semiconductor device according to claim 9, wherein a smallest value of dimensions in a two-dimensional view of the second opening region is formed to be larger than a smallest value of dimensions in a two-dimensional view of the first opening region.

11. The method of manufacturing a semiconductor device according to claim 9, wherein a depth of the mark wiring layer is formed to be equal to or greater than one third of a thickness of the interlayer insulating film.

12. The method of manufacturing a semiconductor device according to claim 9, wherein an angle of a sidewall of the mark wiring layer is formed to be not less than 70° and not more than 90° relative to the main surface.

13. The method of manufacturing a semiconductor device according to claim 9, wherein an area of the mark wiring layer in a two-dimensional view is formed to be equal to or larger than an area of the second opening region in a two-dimensional view.

14. The method of manufacturing a semiconductor device according to claim 9, wherein
a plurality of second opening regions are formed so as to be stacked on each other, and
the mark wiring layer is formed immediately above each of the plurality of second opening regions.

* * * * *